US006765800B2

(12) United States Patent
Haba et al.

(10) Patent No.: US 6,765,800 B2
(45) Date of Patent: Jul. 20, 2004

(54) MULTIPLE CHANNEL MODULES AND BUS SYSTEMS USING SAME

(75) Inventors: Belgacem Haba, Cupertino, CA (US); Richard E. Perego, San Jose, CA (US); David Nguyen, San Jose, CA (US); Billy W. Garrett, Jr., Mountain View, CA (US); Ely Tsern, Los Altos, CA (US); Craig E. Hampel, San Jose, CA (US); Wai-Yeung Yip, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/839,642

(22) Filed: Apr. 20, 2001

(65) Prior Publication Data

US 2001/0053069 A1 Dec. 20, 2001

Related U.S. Application Data

(63) Continuation-in-part of application No. 09/568,424, filed on May 10, 2000.

(51) Int. Cl.[7] .............................. H05K 7/02; H05K 7/10
(52) U.S. Cl. ....................... 361/760; 361/775; 361/675; 361/803; 174/99 B; 174/129 B; 174/71 B
(58) Field of Search .................................. 361/760, 774, 361/768, 785, 799, 803, 675, 733, 748, 775; 174/72 B, 71 B, 88 B, 70 B, 99 B, 129 B, 133 B, 149 B; 439/114, 61, 62

(56) References Cited

U.S. PATENT DOCUMENTS

| | | | |
|---|---|---|---|
| 5,224,023 A | | 6/1993 | Smith et al. |
| 5,523,703 A | | 6/1996 | Yamamoto et al. |
| 5,625,169 A | * | 4/1997 | Tanaka ........................ 174/250 |
| 5,635,761 A | | 6/1997 | Cao et al. |
| 5,680,297 A | * | 10/1997 | Price et al. .................. 361/818 |
| 5,910,151 A | * | 6/1999 | Adedokun ................... 606/161 |
| 5,943,573 A | | 8/1999 | Wen |
| 5,981,870 A | * | 11/1999 | Barcley et al. ............ 174/35 C |
| 6,003,121 A | | 12/1999 | Wirt |
| 6,005,776 A | | 12/1999 | Holman et al. |
| 6,172,895 B1 | * | 1/2001 | Brown et al. .................. 365/52 |
| 6,243,272 B1 | * | 6/2001 | Zeng et al. .................. 361/760 |
| 6,392,897 B1 | * | 5/2002 | Nakase et al. ............ 228/180.1 |
| 6,404,660 B1 | * | 6/2002 | Gamini et al. ................. 365/51 |

* cited by examiner

Primary Examiner—David Martin
Assistant Examiner—Hung Bui

(57) ABSTRACT

Various module structures are disclosed which may be used to implement modules having 1 to N channels. Bus systems may be formed by the interconnection of such modules.

14 Claims, 42 Drawing Sheets

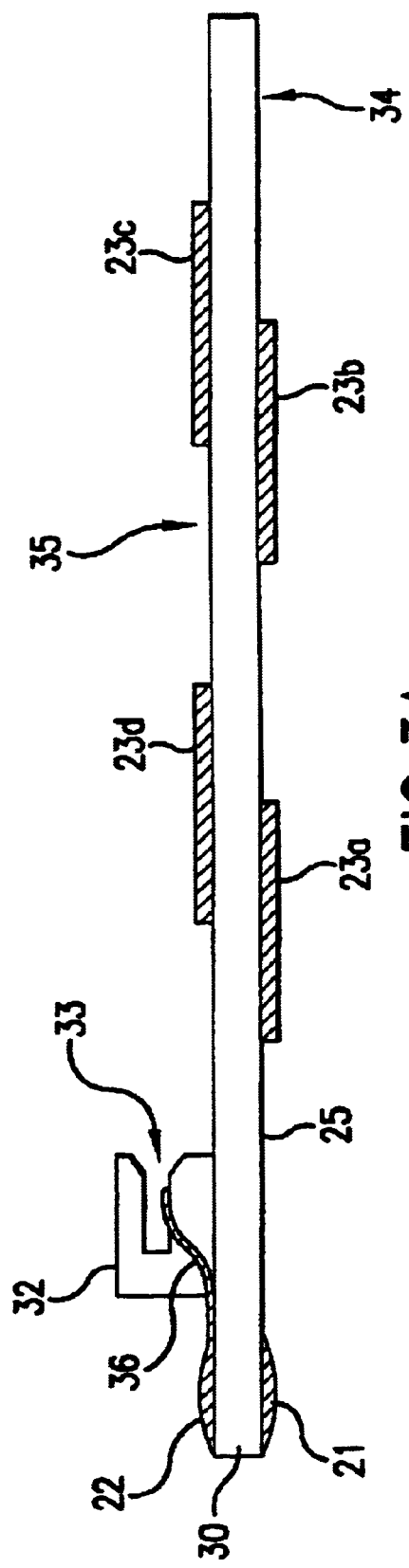

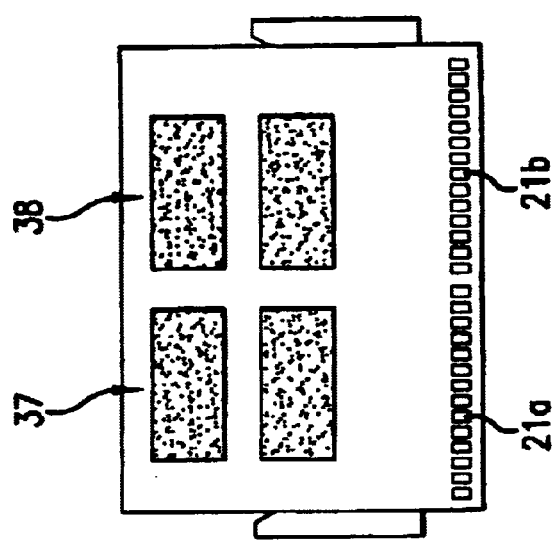
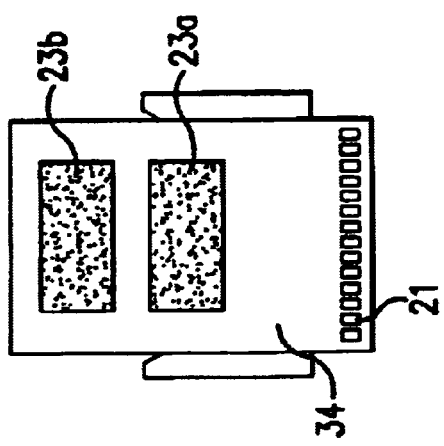
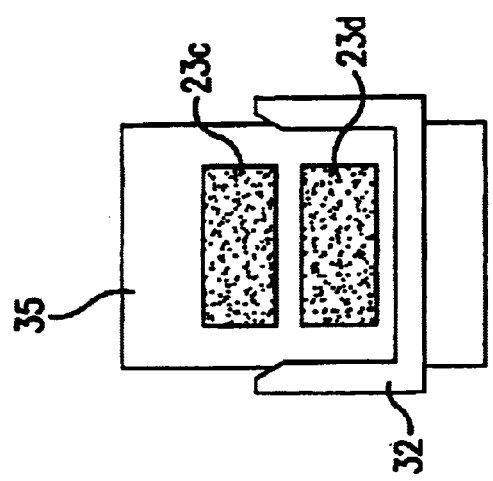

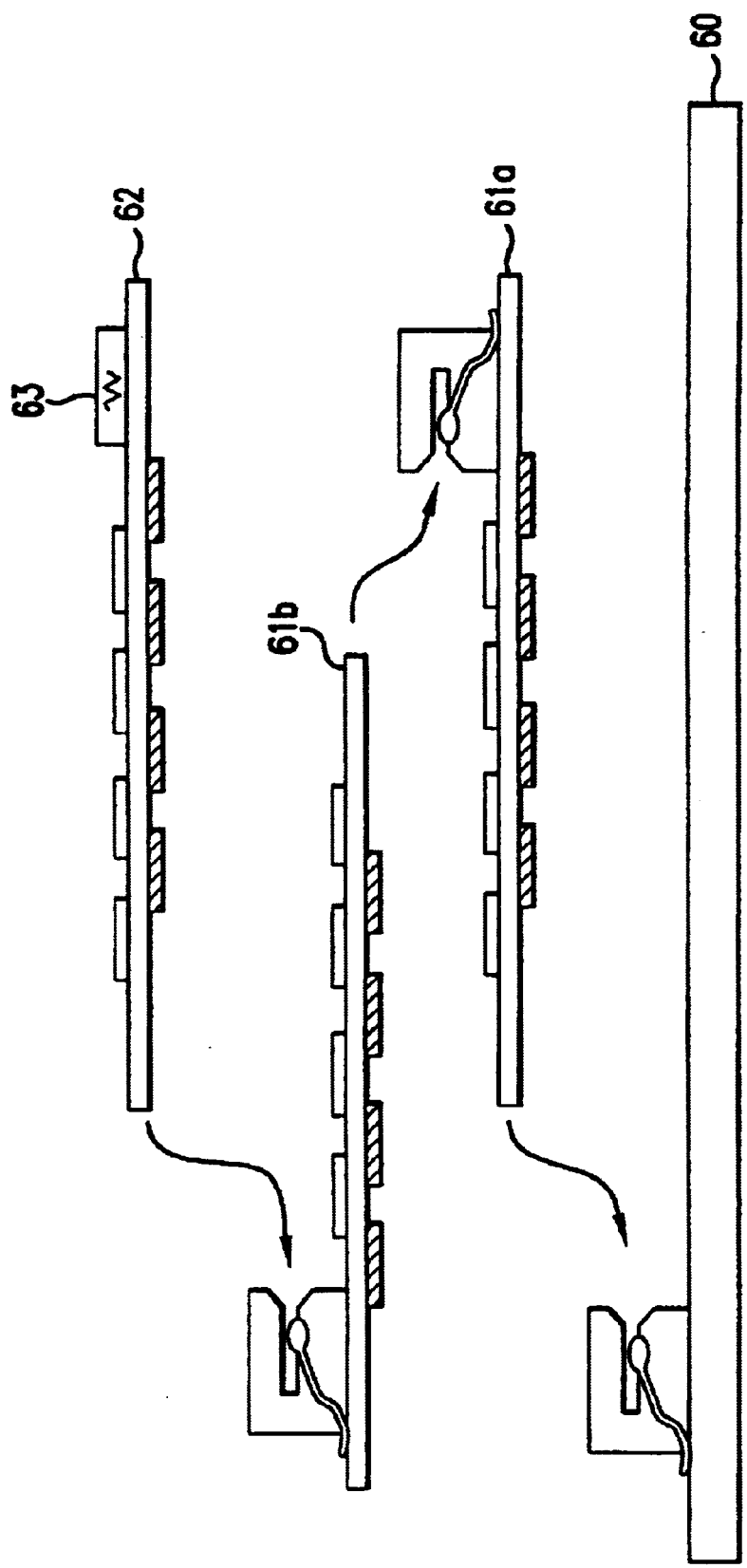

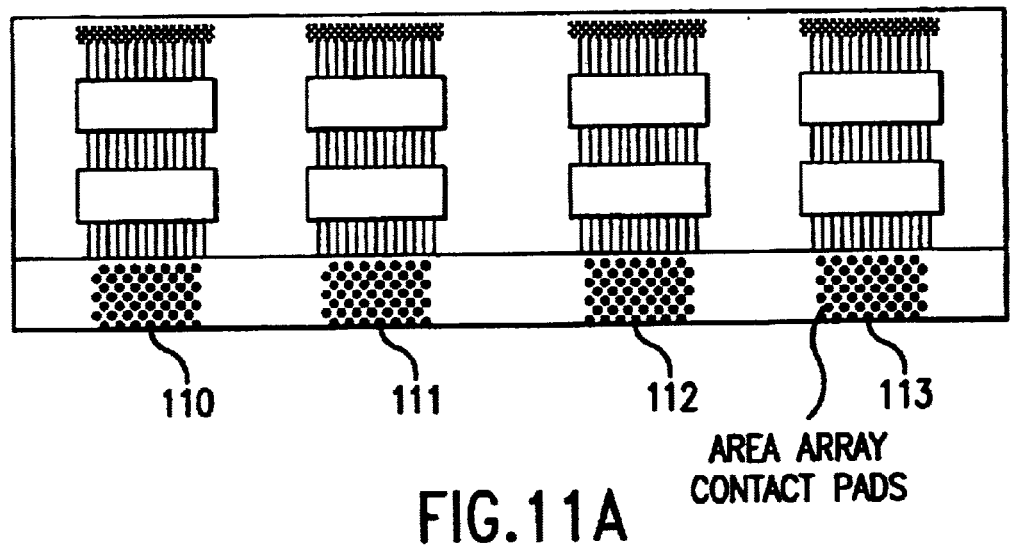
110  111  112  113
AREA ARRAY
CONTACT PADS
FIG.11A
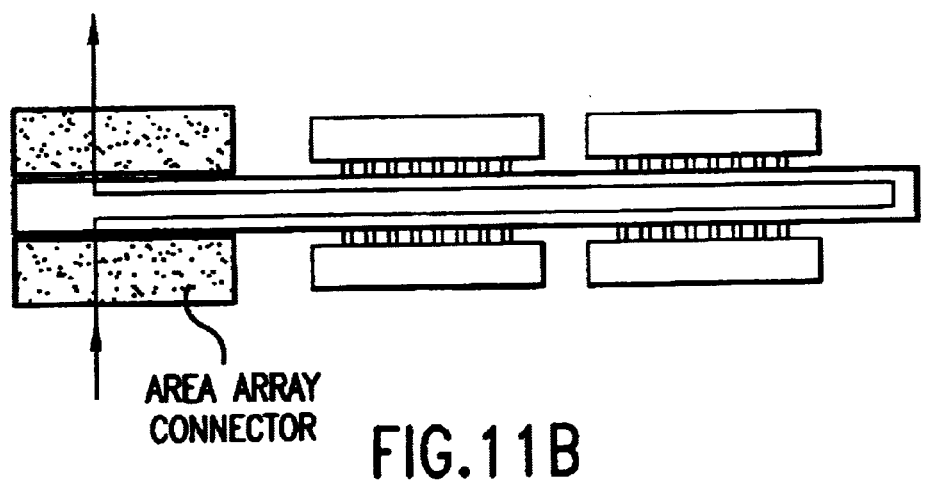
AREA ARRAY
CONNECTOR  FIG.11B

MULTIPLE CHANNEL MODULES AND BUS SYSTEMS USING SAME

CO-PENDING APPLICATIONS

This is a continuation-in-part of U.S. patent application No. 09/568,424, filed May 10, 2000.

FIELD OF THE DISCLOSURE

The present invention is directed to bus systems. More particularly, the present invention is directed to a bus system including one or more modules implementing one or more communications channel(s).

Conventional bus systems are typically implemented in single channel architectures. While conventional bus systems have been implemented using modules, the modules in such systems have merely been arranged in a serial relationship on a motherboard. For example, consider the bus system shown in FIG. 1. This bus system is characterized by a master 11 mounted on a motherboard 10. A number of connectors 13 are also mounted on motherboard 10. Each connector 13 is adapted to receive a module 14 comprising one or more integrated circuits 15. Thus, by means of a connector 13, a module 14 is mechanically mounted and electrically connected within the bus system.

One or more bus(es) 16 forms the communications channel between master 11 and a termination resistor 12. Bus 16 typically comprises a number of signals lines communicating control information, address information, and/or data. The signal lines forming bus 16 traverse the motherboard and/or the modules to electrically connect the integrated circuits 15 to master 11.

There are numerous problems associated with such conventional bus systems. For example, the serial arrangement of the connectors and associated modules creates a relatively lengthy communications channel. Since there are many factors limiting the maximum practical length of a communications channel, channel length should, wherever reasonably possible, be minimized.

Conventional bus systems are also characterized by numerous electrical connection points between the connectors and the bus portions traversing the motherboard, between the modules and the connectors, and between the integrated circuits and the bus portion traversing the modules. Improperly matched electrical connections often produce impedance discontinuities which tend to degrade signal transmission characteristics on the bus. Accordingly, the number of impedance discontinuities associated with the bus connections should be minimized.

Such conventional bus systems present a very static architecture which may not lend itself to the efficient utilization of available space within a larger system. For example, a maximum, pre-set number of connectors is typically provided within the conventional bus system, regardless of the actual number of modules initially contemplated for the bus system. Upgrading the bus system to include additional modules requires that a sufficient number of connectors be provided up to the maximum length (or capacity) of the channel. Typically, empty connectors are filled with dummy modules until they are needed. Absent these spare connectors, upgrading the bus system to include an additional module would require that the motherboard be replaced.

Finally, the static architecture of the conventional bus system provides a "one size fits all" approach to larger systems incorporating the bus system. The serial arrangement of connectors and modules on a motherboard may produce an undesirably large footprint within the larger system. Further, this configuration does not lend itself to irregular or crowded spaces within the larger system.

BACKGROUND

The present invention provides, in certain embodiments, modules and bus system architectures which reduce channel length and/or minimize bus connection discontinuities. Bus system architectures provided by the present invention may be flexibly configured according to an end user's requirements. Numerous possibilities exist for customized bus system configurations using the modules and interconnection schemes provided by the present invention. Multiple channels may be implemented on a single module and multiple modules may be connected to provide bus systems having relative small vertical profiles and/or horizontal footprints. The modules and/or bus system architectures may utilize various types of connectors, including for example finger connectors, edge connectors, and edge fingers. Any other element capable of providing an electrical connection (e.g., contacts, pins, leads, wire bonds, solder balls, etc.) may be substituted for the connectors of the modules, bus systems architectures and memory systems of the present invention. Also, a single connector may be substituted for a plurality of connectors. From the perspective of a module, a connector may allow signals to enter the module from elsewhere and/or may allow signals to exit the module. Certain connectors are referred to herein as "ingress" or "input" connectors while certain others are referred to herein as "egress" or "output" connectors. It is understood that input connectors, ingress connectors, output connectors and egress connectors may allow signals to travel in a first direction, a second direction or bidirectionally. In preferred embodiments however, a data signal sent from a memory controller to a memory device on a module will pass onto the module through an "input" or "ingress" connector and off of the module through an "output" or "egress" connector. Such data signal may be sampled by the memory device after passing onto the module.

In one aspect, the present invention provides a module formed from a printed circuit board (PCB) having primary first and second surfaces and having first and second ends, a plurality of integrated circuits (ICs) populating at least one of the first and second surfaces, a first set of edge fingers disposed at the first end and on the first surface of the PCB, a second set of edge fingers disposed at the first end and on the second surface of the PCB, a folded bus extending from the first set of edge fingers, substantially traversing the length of the first surface, folding back at the second end, substantially traversing the length of the second surface and terminating at the second set of edge fingers, and a right-angle connector mounted on either the first or second surface at the first end, and adapted to mechanically receive and electrically connect another module.

In another aspect, the present invention provides a module adapted for use in a bus system and including; a printed circuit board (PCB) having primary first and second surfaces, and having first and second ends, a plurality of integrated circuits (ICs) populating at least one of the first and second surfaces, a set of edge fingers disposed at the first end of the PCB and on either the top or bottom surface of the PCB, a right-angle connector adapted to mechanically receive and electrically connect another module, the right-angle connector being mounted on either the bottom or top surface of the PCB opposite the surface on which the set of edge fingers are disposed and at the second end of the PCB, and a bus extending from the set of edge fingers, substantially traversing the length of the module, and terminating at the right-angle connector.

In yet another aspect, the present invention provides a module adapted to be connected within a plurality of bus system modules, the module including a printed circuit board (PCB) having first and second primary surfaces, first and second primary edges, and first and second ends, a plurality of integrated circuits (ICs) populating at least one of the primary first and second surfaces, a first set of edge fingers disposed on the first primary edge between first and second ends and on the first surface of the PCB, a second set of edge fingers disposed on the first primary edge between first and second ends and on the second surface of the PCB, wherein the first and second set of edge fingers are adapted to connect with an electrical connector associated with another module or a motherboard, a bus comprising a plurality of signal lines running from at least one of the first and second set of edge fingers to a flex tape connector connected at the second primary edge of the PCB between the first and second ends, and an electrical connector connected to the flex tape.

In still another aspect, the present invention provides a motherboard and a plurality of modules arranged from a first module to a last module, wherein the motherboard comprises a controller and a right-angle connector adapted to mechanically receive and electrically connect the first module, and wherein each one of the plurality of modules comprises a right-angle connector adapted to receive another one of the plurality of modules, such that, once connected via respective right-angle connectors, the motherboard and the plurality of modules are disposed in parallel one to another.

In a further aspect, the present invention provides a module formed from a printed circuit board (PCB) having first and second primary surfaces and having a first end, a plurality of integrated circuits (ICs) populating at least one of the first and second primary surfaces, a first and second set of input finger connectors disposed on at least one of the first and second primary surfaces proximate to the first end, a first and second set of output finger connectors disposed on at least one of the first and second primary surfaces proximate to the first end, and a bus having a first channel extending from the first set of input finger connectors to the first set of output finger connectors and having a second channel extending from the second set of input finger connectors to the second set of output finger connectors, the bus connected to the plurality of ICs. In a preferred embodiment, the first and second set of input finger connectors and the first and second set of output finger connectors are disposed on at least one of the first and second primary surfaces at the first end.

In yet another aspect, the present invention provides a module including a first printed circuit board (PCB) having first and second primary surfaces and having a first and second ends, one or more integrated circuits (ICs) populating at least one of the first and second primary surfaces, a set of finger connectors disposed proximate to the first end of the first PCB and on either the first or second primary surface of the first PCB, a conductive interconnect electrically connected to the first PCB proximate to the second end of the first PCB, and a bus extending from the set of finger connectors, substantially traversing the first PCB between the first and second ends and traversing the conductive interconnect. The conductive interconnect is adapted to receive a second PCB populated with one or more ICs. In one preferred embodiment, the module further comprises a connector connecting the conductive interconnect to the first PCB. In another preferred embodiment, the module further comprises a spacer disposed between the first and second PCB's. In yet another preferred embodiment, the set of finger connectors are disposed at the first end of the first PCB, the spacer is attached to the first PCB at the second end of the first PCB, and the conductive interconnect electrically connects the connector to the first PCB at the second end of the first PCB.

BRIEF DESCRIPTION OF THE DRAWINGS

FIG. 3A is an edge view of one embodiment of a module according to the present invention;

FIGS. 3B and 3C are respectively top and bottom views of a single channel module according to the embodiment shown in FIG. 3A;

FIG. 3D illustrates a two channel module consistent with the embodiment shown in FIG. 3A;

FIG. 6 illustrates a bus system formed by the interconnection of multiple modules according to the embodiment shown in FIGS. 5A through 5D;

FIGS. 11A and 11B illustrate another embodiment of a four channel module according to the present invention;

DETAILED DESCRIPTION OF THE FIGURES

The present invention can be viewed in the context of the subject matter of related and commonly assigned U.S. patent application No. 09/551,855, entitled "Multi-Slot Connector with Integrated Bus Providing Contact Between Adjacent Modules," filed Apr. 18, 2000, which is incorporated herein by reference, and the subject matter of related and commonly assigned U.S. patent application No. 09/817,828, entitled "Improved Clock Routing in Multiple Channel Modules and Bus Systems," filed Mar. 26, 2001, which is incorporated herein by reference.

Figure 1:
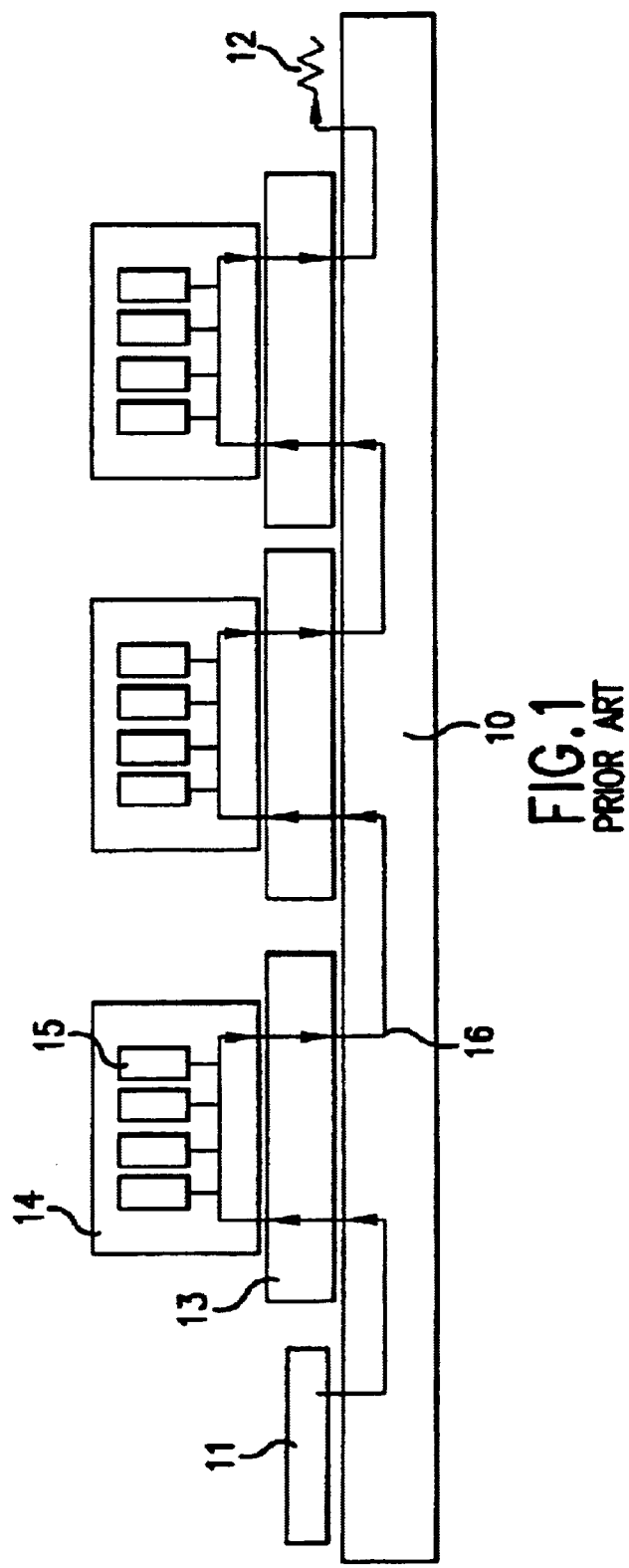
FIG. 1 illustrates a conventional bus system architecture.
Figure 2:
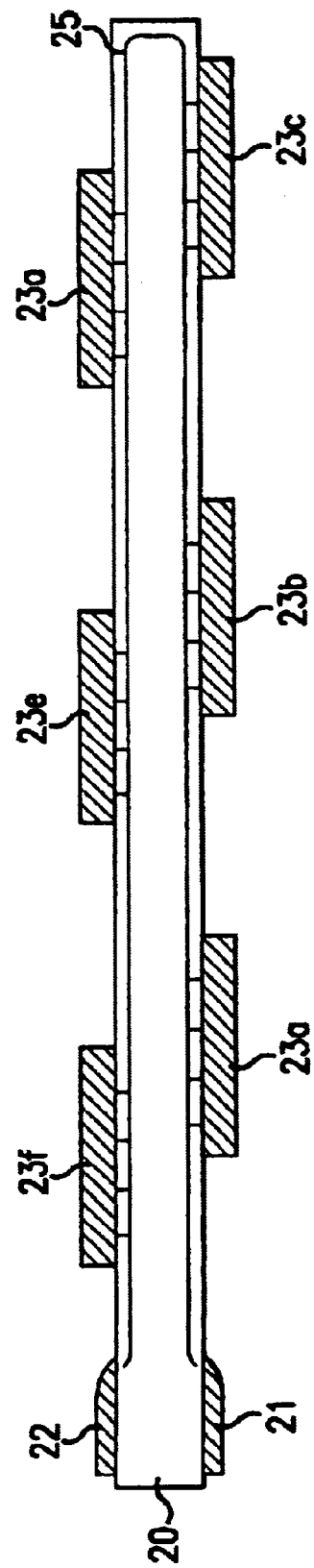
FIG. 2 illustrates a module adapted for use within the present invention.

An exemplary embodiment of the module claimed in the related application is shown in FIG. 2. The module comprises a printed circuit board 20 and a plurality of integrated circuits (ICs) 23a–23f mounted thereon. At one end of PCB 20, a first set of edge fingers 21 are disposed on a first primary surface of the PCB and a second set of edge fingers 22 are disposed on an opposing second primary surface of the PCB. Edge fingers are a well known connection mechanism which allow the module to be mechanically secured within a connector (not shown) and electrically connected to a plurality of signal lines provided at the connector. As used herein, the phrase "disposed on" is understood to include locations on, under, and over the relevant surface or surfaces. Thus, for example, connectors, which may be described as finger connectors or edge fingers, located near an end would fall within the scope of connectors disposed on at least one of first and second primary surfaces proximate to that end. The phrase "printed circuit board" or the word "motherboard" is understood to include any type of dielectric body that may support conductors. In preferred embodiments, the dielectric body is comprised of an epoxy, a fiberglass, a ceramic, or a polyimide, and may be rigid or flexible. In more preferred embodiments, the dielectric body is comprised of a fiberglass. In particularly preferred embodiments, the dielectric body is comprised of FR4, FR5 or BT resin.

A bus 25 internal to the module extends from the first set of edge fingers 21, traverses substantially the entire first primary surface of the PCB, folds back at the distant end of the PCB, traverses substantially the entire second primary surface of the PCB, and terminates at the second set of edge fingers 22. Bus 25 typically comprises a plurality of signal lines. The signal lines forming bus 25 may run on top the first and second surfaces of PCB 20. Alternatively, bus 25 may be formed within the body of PCB 20. ICs 23a–23f are respectively connected to this plurality of signal lines.

As described in the related application, the foregoing module may be used in conjunction with a related connector to implement bus systems having improved signal transmission characteristics. Overall channel length and impedance discontinuities related to motherboard connections are reduced. Further, by means of the novel connector and associated module structure described in the related application, bus systems may be implemented in a number of ways. For example, modules may be vertically stacked one above the other, or horizontally racked one next top the other within a single connector.

The present invention allows additional flexibility in the design and implementation of bus systems. Whereas the former invention relies substantially upon the design of the multi-slot connector to flexibly implement bus systems, the present invention relies more on module design.

To this end, consider the module shown in FIG. 3A. Like the module shown in FIG. 2, the module of FIG. 3A comprises a printed circuit board 30 and a plurality of integrated circuits (ICs), here 23a–23d. Of note, the exemplary module of FIG. 2 mounts six (6) ICs connected to bus 25 which is formed within the body of PCB 20, whereas the example shown in FIG. 3A mounts only four (4) ICs connected to bus 25 running on top of the first and second primary surfaces of PCB 30. Within the context of the present invention, any reasonable number of ICs may be mounted on the module. ICs may populate one or both primary surfaces of the module. However, it is presently preferred to populate both primary surfaces of the module since this tends to further reduce channel length.

The module shown in FIG. 3A further comprises a right angle connector 32. Right angle connector 32 is mounted on PCB 30 and comprises a connection slot 33 adapted to receive another module. The "right-angle" nature of the connector nominally provides that slot 33 opens at a right angle to the surface upon which it is mounted. Such an arrangement allows modules to connected one to another in parallel planes. However, one or more modules might be configured with a multi-slot connector as described in the related application.

In the illustrated example of FIG. 3A, bus 25 extends from a first set of edge fingers 21 at a first end of PCB 30, substantially traverses the first primary surface 34, folds back at a second end of PCB 30, substantially traverses the second primary surface 35, and terminates at right angle connector 32. Thus, whereas the module bus portion shown in FIG. 2 extends from first edge fingers 21 to second set of edge fingers 22, the module bus portion shown in FIG. 3 extends from first set of edge fingers 21 to right angle connector 32. ICs 23a–23d respectively connect to the signal lines forming bus 25.

Right angle connector 32 may include one or more signal lines 36 connected back to edge fingers 21, and/or connected to a second set of edge fingers 22. Signal lines 36 might be used, for example, as ground connections.

Modules according to the present invention may implement one or more channels. The term "channel" is broadly defined to include one or more signal lines providing electrical continuity and capable of communicating information between two points. A signal line may be comprised of, for example, an electrically conductive trace or wire. Preferably, a channel provides a direct metallic connection between components coupled to the channel. In the following examples, one or more ICs are typically associated with a channel, and the channel communicates information from a master (a controlling device) to a slave (a responding device). However, one of ordinary skill in the art will understand that the ICs in the following examples may be replaced with connectors allowing connection of an auxiliary channel. The ICs in the following examples may be memory devices, receivers, transceivers, logic devices, or other control devices. FIGS. 3B and 3C shown top and bottom views of module illustrated in FIG. 3A.

FIG. 3D illustrates a module similar to the one illustrated in FIGS. 3A–3C. However, the module shown in FIG. 3D implements two channels 37 and 38 on a single module. First channel 37 is associated with a first bus running from a first plurality of edge fingers 21a. Second channel 37 is associated with a second bus running from a second plurality of edge fingers 21b.

Figure 4:
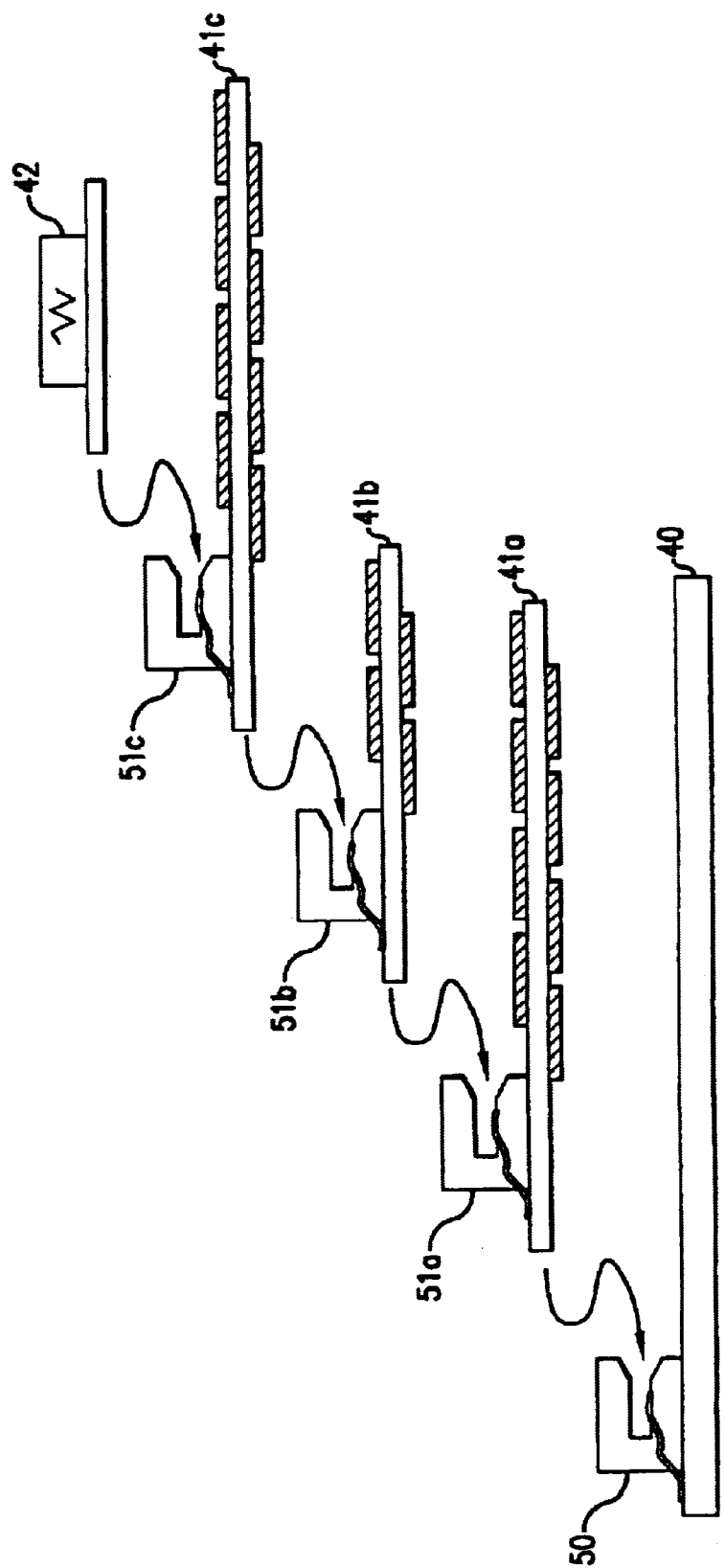
FIG. 4 illustrates a bus system formed by the interconnection of multiple modules according to the embodiment shown in FIGS. 3A through 3D.

Whether the modules of the present invention implement one or more channels, they may be flexibly configured to form a bus system. FIG. 4 illustrates one such bus system. For clarity, FIG. 4 and subsequent illustrations of modules and bus systems omit labeling readily discernable elements such as the ICs and the PCB which have been described above.

In FIG. 4, a motherboard 40 comprises a first right angle connector 50. The "motherboard" is nominally any printed circuit board having the first right angle connector, but typically comprises a master controlling signal transmissions on the bus. In the example, a first module 41a comprising right angle connector 51a is mechanically secured and electrically connected to motherboard 40 through right angle connector 50. Similarly, right angle connector 51a connects module 41b, and right angle connector 51b connects module 41c.

Such module-to-module connection may continue until a bus system of desired size and configuration is completed. Alternatively, at some point, the channel(s) defined between the master on motherboard 40 and the ICs on the last module will reach its maximum practical length. In either event, when the bus system is complete the signal lines of the bus are preferably terminated in a matched impedance. Signal line termination may be done in a set of termination resistors on the last module, or by means of a special termination module 42 connected to the right angle connector 51c of the last module. By using termination module 42, the other modules need not include termination resistors.

Another embodiment of the modules according to the present invention is shown in FIGS. 5A–5D. The module shown in FIG. 5A does not make use of the folded bus structure described above. Rather, one or more sets of finger connectors (53a and 53b) are disposed on either the first or second primary surfaces of the module PCB. Alternatively, the first and second primary surfaces may each include one or more sets of edge fingers. The one or more bus(es) associated with these edge fingers substantially traverse the length of the module from one ($1^{st}$) end to another ($2^{nd}$) end connecting related ICs along the way. The one or more bus(es) then terminate at right angle connector 52.

Figure 5A:
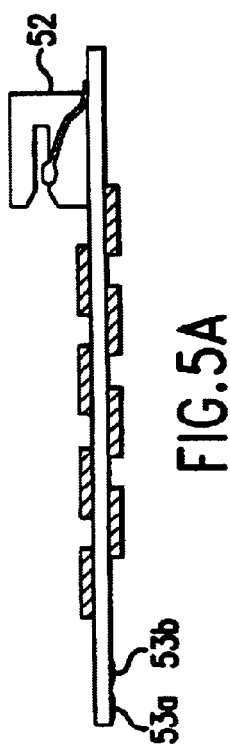
FIG. 5A is an edge view of another embodiment of a module according to the present invention.
Figure 5D:
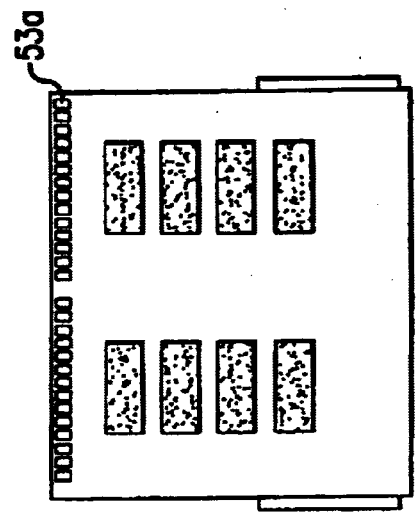
FIG. 5D illustrates a two channel module consistent with the embodiment shown in FIG. 5A.
Figure 5C:
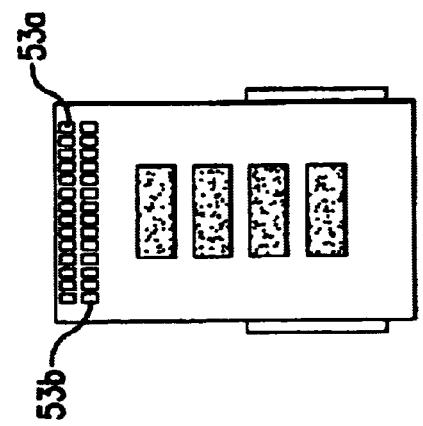
FIGS. 5B and 5C are respectively top and bottom views of a single channel module according to the embodiment shown in FIG. 5A.
Figure 5B:
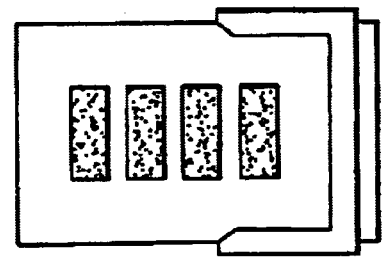

FIGS. 5B and 5C shown respectively top and bottom views of the module shown in FIG. 5A. FIG. 5D illustrates a two channel version of this module.

An exemplary bus system configured with the modules of FIGS. 5A–5D is shown in FIG. 6. When used to configure a horizontally disposed bus system, the bus system of FIG. 6 may provide additional mechanical stability over the bus system illustrated in FIG. 4, since right angle connectors will be placed on both left and right "ends" of the bus system.

In the example shown in FIG. 6, the right angle connector on motherboard 60 receives first module 61a which receives second module 61b. Module 62 is a base module incorporating termination impedance 63.

Figure 7A:
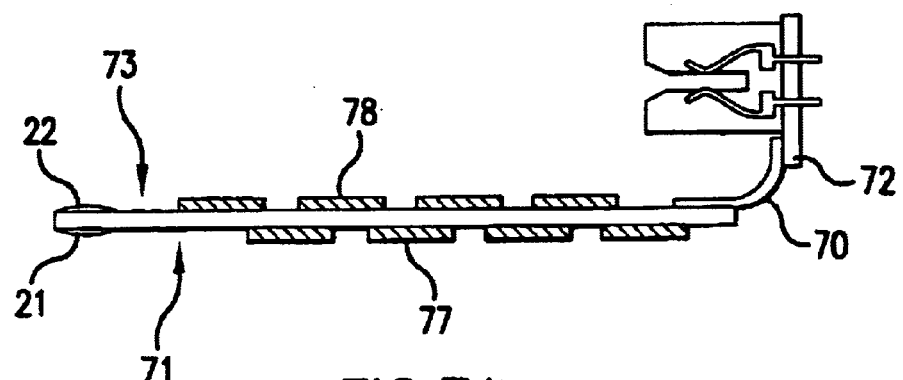
FIG. 7A is an edge view of yet another embodiment of a module according to the present invention.
Figure 7B:
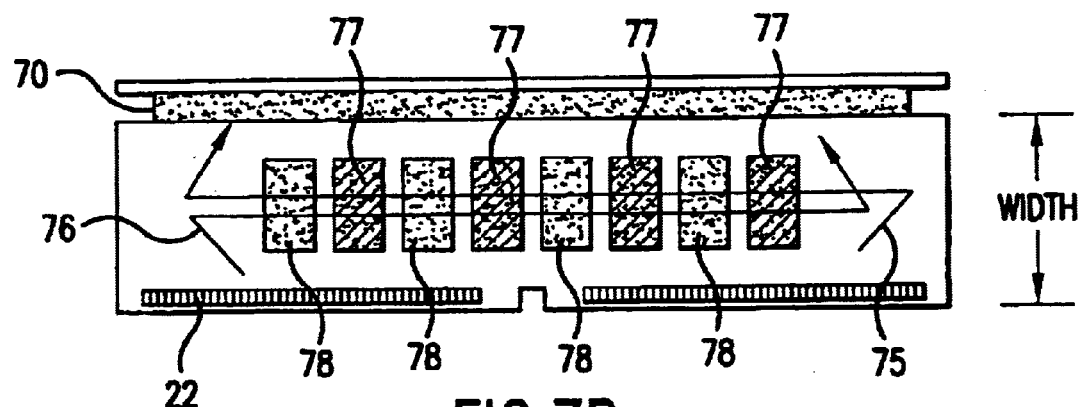
FIGS. 7B is a top view of the module of FIG. 7A further illustrating a two channel option to the module's implementation.

Yet another embodiment of the modules according to the present invention is shown in FIGS. 7A and 7B. This module does not use the right angle connectors illustrated in FIGS.

4 through 6 inclusive. Rather, the one or more bus(es) terminate at one end of the module in a flex tape connector 70 coupled to an electrical connector 72. Electrical connector 72 may be of conventional implementation. As before, one or more sets of edge fingers (21 and 22) are disposed at the other end of the module on the first primary surface and/or the second primary surface of the PCB. While the embodiment shown in FIG. 7A lends itself to the same channel structures shown in FIGS. 5B–5D, a further refinement of the channel structures is illustrated in FIG. 7B.

In FIG. 7B, a first sub-plurality of ICs 77 populate the first primary surface 71 of the PCB and a second sub-plurality of ICs 78 populate the second primary surface 73 of the PCB. A first bus originates at one set of edge fingers 21, laterally traverses the first plurality of ICs 77 and terminates at flex tape connector 70. A second bus originates at another set of edge fingers 22, laterally traverses the second plurality of ICs 78 and terminates at flex tape connector 70. In this manner, two channels are implemented which traverse opposing primary surfaces of the PCB in opposite directions. The width of the PCB can therefore be reduced, Compare the width of the module in FIG. 5D.

Figure 8:
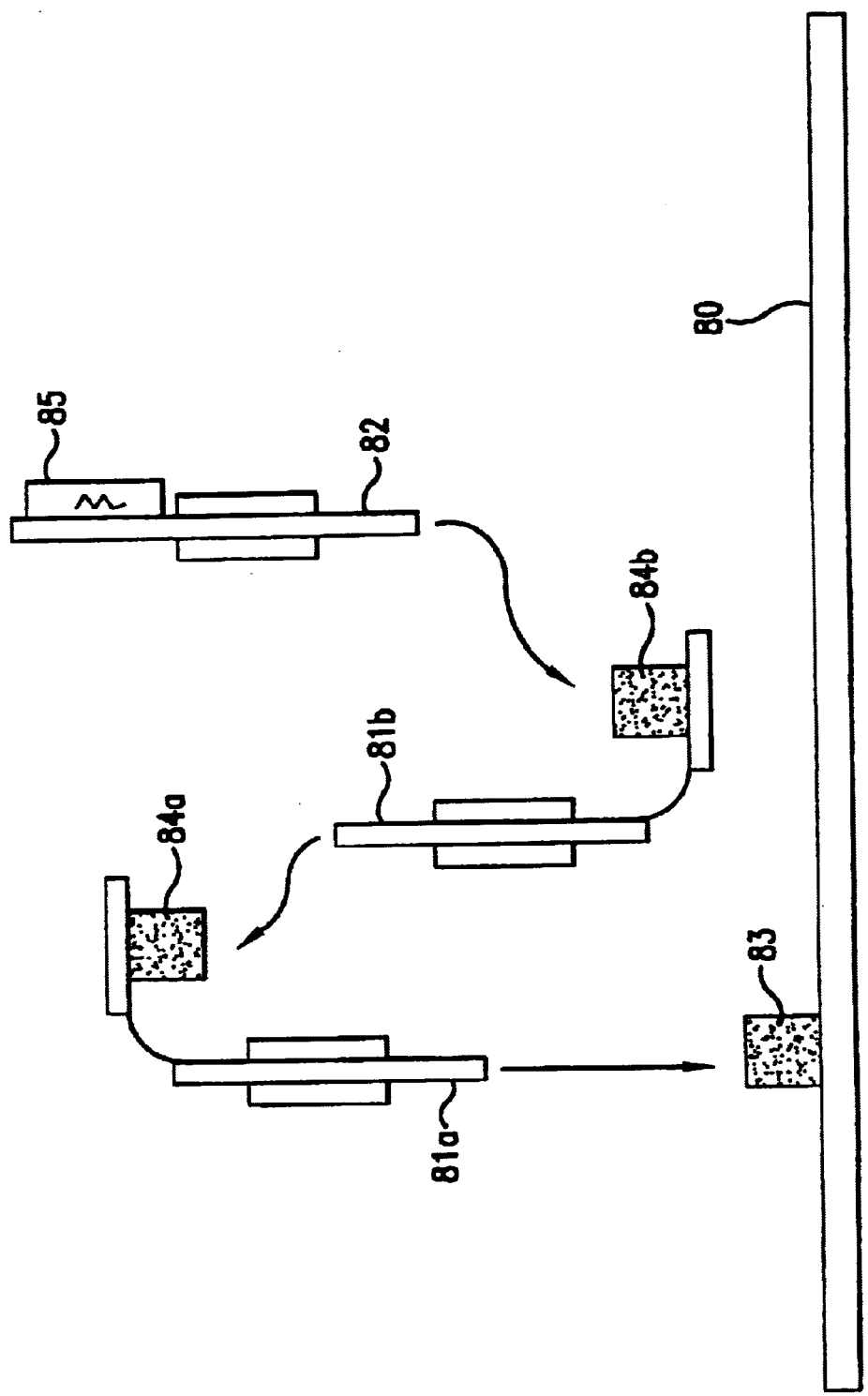
FIG. 8 illustrates a bus system formed by the interconnection of multiple modules according to the embodiment shown in FIGS. 7A and 7B.

An exemplary memory system configured with the module of FIG. 7A is shown in FIG. 8. Within this system motherboard 80 comprises connector 83 which receives first module 81a which in turn receives second module 81b in connector 84a. Connector 84b on second module 81b receives a base module 82 incorporating termination resistor 85. The combination of flex tape and connector allows a bus system comprising multiple modules to be implemented in a variety of forms.

Figure 9A:
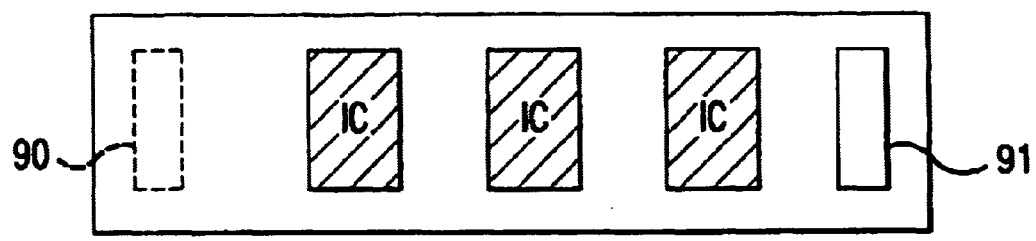
FIGS. 9A and 9B illustrate yet another embodiment of a single channel module according to the present invention.
Figure 9B:
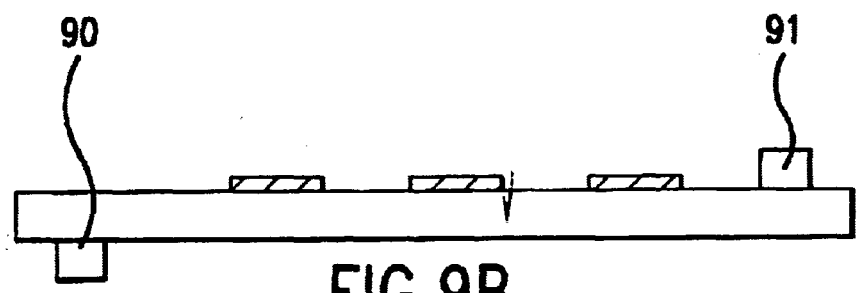

In fact, single channel and multiple channel modules may be implemented in a number forms using conventional electrical connectors. FIGS. 9A and 9B illustrate a single channel module which may be "stacked" or otherwise combined with similar modules to form a bus system having a reduced footprint and a relatively short channel length. Within the module shown in FIGS. 9A and 9B, the bus runs from a first connector 90 mounted on a first primary surface of the module, across the length of the module, and terminates in second connector 91 mounted on the second primary surface of the module.

Figure 9C:
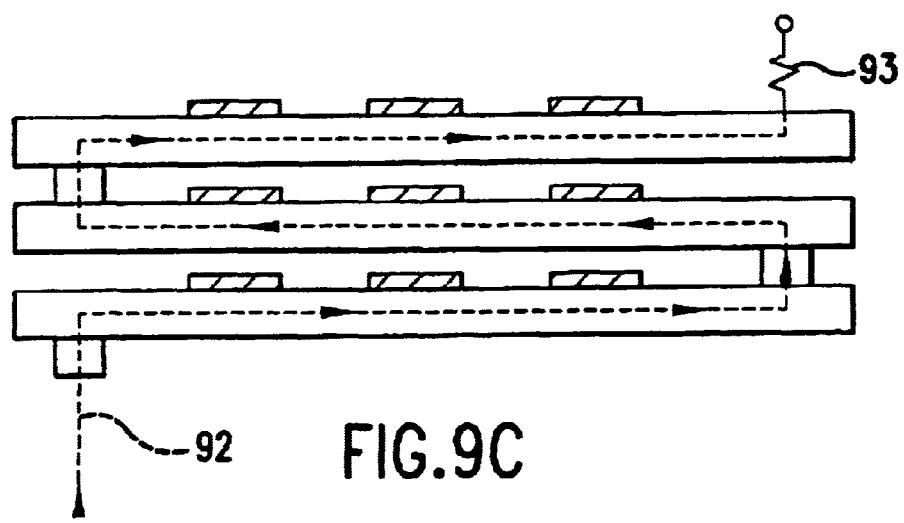
FIG. 9C illustrates a bus system formed by the interconnection of multiple modules according to the embodiment shown in FIGS. 9A and 9B.

FIG. 9C illustrates a bus system implemented with a number of these modules. A channel path 92 is indicated through the bus system which enters the first module at its first connector and thereafter zig-zags though the connected modules as shown until it reaches termination resistor 93. The modules used in the bus system of claim 9C are shown with a single bus traversing ICs populating only one primary surface of each respective PCB. As noted above, a plurality of buses may occupy the channel and one or more of the modules may include ICs on both primary surfaces.

Figure 10A:
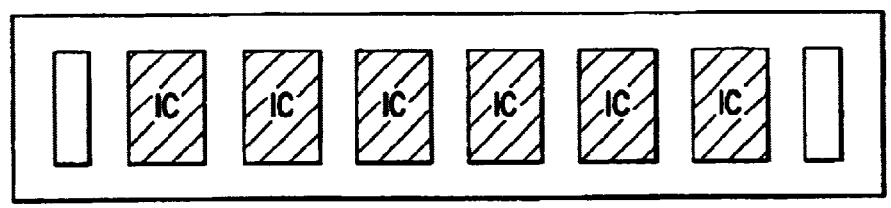
FIGS. 10A and 10B illustrate still another embodiment of a two channel module according to the present invention.
Figure 10B:
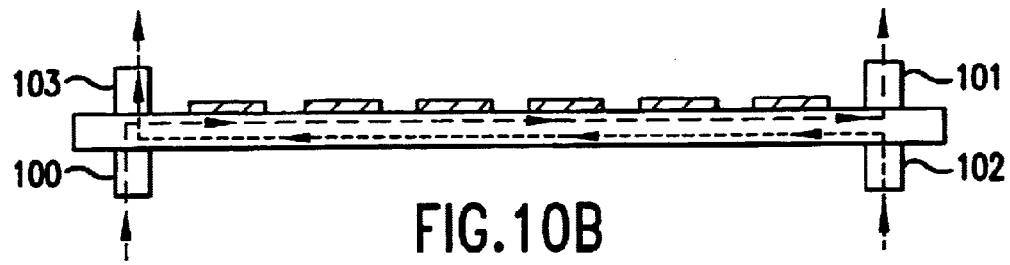

An exemplary two channel module is illustrated in FIGS. 10A and 10B. Here, a first channel path extends from a first connector 100 on the first primary surface of the PCB across the length of the PCB to a second connector 101 on the second primary surface of the PCB. A second channel path extends from a third connector 102 on the first primary surface of the PCB across the length of the PCB to a fourth connector 103 on the second primary surface of the PCB. Thus, first and second channels run counter-directional to one another.

The module of shown in FIGS. 10A and 103B includes a single row of ICs. One of ordinary skill in the art will appreciate that a number of IC rows might be mounted on the module.

Figure 11C:
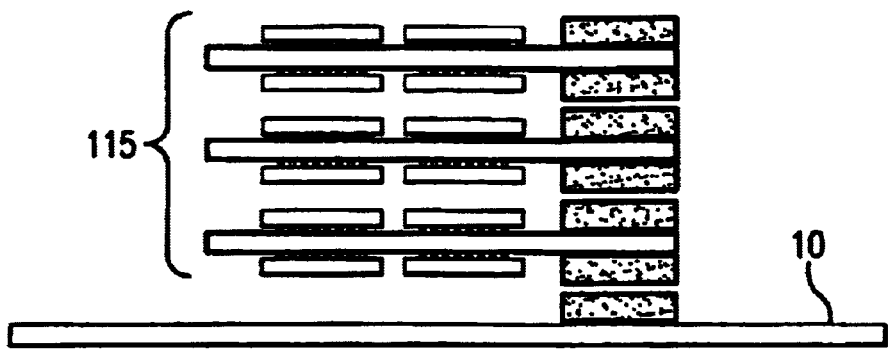
FIGS. 11C and 11D illustrate stacked horizontal and vertical module configurations using the modules shown in FIGS. 11A and 11B.
Figure 11D:
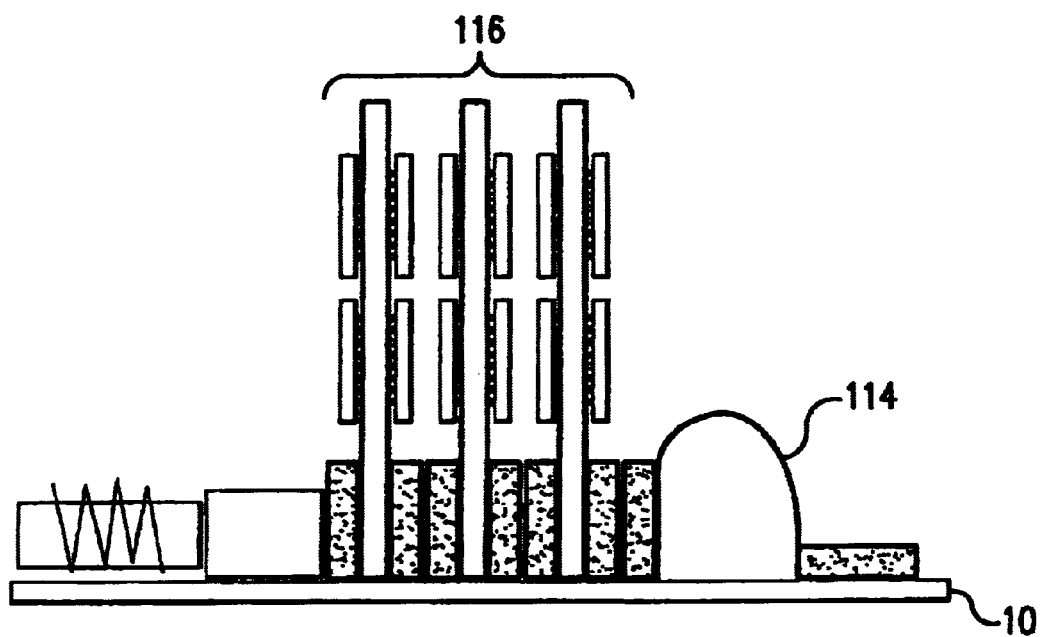

An exemplary four channel module is illustrated in FIGS. 11A and 11B. The module includes four sets of (area array) connectors 111, 112, 113, and 114, each set having a first connector mounted on the first primary surface and a second connector mounted on the second primary surface of the PCB. As shown in FIG. 11B, a bus is formed between the first and second connector in each connector set. That is, each bus originates at a first edge of the PCB at a first connector, traverses the width of the module, folds back at a second edge of the PCB, and retraverses the width of the module until it reaches the second connector in the connector set. The modules shown in FIGS. 11A and 11B may be stacked in horizontal 115 and vertical 116 configurations on motherboard 10 as illustrated in FIGS. 11C and 11D. The vertically stacked configuration 116 of FIG. 11D is connected through a flexible connector 114.

Each one of the foregoing examples makes use of a number of connectors. In addition to providing a connection path between respective buses, the structure of the connector may also be used to provides mechanical support for modules which are stacked one above the other, or racked one next to the other in a bus system. While this feature is often desirable in the implementation of certain bus system architectures, the present invention has broader applications.

For example, the present invention may be adapted to take full advantage of conventional ribbon connectors and similar flexible connectors. By means of these connectors, modules forming a bus system need not be stacked or racked in close proximity one to another. Rather, module may be placed at greater distances one to another and may be mounted within a larger system at odd angles one to another. While separating modules will increase the channel length, there are many applications where reduced channel length will be happily traded away for ease and flexibility of implementation.

Before illustrating the use of flexible connectors, several modules structures will be described. Each of these module structures makes use of "finger connectors." The term "set of edge fingers" has been used above to described a class of electrical connectors characterized by a number of parallel electrical contacts disposed near the edge of a PCB and adapted to "mate" with a corresponding connector slot. Edge fingers are generally pushed into the connector slot to make electrical bus connections and provide mechanical support to the module.

While often located near or at the edge of a PCB, a set of finger connectors need not be located on the edge of the PCB. A set of finger connectors, like a set of edge fingers, typically comprises a set of parallel electrical contacts. In the context of a bus, each electrical contact typically corresponds to a bus signal line. Ribbon connectors and other flexible parallel connectors are well adapted to interconnect such parallel electrical contact structures. However, a ribbon connector may be coupled to a set of finger connectors anywhere on the PCB, not just the edge. Thus, the term finger connector may denote an edge finger, but may also denote a more generic electrical contact.

Figure 12A:
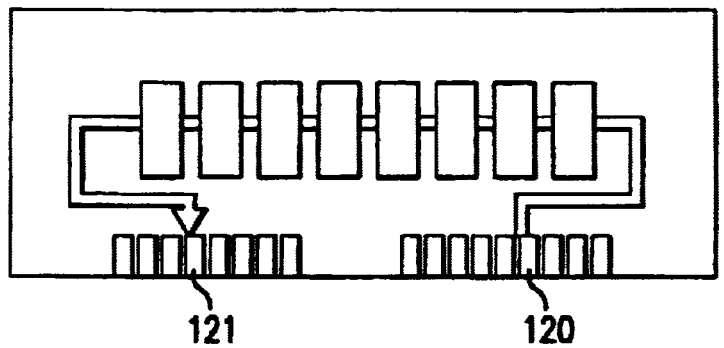
FIG. 12A illustrates yet another one channel embodiment of the present invention.
Figure 12B:
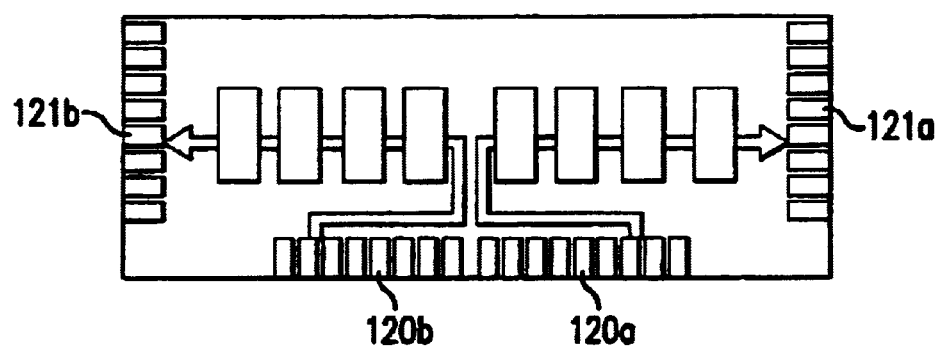
FIG. 12B illustrates yet another two channel embodiment of the present invention.
Figure 12C:
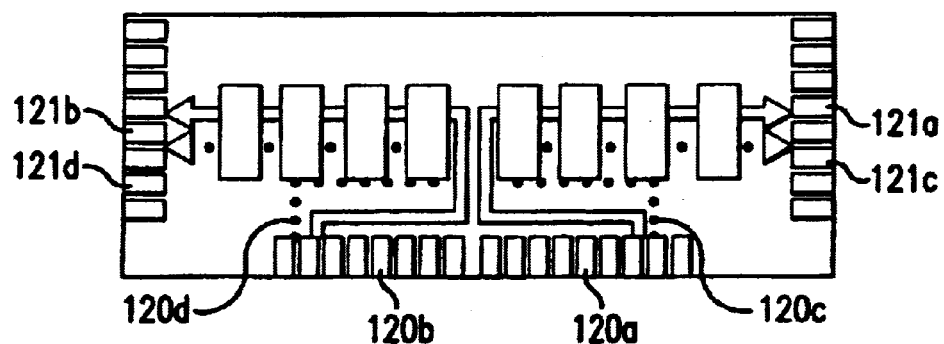
FIG. 12C illustrates yet another four channel embodiment of the present invention.

FIGS. 12A, 12B, and 12C illustrate a single channel module, a two channel module, and a four channel module respectively. The single channel module shown in FIG. 12A comprises a set of input finger connectors 120 and a set of output finger connectors 121. A bus substantially traverses the length of the module running from the set of input finger connectors 120 to the set of output finger connectors 121. Along the way, a plurality of ICs are connected to the bus. The multi-channel modules shown in FIGS. 12B and 12C includes additional sets of input finger connections and additional sets of output finger connectors. The third and fourth buses on the module shown in FIG. 12C are disposed the other primary surface (i.e., the bottom surface in relation to the illustration).

In these examples, the respective sets of input finger connectors (120 and 120a–120d) as well as the output connector 121 in FIG. 12A are edge fingers. Accordingly, the modules may be coupled within a bus system by pushing the edge fingers into a corresponding connector(s). The corresponding connector(s) provide the input signals to the module's bus(es). However, the sets of output finger connectors (121a–121d) on the modules shown in FIGS. 12B and 12C are adapted to be connected with one or more ribbon or similar flexible connector(s).

Figure 13A:
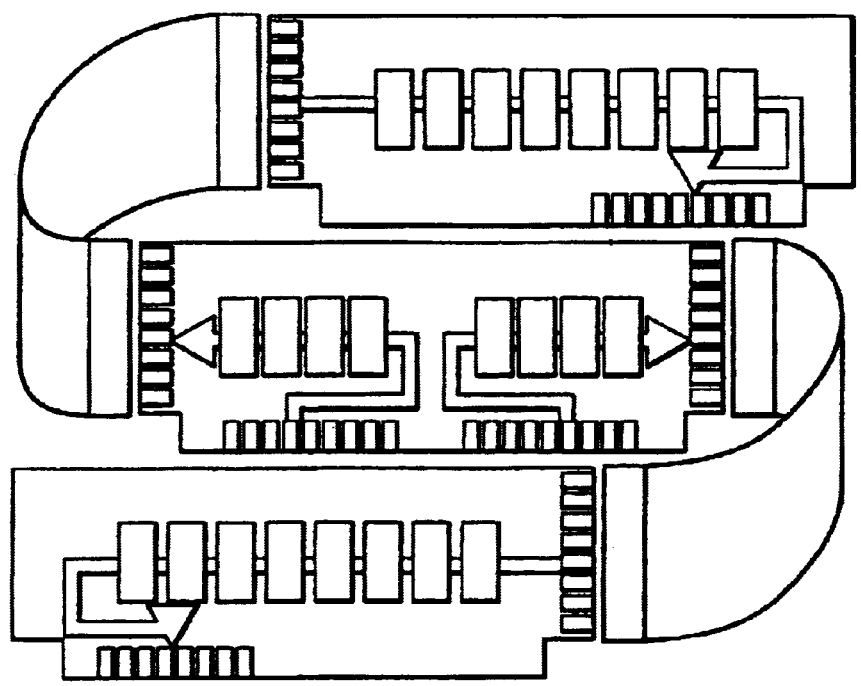
FIGS. 13A, 13B, 13C, and 13D illustrate various two channel bus systems implemented using variations on the modules described in FIGS. 12a, 12B, and 12C.
Figure 13B:
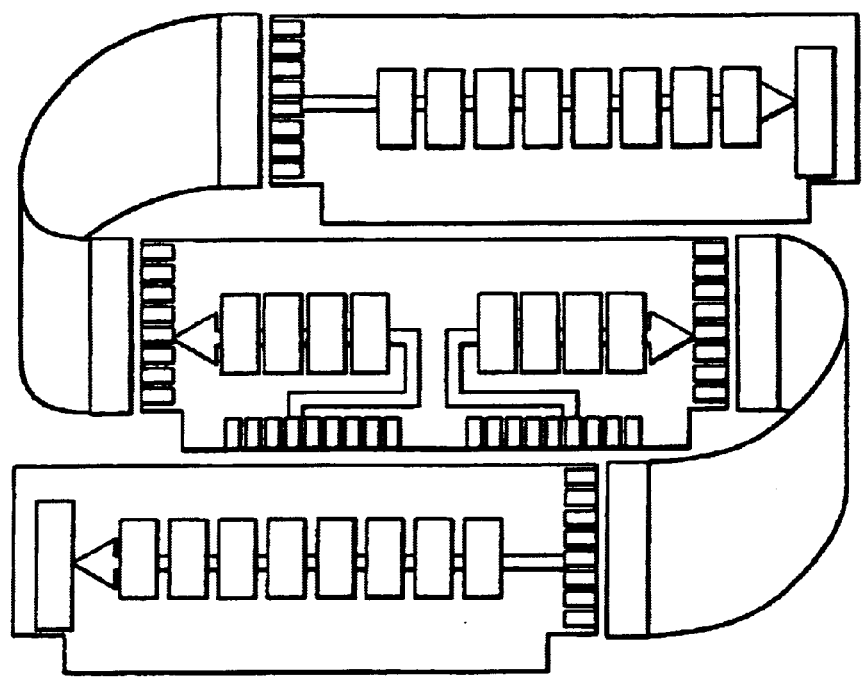
Figure 13C:
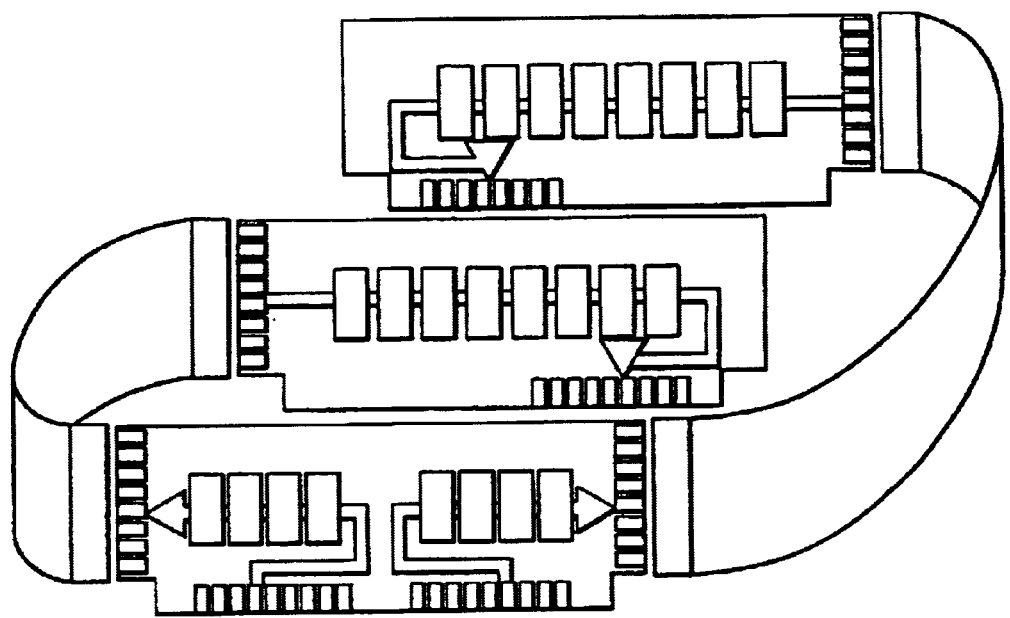
Figure 13D:
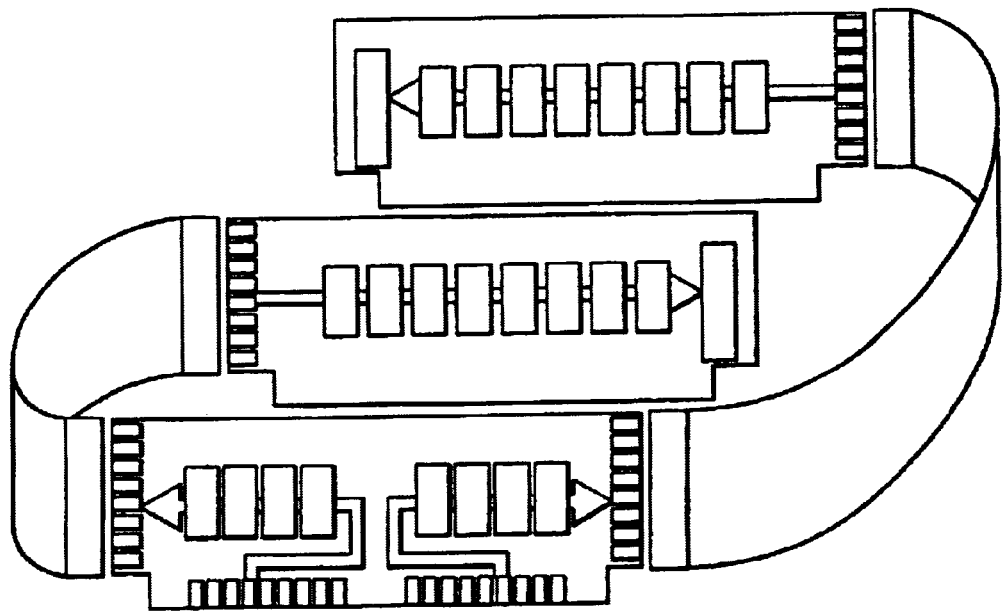

Utilizing one or more of the modules illustrated above, bus systems having various configurations may be implemented using one or more flexible connector(s). Consider the examples shown in FIGS. 13A, 13B, 13C, and 13D. Only two channel bus systems are illustrated, but from these examples one of ordinary skill in the art will readily discern how any reasonable number of "N" channels may be implemented in a bus system. Note that the various channels may be terminated in either a set of output finger connectors (FIGS. 13A and 13C), and/or in an on-module set of termination resistors (FIGS. 13B and 13D).

Figure 14A:
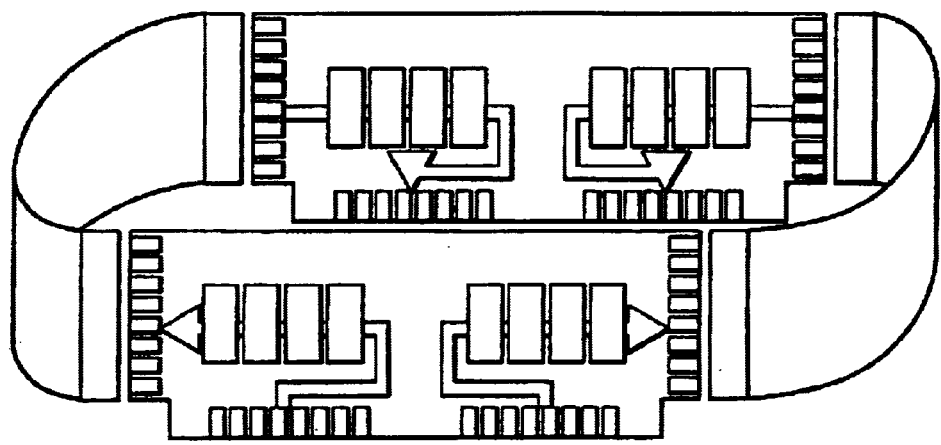
FIGS. 14A, 14B, and 14C further illustrate various two channel bus systems having a number of different termination options; and, FIGS. 15A and 15B illustrate embodiments using a top edge mounted flexible connector.
Figure 14B:
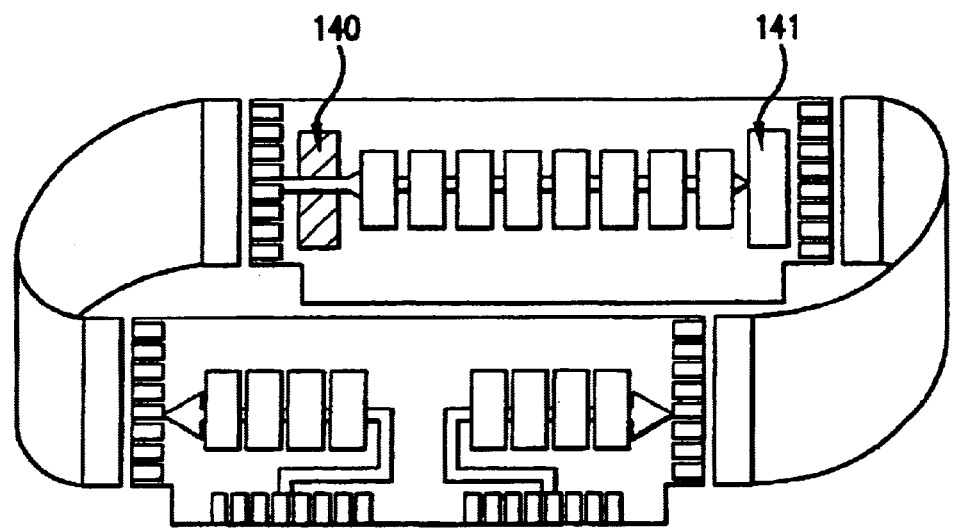
Figure 14C:
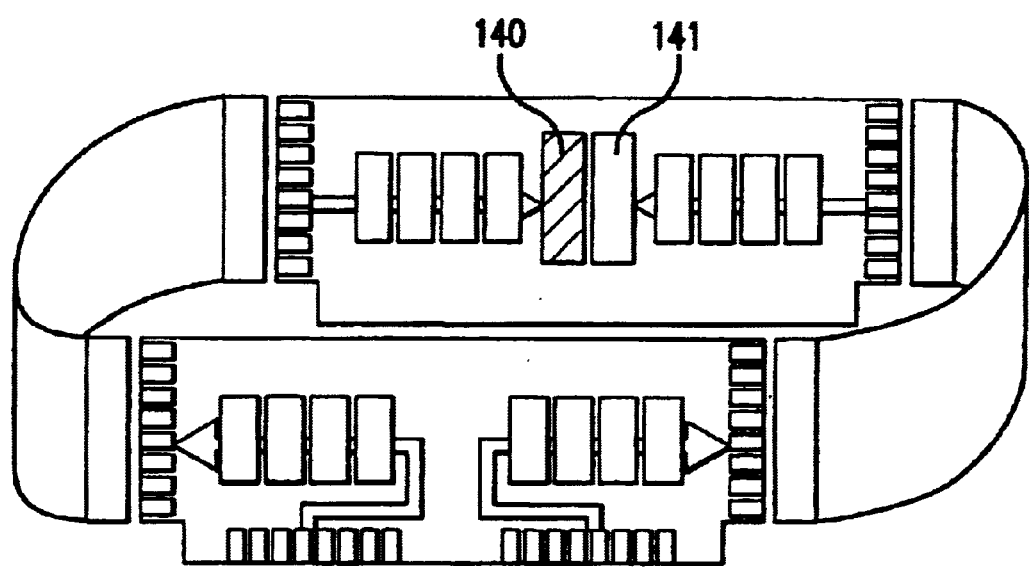

FIGS. 14A, 14B, and 14C illustrate further examples of two channels bus systems having various connection and termination schemes. Like the ICs on these modules, more than one termination element may be mounted on either primary surface. See termination elements 140 and 141 in FIGS. 14B and 14C.

Figure 15A:
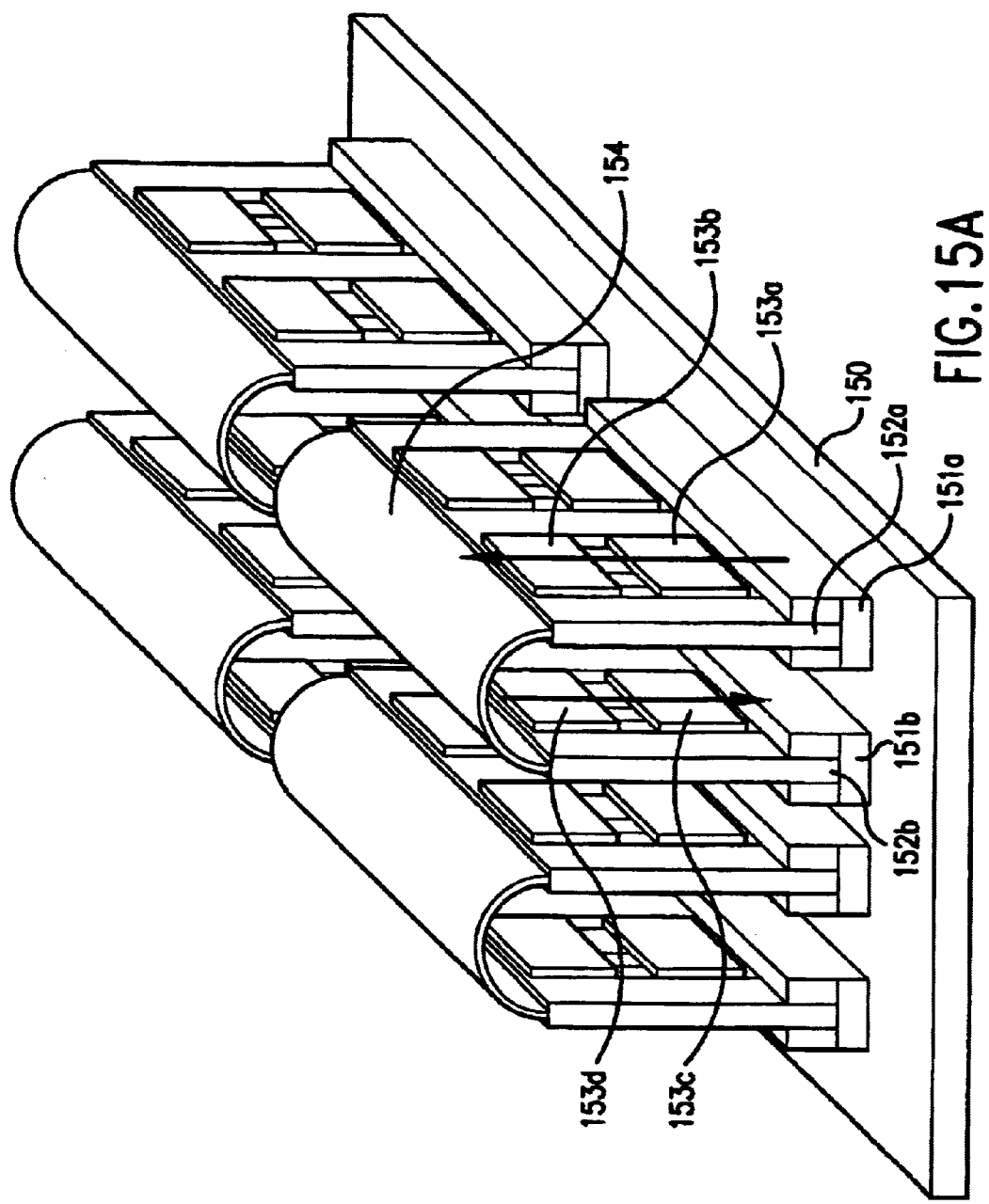
Figure 15B:
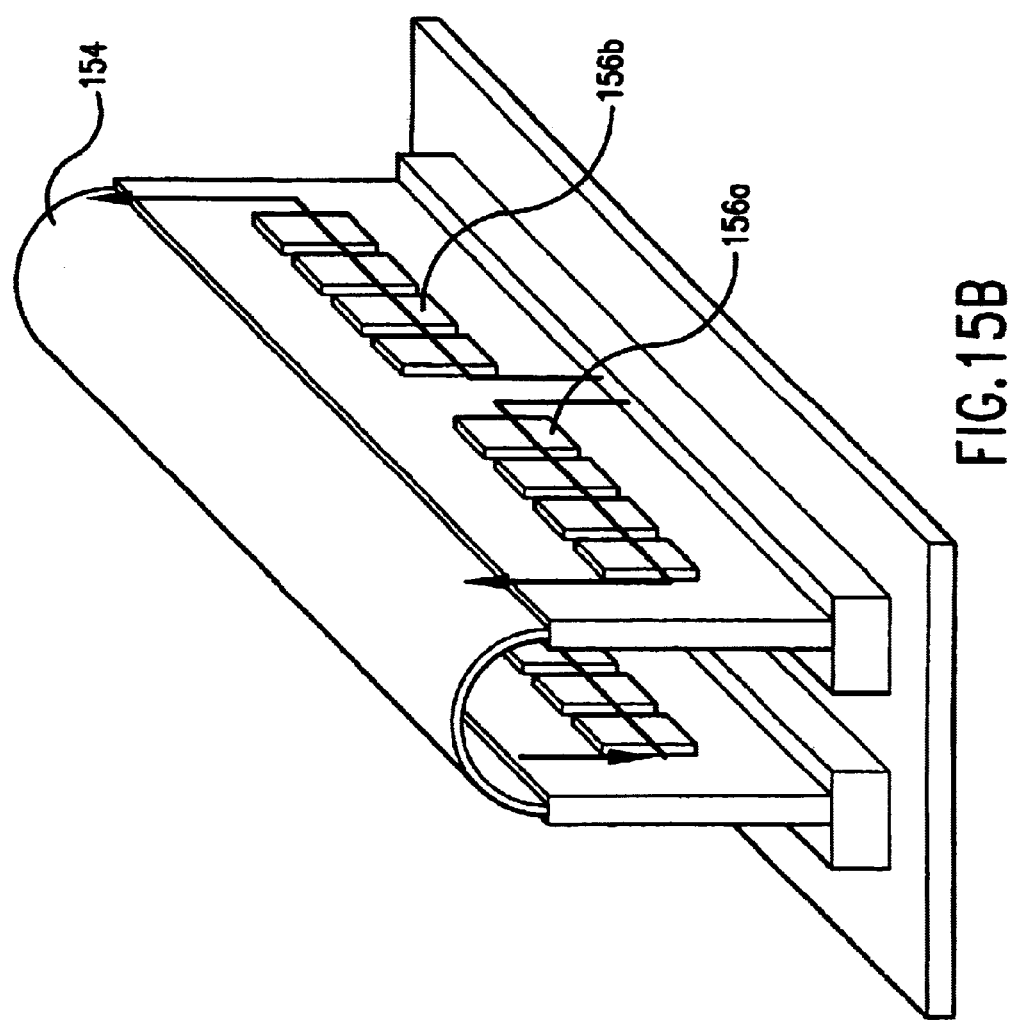

In FIGS. 15A and 15B, a flexible connector 154 is used to connect modules. However, unlike the former examples in which a flexible connector was attached to the modules via a lateral edge, the bus systems shown in FIGS. 15A and 15B use a flexible connector attached via a top edge. In particular, adjacent modules 152a and 152b are respectively mounted on motherboard 159 via connectors 151a and 151b. Module 152a comprises ICs 153a and 153b arranged in a vertical column. Module 152b comprises ICS 153c and 153d which are likewise arranged in a column.

In one further embodiment of the present invention, ICs 153a, 153b, 153c, and 153d are connected in a channel extending from a edge lower fingers on module 152a, through a bus portion on module 152a, through flexible connector 154, down through a bus portion on module 152b, to be terminated at a lower set of edge fingers on module 152b. Other channels may be similarly implemented.

The bus system shown in FIG. 15B illustrates another way in which a plurality of ICs may be effectively mounted on a module in one or more channels. Here, rather than arranging ICs in vertical columns, the ICs are arranged in rows. A single channel may begin at a centrally located set of edge fingers, make a right turn near the center of the module, extend laterally through the row of ICs, and then make another right turn into flexible connector 154. This path is reversed in the adjacent module. In this manner, first and second pluralities of ICs (156a 156b) may be arranged in rows on each one of the modules and connected as shown.

Figure 16:
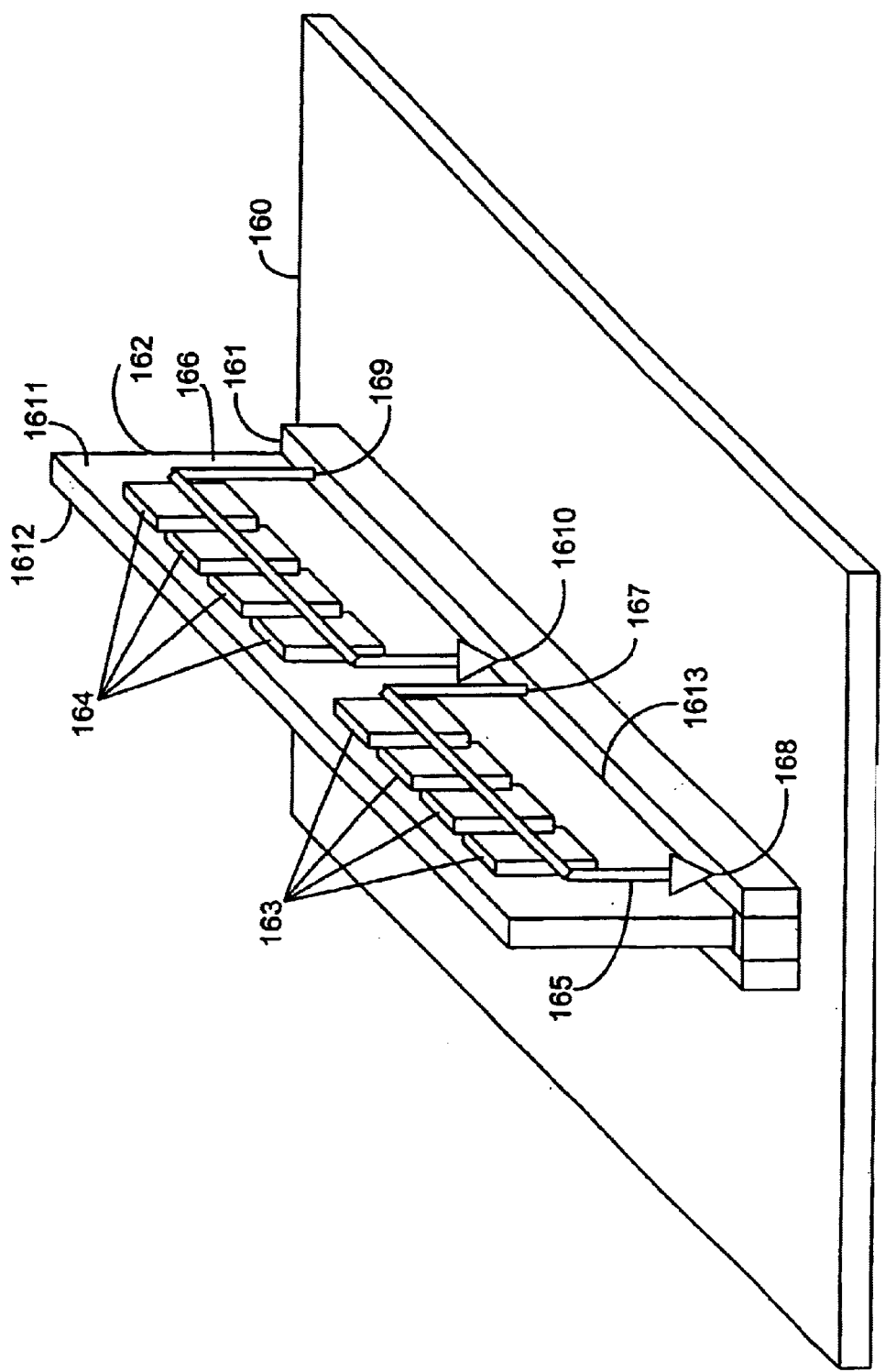
FIG. 16 is a perspective diagram illustrating yet another embodiment of a two channel module in accordance with the present invention.

FIG. 16 is a perspective diagram illustrating yet another embodiment of a two channel module in accordance with the present invention. Module 162 includes a first primary surface 1611 and a second primary surface 1612, which opposes the first primary surface 1611. Module 162 also has a first end 1613. Proximate to the first end 1613 are a first set of input finger connectors 167, a first set of output finger connectors 168, a second set of input finger connectors 169, and a second set of output finger connectors 1610. Alternatively, the first set of input finger connectors 167 and/or the second set of input finger connectors 169 may provide ingress elsewhere on module 162. Likewise, the first set of output finger connectors 168 and the second set of output finger connectors 1610 may provide egress elsewhere on module 162. The first set of input finger connectors 167, the first set of output finger connectors 168, the second set of input finger connectors 169, and the second set of output finger connectors 1610 are disposed on at least one of the first primary surface 1611 and the second primary surface 1612.

A plurality of integrated circuits (ICs) populate at least one of the first primary surface 1611 and the second primary surface 1612. The plurality of integrated circuits include ICs 163 and ICs 164. A bus is coupled to the plurality of ICs. The bus includes a first channel 165 extending from the first set of input finger connectors 167 to the first set of output finger connectors 168. The bus also includes a second channel 166 extending from the second set of input finger connectors 169 to the second set of output finger connectors 1610. The first channel 165 is coupled to ICs 163, and the second channel 166 is coupled to ICs 164. The first set of input finger connectors 167, the first set of output finger connectors 168, the second set of input finger connectors 169, and the second set of output finger connectors 1610 mate with a motherboard connector 161 mounted on a motherboard 160.

The first channel 165 and the second channel 166 may be implemented in a variety of configurations. For example, the first set of output finger connectors 168 may be disposed in a similar direction from the first set of input finger connectors 167 as the direction in which the second set of output finger connectors 1610 are disposed from the second set of input finger connectors 169. Consequently, the first channel 165 and the second channel 166 may be configured to convey signals in a generally similar direction across at least one of the first primary surface 1611 and the second primary surface 1612.

As another example, the first set of output finger connectors 168 may be disposed in an opposite direction from the first set of input finger connectors 167 of the direction in which the second set of output finger connectors 1610 are disposed from the second set of input finger connectors 169. Consequently, the first channel 165 and the second channel 166 may be configured to convey signals in generally opposite directions across at least one of the first primary surface 1611 and the second primary surface 1612.

In one instance, the first set of input finger connectors 167 and the second set of input finger connectors 169 may be disposed near the middle of first end 1613, with the first set of output finger connectors 168 and the second set of output finger connectors 1610 disposed opposite one another along the periphery of first end 1613. In another instance, the first set of input finger connectors 167 and the second set of input finger connectors 169 may be disposed opposite one another along the periphery of first end 1613, with the first set of output finger connectors 168 and the second set of output finger connectors 1610 disposed near the middle of first end 1613. As noted previously, other locations and/or orientations of the connectors and the channels may be implemented.

By providing multiple channels, simultaneous independent accesses may be made to the plurality of ICs. For example, while a first element on the motherboard 160 is communicating with ICs 163 through first channel 165, a second element on the motherboard 160 may be communicating independently with ICs 164 through second channel 166. Thus, the effective bandwidth, or amount of information that may be transferred per unit time, of the bus is effectively increased through the use of multiple channels.

Figure 17:
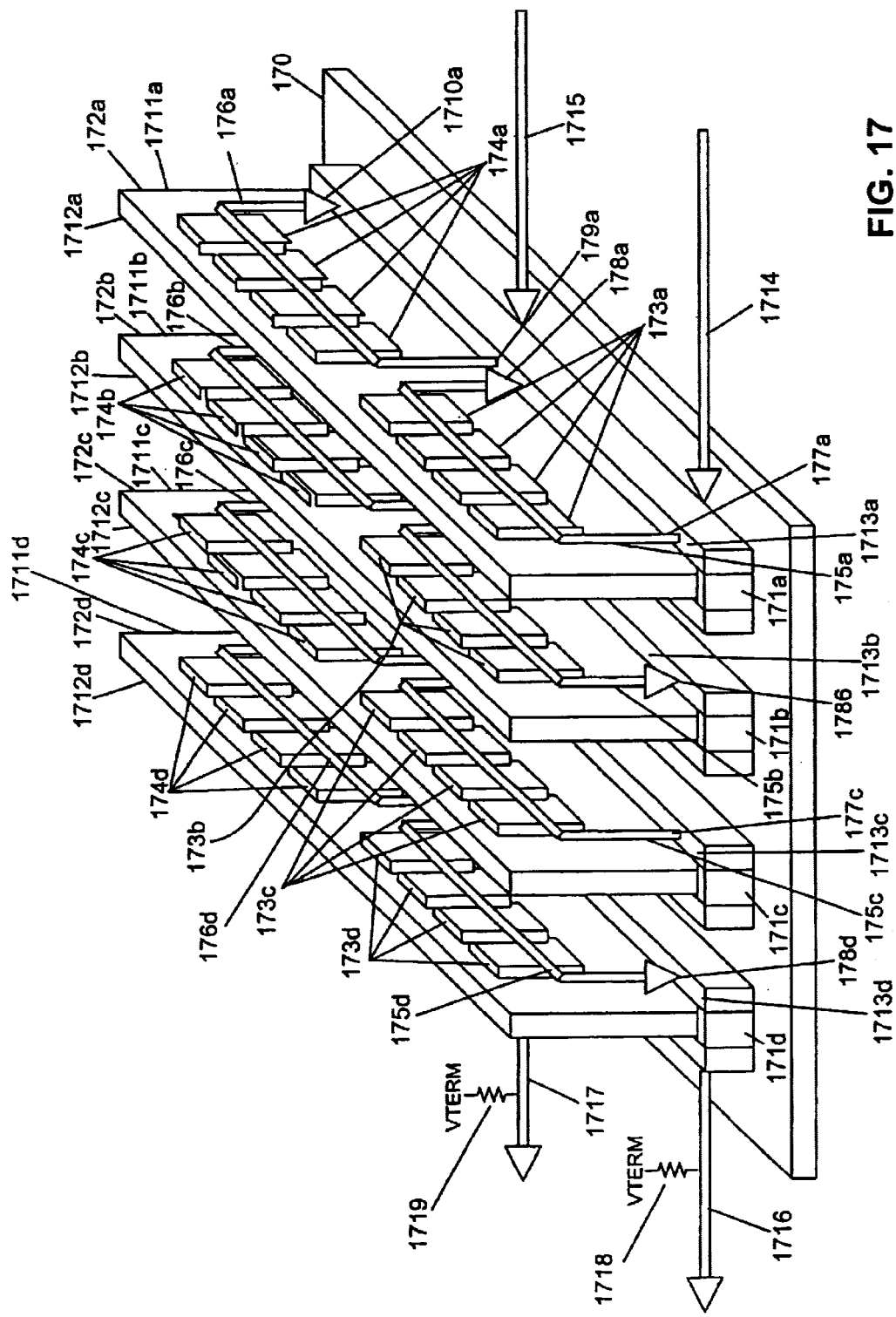
FIG. 17 is a perspective diagram illustrating a bus system formed by the interconnection of multiple modules in accordance with the embodiment illustrated in FIG. 16.

FIG. 17 is a perspective diagram illustrating a bus system formed by the interconnection of multiple modules in accordance with the embodiment illustrated in FIG. 16. The bus system includes motherboard 170, motherboard connectors 171a, 171b, 171c, and 171d, and modules 172a, 172b, 172c, and 172d. Module 172a is coupled to motherboard 170 via motherboard connector 171a. Module 172b is coupled to motherboard 170 via motherboard connector 171b. Module 172c is coupled to motherboard 170 via motherboard connector 171c. Module 172d is coupled to motherboard 170 via motherboard connector 171d.

Module 172a has a first primary surface 1711a, a second primary surface 1712a, and a first end 1713a. ICs 173a and ICs 174a populate at least one of the first primary surface 1711a and the second primary surface 1712a. Module 172b has a first primary surface 1711b, a second primary surface 1712b, and a first end 1713b. ICs 173b and ICs 174b populate at least one of the first primary surface 1711b and the second primary surface 1712b. Module 172c has a first primary surface 1711c, a second primary surface 1712c, and a first end 1713c. ICs 173c and ICs 174c populate at least one of the first primary surface 1711c and the second primary surface 1712c. Module 172d has a first primary surface 1711d, a second primary surface 1712d, and a first end 1713d. ICs 173d and ICs 174d populate at least one of the first primary surface 1711d and the second primary surface 1712d.

Motherboard 170 includes a bus coupled to motherboard connector 171a. The bus includes first channel 1714 and second channel 1715. The first channel 1714 is coupled through motherboard connector 171a and the first set of input finger connectors 177a to the first channel 175a the bus of module 172a. The first channel 175a of the bus of module 172a is coupled through the first set of output finger connectors 178a and through motherboard connector 171a to a bus segment on motherboard 170. The bus segment is coupled through motherboard connector 171b to the first channel 175b of the bus of module 172b. The first channel 175b of the bus of module 172b is coupled through output finger connectors 178b and through motherboard connector 171b to another bus segment of motherboard 170. This bus segment is coupled through motherboard connector 171c and through input finger connectors 177c to the first channel 175c of the bus of module 172c. The first channel 175c of the bus of module 172c is coupled through motherboard connector 171c to another bus segment on motherboard 170. This bus segment is coupled through motherboard connector 171d to the first channel 175d of the bus of module 172d. Motherboard 170 includes a bus coupled to motherboard connector 171d. The bus includes a first channel 1716 and a second channel 1717. The first channel 175d of the bus of module 172d is coupled through output finger connectors 178d and through motherboard connector 171d to the first channel 1716 of the bus on motherboard 170.

The first channel 1716 of the bus on motherboard 170 may continue to additional circuitry on motherboard 170 or, optionally, may be terminated using bus termination 1718. Bus termination 1718 provides an impedance to match the characteristic impedance of the first channel 1716 of the bus and is coupled to a termination voltage VTERM. A bus termination may include any impedance element terminating a bus. Examples of bus terminations include, but are not limited to, passive bus terminations utilizing resistive elements, active bus terminations utilizing semiconductor devices, conductive stubs, etc. Preferred bus terminations include passive bus terminations utilizing resistive elements and active bus terminations utilizing semiconductor devices. The terms bus termination, termination, and terminator may be used interchangeably.

The second channel 1715 of the bus on motherboard 170 coupled to motherboard connector 171a is coupled to the second set of input finger connectors 179a to the second channel 176a of the bus of module 172a. The second channel 176a of the bus of module 172a is coupled through the second set of output finger connectors 1710a and through motherboard connector 171a to a bus segment on motherboard 170. The bus segment is coupled through motherboard connector 171b to the second channel 176b of the bus of module 172b. The second channel 176b of the bus of module 172b is coupled through motherboard connector 171b to another bus segment of motherboard 170. This bus segment is coupled through motherboard connector 171c to the second channel 176c of the bus of module 172c. The second channel 176c of the bus of module 172c is coupled through motherboard connector 171c to another bus segment on motherboard 170. This bus segment is coupled through motherboard connector 171d to the second channel 176d of the bus of module 172d. The second channel 176d of the bus of module 172d is coupled through motherboard connector 171d to the second channel 1717 of the bus on motherboard 170.

The second channel 1717 of the bus of motherboard 170 may continue to additional circuitry on motherboard 170 or, optionally, may be terminated using bus termination 1719. Bus termination 1719 provides an impedance to match the characteristic impedance of the second channel 1717 of the bus and is coupled to a termination voltage VTERM.

The bus system may be implemented in a variety of configurations. For example, modules 172a, 172b, 172c, and 172d may be implemented according to any of the configurations of the module 162 described in reference to FIG. 16, including various combinations of different configurations among the modules. First and second channels of the modules may be configured to pass signals in similar or different directions, either within each module or between modules. For example, module 172a may be configured to pass signals for the first channel in the same direction as signals for the second channel, and module 172b may be configured to pass signals for the first channel in the same direction as signals for the second channel, but in an opposite direction of module 172a. As another example, module 172a may be configured to pass signals for the first channel and the second channel in opposite directions within module 172a, but with module 172b passing signals for the first channel in a direction opposite that of the first channel of module 172a and passing signals for the second channel in a direction opposite that of the second channel of module 172a. Other variations of the same or different directions within or between modules may be implemented.

Figure 18:
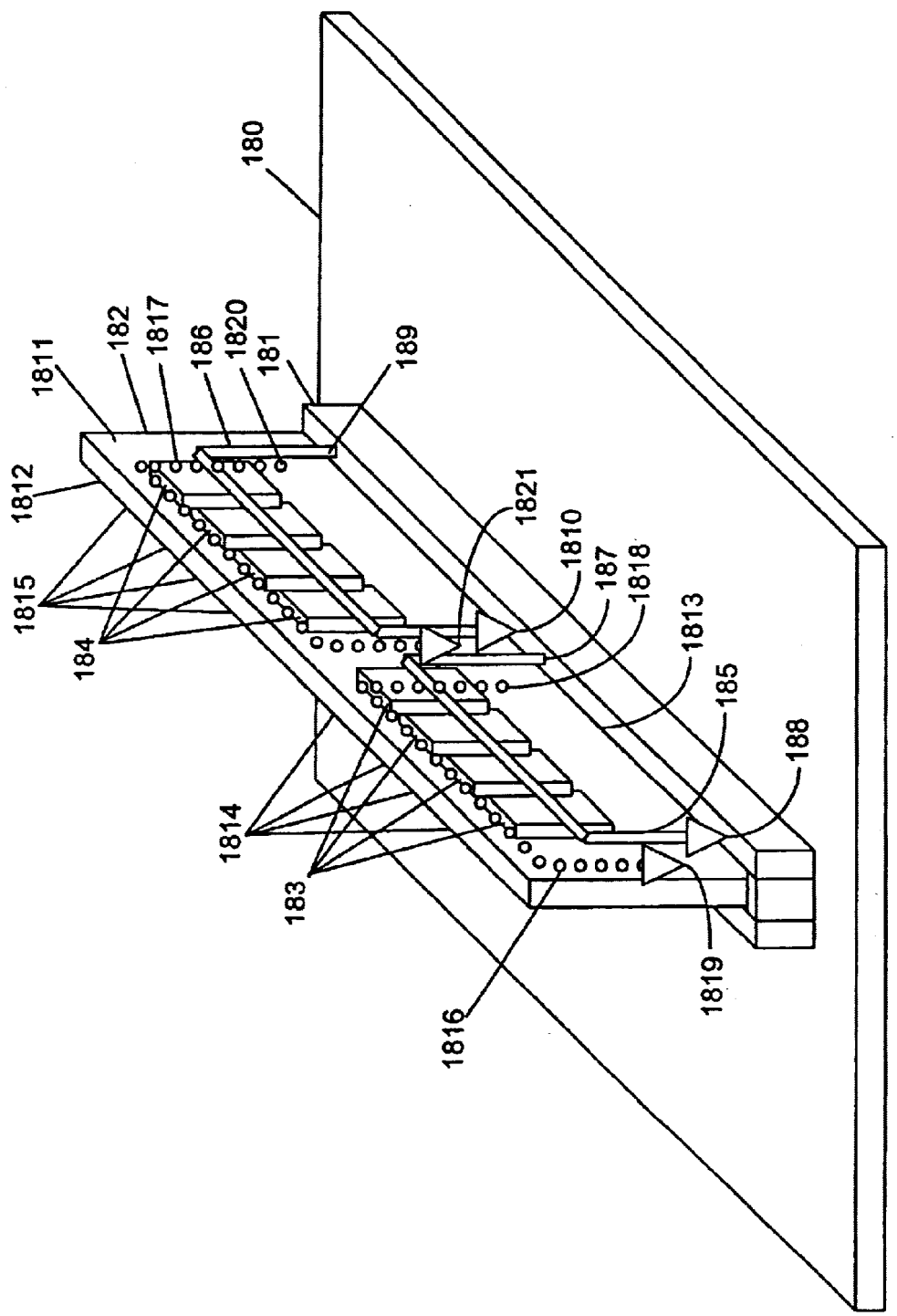
FIG. 18 is a perspective diagram illustrating yet another embodiment of a four channel module in accordance with the present invention.

FIG. 18 is a perspective diagram illustrating yet another embodiment of a four channel module in accordance with the present invention. As noted above in reference to FIG. 16, providing multiple channels allows multiple simultaneous independent accesses to be made to the ICs within a module, thereby increasing the effective bandwidth of the bus of a module. As the number of channels is increased, the effective bandwidth is also increased. While various numbers of channels may be provided, FIG. 18 illustrates, as an example, a module providing four channels.

Given that module 182 has a first primary surface 1811 and a second primary surface 1812, each of which can accommodate integrated circuits (ICs), it is beneficial to populate both first primary surface 1811 and second primary surface 1812 with ICs. For example, ICs 183 and ICs 184 populate the first primary surface 1811, while ICs 1814 and ICs 1815 populate the second primary surface 1812. The bus of module 182 includes a first channel 185, a second channel 186, a third channel 1816, and a fourth channel 1817. The first channel 185 is coupled to ICs 183. The second channel 186 is coupled to ICs 184. The third channel 1816 is coupled to ICs 1814. The fourth channel 1817 is coupled to ICs 1815.

Module 182 is removably coupled at its first end 1813 to motherboard connector 181, which is coupled to motherboard 180. Motherboard 180 conducts signals for the first channel 185 of the bus of module 182 through motherboard connector 181 to a first set of input finger connectors 187 of module 182 and signals for the second channel 186 of the bus of module 182 through motherboard connector 181 to a second set of input finger connectors 189 of module 182. Motherboard 180 conducts signals for the third channel 1816 of the bus of module 182 through motherboard connector 181 to a third set of input finger connectors 1818 of module 182 nd signals for the fourth channel 1817 of module 182 through motherboard connector 181 to a fourth set of input finger connectors 1820 of module 182.

The first channel 185 of the bus of module 182 is coupled through the first set of output finger connectors 188 and through motherboard connector 181 to motherboard 180. The second channel 186 of the bus of module 182 is coupled through the second set of output finger connectors 1810 and through motherboard connector 181 to motherboard 180. The third channel 1816 of the bus of module 182 is coupled through the third set of output finger connectors 1819 and through motherboard connector 181 to motherboard 180. The fourth channel 1817 of the bus of module 182 is coupled through the fourth set of output finger connectors 1821 and through motherboard connector 181 to motherboard 180.

Figure 19:
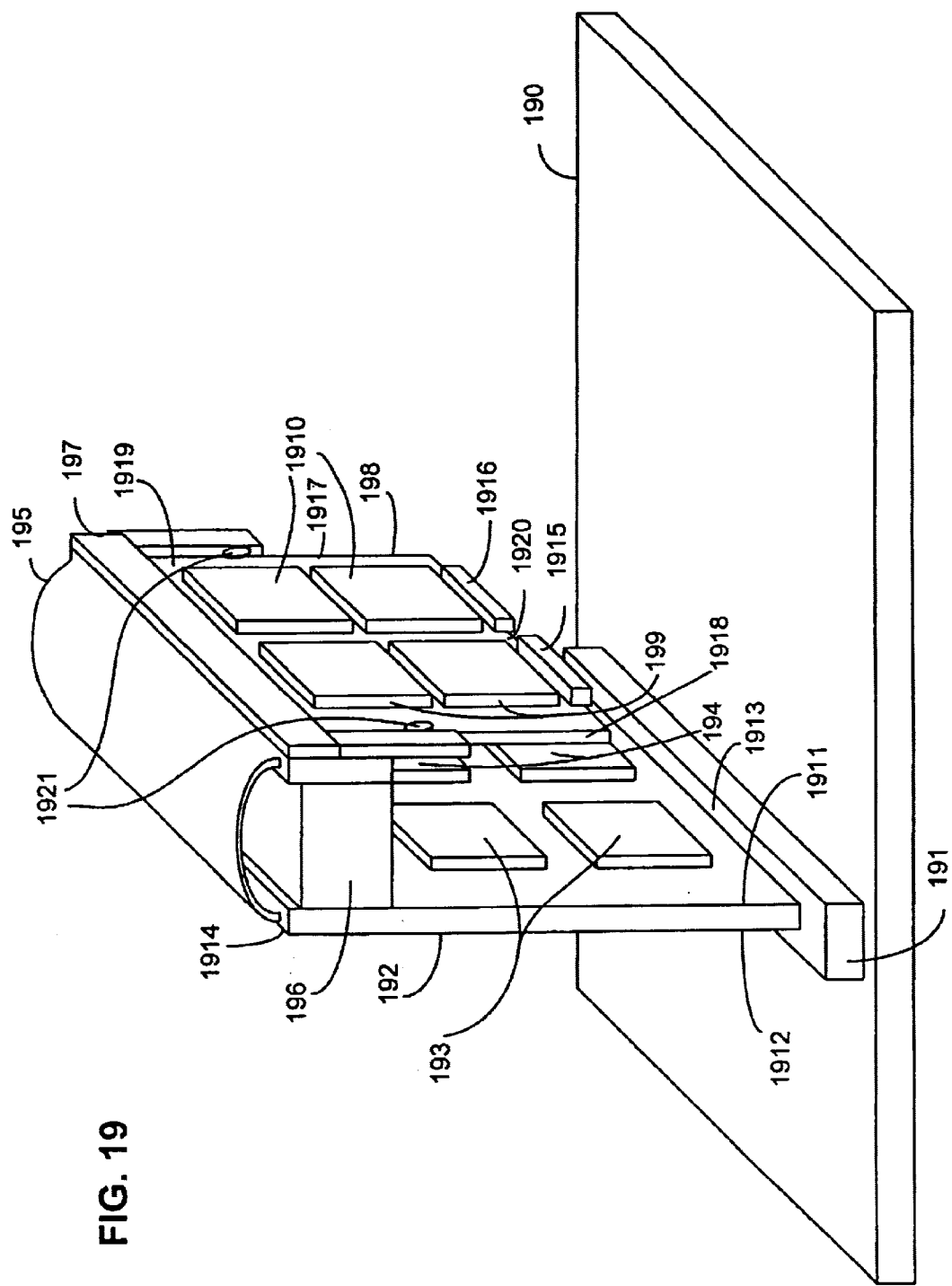
FIG. 19 is a perspective diagram illustrating an embodiment of a module with a second printed circuit board (PCB) attached to a connector in accordance with the present invention.

FIG. 19 is a perspective diagram illustrating an embodiment of a module with a second printed circuit board (PCB) attached to a connector in accordance with the present invention. The module is formed from PCB 192, which has a first primary surface 1911 and a second primary surface 1912. PCB 192 has a first end 1913 and a second end 1914. A set of finger connectors is disposed on at least one of the first primary surface 1911 and the second primary surface 1912 proximate to the first end 1913 of PCB 192. The set of finger connectors are removably coupled to motherboard connector 191, which is mounted on motherboard 190.

A plurality of integrated circuits (ICs) populate at least one of the first primary surface 1911 and the second primary surface 1912 of PCB 192. The plurality of ICs include ICs 193 and ICs 194. A conductive interconnect 195 is connected proximate to the second end 1914 of PCB 192. A conductive interconnect 195 may include anything that provides an electrical connection. Examples of conductive interconnects 195 include, but are not limited to, flexible cables, flex circuits, and conductive elastomeric interconnects. A bus extends from the set of finger connectors, substantially traversing PCB 192 between the first end 1913 and the second end 1914. The bus further traverses the conductive interconnect 195 so as to couple the bus to a connector 197 that is coupled to the conductive interconnect 195. As an alternative, the conductive interconnect 195 may be connected elsewhere on PCB 192, and the bus may be routed elsewhere on PCB 192.

The connector 197 is adapted to receive a second PCB 198 populated with at least one IC, which may include ICs 199 and ICs 1910. The second PCB has a first primary surface 1917 and a second primary surface 1918. The second PCB 198 has a first end 1919 and a second end 1920. The second PCB 198 includes a second bus that couples the connector 197 to at least one of the ICs 199 or ICs 1910. The second bus extends beyond the ICs and is terminated with a bus termination, such as bus termination 1915 and/or bus termination 1916.

A spacer 196 is attached to one of the first primary surface 1911 of the PCB 192 or the second primary surface 1912 of the PCB 192 proximate to the second end 1914 of PCB 192. The spacer 196 is adapted to maintain a space between the connector 197 and the PCB 192. The space is sufficient to maintain clearance between PCB 192 and any ICs that may populate the first primary surface 1911 of the PCB 192 and the second PCB 198 and any ICs that may populate the second primary surface 1918 of the second PCB 198. For example, while any desired amount of space may be provided, the space may be in the range of zero to ten millimeters.

The connector 197 is preferably oriented to maintain the second PCB 198 substantially parallel to the PCB 192. To maintain second PCB 198 in engagement with connector 197 at the first end 1919 of the second PCB 198 and to allow its removal from connector 197, connector 197 may be provided with latches 1921. Latches 1921 may be manipulated to remove the second PCB 198 from engagement with connector 197.

The embodiment of FIG. 19 may be practiced with multiple channels to allow multiple simultaneous independent accesses to be made to ICs 193, 194, 199, and 1910. For example, the bus may comprise a first channel and a second channel. The set of finger connectors that engage motherboard connector 191 may include a first set of finger connectors and a second set of finger connectors, with the first channel coupled to the first set of finger connectors and the second channel coupled to the second set of finger connectors. The first channel may be coupled to ICs 193, while the second channel may be coupled to ICs 194. Likewise, the first channel and the second channel may be coupled to the second PCB 198 via conductive interconnect 195 and connector 197. On the second PCB 198, ICs 199 may be coupled to the first channel, while ICs 1910 may be coupled to the second channel. The first channel of the second bus of the second PCB 198 may terminate at bus termination 1915, while the second channel of the second bus of the second PCB 198 may terminate at bus termination 1916. Thus, the benefits of providing multiple channels may be extended from PCB 192 to include the second PCB 198.

Figure 20:
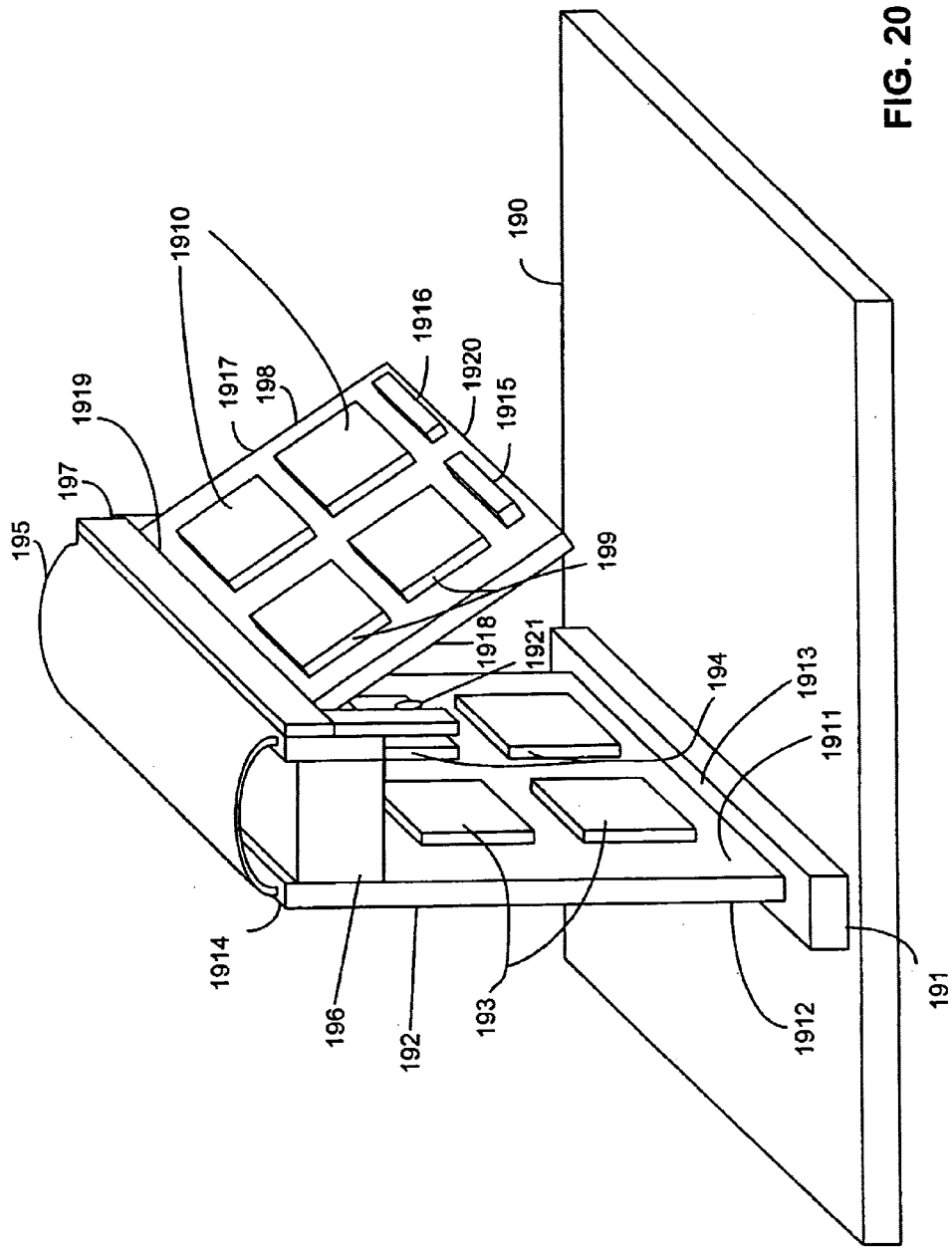
FIG. 20 is a perspective diagram illustrating the embodiment of FIG. 19 with the second PCB undergoing attachment to the connector in accordance with the present invention.

FIG. 20 is a perspective diagram illustrating the embodiment of FIG. 19 with the second PCB undergoing attachment to the connector in accordance with the present invention. As can be seen, the second PCB 198 is oriented at an angle relative to PCB 192 rather than being parallel to PCB 192. Depending on the particular type of connector 197 used, the first end 1919 of second PCB 198 may be engaged in connector 197, and second PCB 198 may be rotated about the first end 1919 until the second PCB 198 is engaged by latches 1921. Alternatively, other types of connectors 197 may be used that provide for translational motion rather than, or in addition to, rotational motion during engagement and/or disengagement.

Referring to FIG. 19 and FIG. 20, the second PCB 198 may be implemented so as to be receivable in motherboard connector 191. Thus, the second PCB 198 may be installed in motherboard connector 191 without PCB 192. The configuration may be upgraded by removing the second PCB 198 from motherboard connector 191, inserting the second PCB 198 into connector 197, and inserting PCB 192 into motherboard connector 191. Since bus termination 1915 and bus termination 1916 are provided on the second PCB 198, proper bus termination is provided regardless of whether the second PCB 198 is inserted into motherboard connector 191 or the second PCB 198 is inserted into connector 197 and PCB 192 is inserted into motherboard connector 191.

Without such an implementation, a PCB lacking ICs 199 and 1910 but having bus terminations 1915 and 1916 would be installed in connector 197 if the use of PCB 192 without second PCB 198 is desired. However, by installing the second PCB 198 directly in motherboard connector 191 (without PCB 192), the use of a separate PCB merely to provide proper bus termination can be avoided. By relying on bus termination 1915 and bus termination 1916 to maintain proper termination impedance, the installation in connector 197 of a PCB containing bus termination 1915 and bus termination 1916 but without ICs 199 and 1910 is rendered unnecessary.

Figure 21:
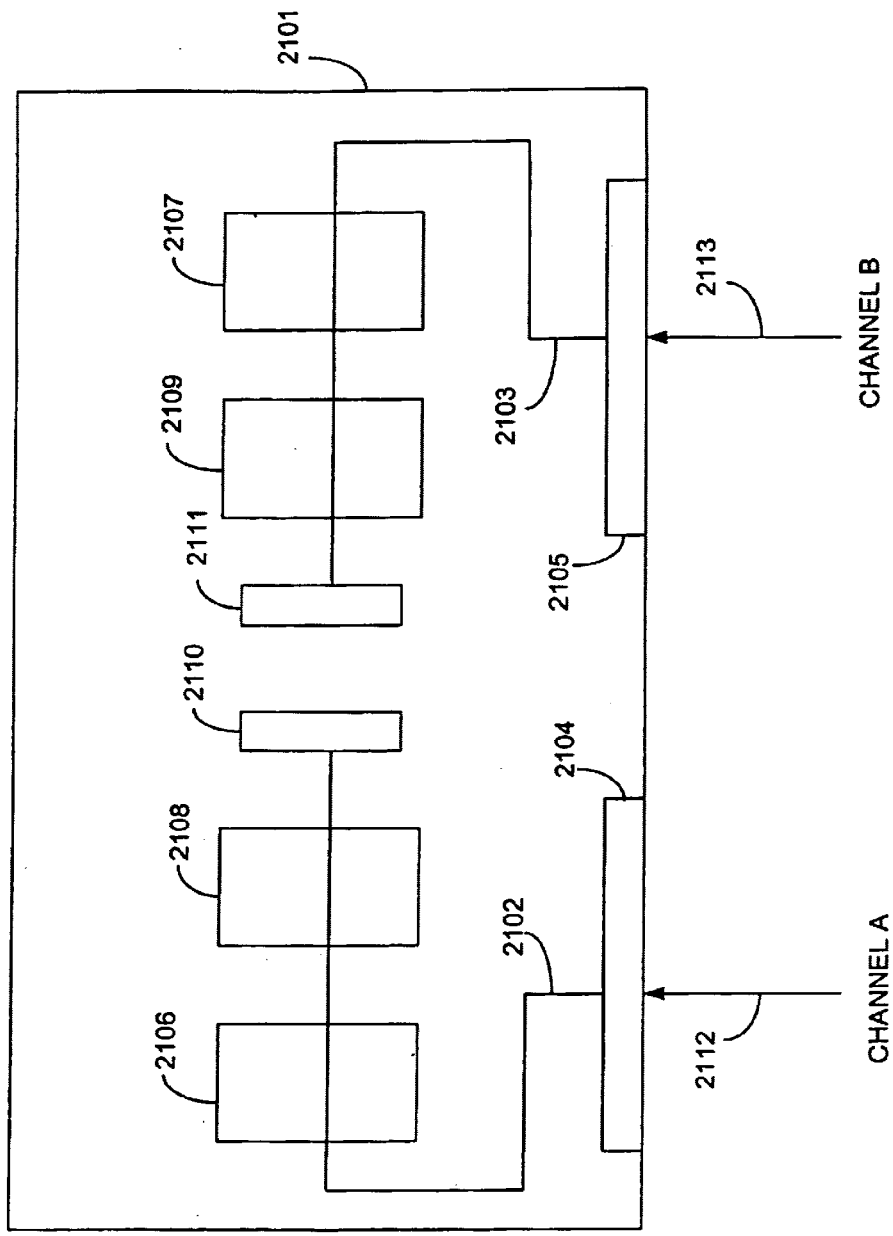
FIG. 21 is a plan view diagram illustrating an embodiment of a two channel module in accordance with the present invention.

FIG. 21 is a plan view diagram illustrating an embodiment of a two channel module in accordance with the present invention. The module 2101 includes a first channel 2102 and a second channel 2103.

First channel signals 2112 are provided to first channel 2102 via first channel connector 2104. First channel 2102 couples first channel connector 2104, memory device 2106, memory device 2108, and terminator 2110.

Second channel signals 2113 are provided to second channel 2103 via second channel connector 2105. Second channel 2103 couples second channel connector 2105, memory device 2107, memory device 2109, and terminator 2111.

Figure 22:
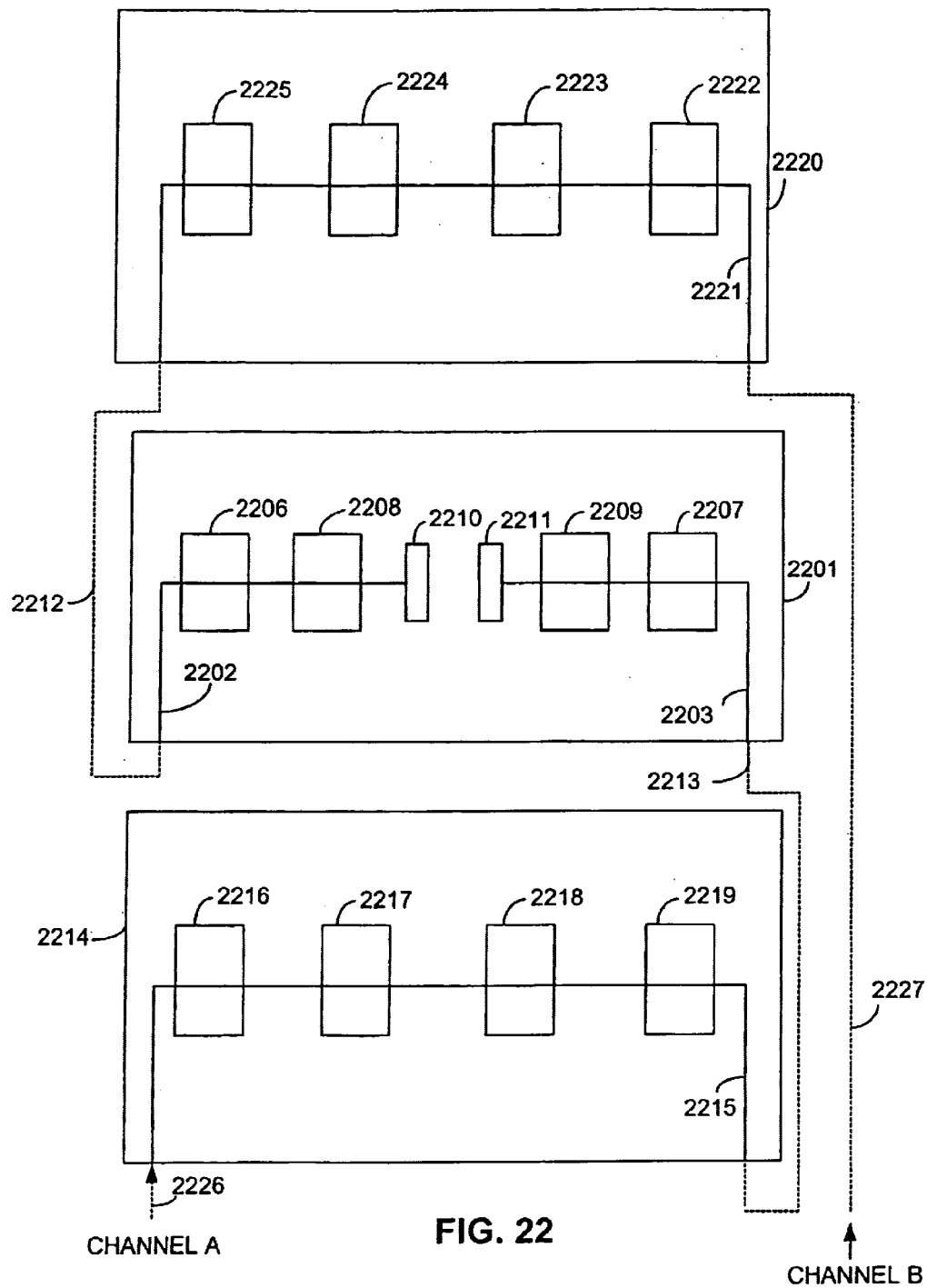
FIG. 22 is a plan view diagram illustrating a bus system formed by the interconnection of multiple modules, including a module in accordance with the embodiment illustrated in FIG. 21.

FIG. 22 is a plan view diagram illustrating a bus system formed by the interconnection of multiple modules, including a module in accordance with the embodiment illustrated in FIG. 21. The bus system includes first module 2214, second module 2220, and third module 2201.

First channel signals 2226 are provided to first channel 2215 of first module 2214. First channel 2215 of first module 2214 couples memory devices 2216, 2217, 2218, and 2219 of first module 2214. First channel 2215 of first module 2214 is coupled to first channel 2203 of third module 2201 via interconnection 2213.

Second channel signals 2227 are provided to second channel 2221 of second module 2220. Second channel 2221 of second module 2220 couples memory devices 2222, 2223, 2224, and 2225 of second module 2220. Second channel 2221 of second module 2220 is coupled to second channel 2202 of third module 2201 via interconnection 2212.

Within third module 2201, first channel 2203 couples memory devices 2207 and 2209 and terminates at terminator 2211. Second channel 2202 couples memory devices 2206 and 2208 and terminates at terminator 2210.

The bus system of FIG. 22 provides a useful feature in that the bus system may be configured with only third module 2201, omitting first module 2214 and second module 2220. In such a configuration, first channel signals 2226 may be applied to either first channel 2203 or second channel 2202 of third module 2201, and second channel signals 2227 may be applied to whichever first channel 2203 and second channel 2202 does not have first channel signals 2226 applied to it. The first channel signals 2226 and the second channel signals 2227 may be applied, for example, by way of circuit board conductors coupled to the third module 2201 or, for example, by using "filler" modules in place of first module 2214 and second module 2220. The "filler" modules need not contain memory devices, but provide electrical conductors to implement channels between ingress connectors and egress connectors, thereby allowing channel signals to pass through to third module 2201.

The bus system of FIG. 22 also allows additional modules to be added, thereby enabling expansion of the bus system. For example, additional modules similar to first module 2214 or second module 2220 may be added. Such additional modules may, for example, be interposed between first module 2214 and third module 2201 and/or between second module 2220 and third module 2201. If additional connector slots are provided to receive such additional modules and the additional modules are not needed, "filler" modules may be inserted in the connector slots to provide continuity or those connector slots may be bypassed.

Figure 23:
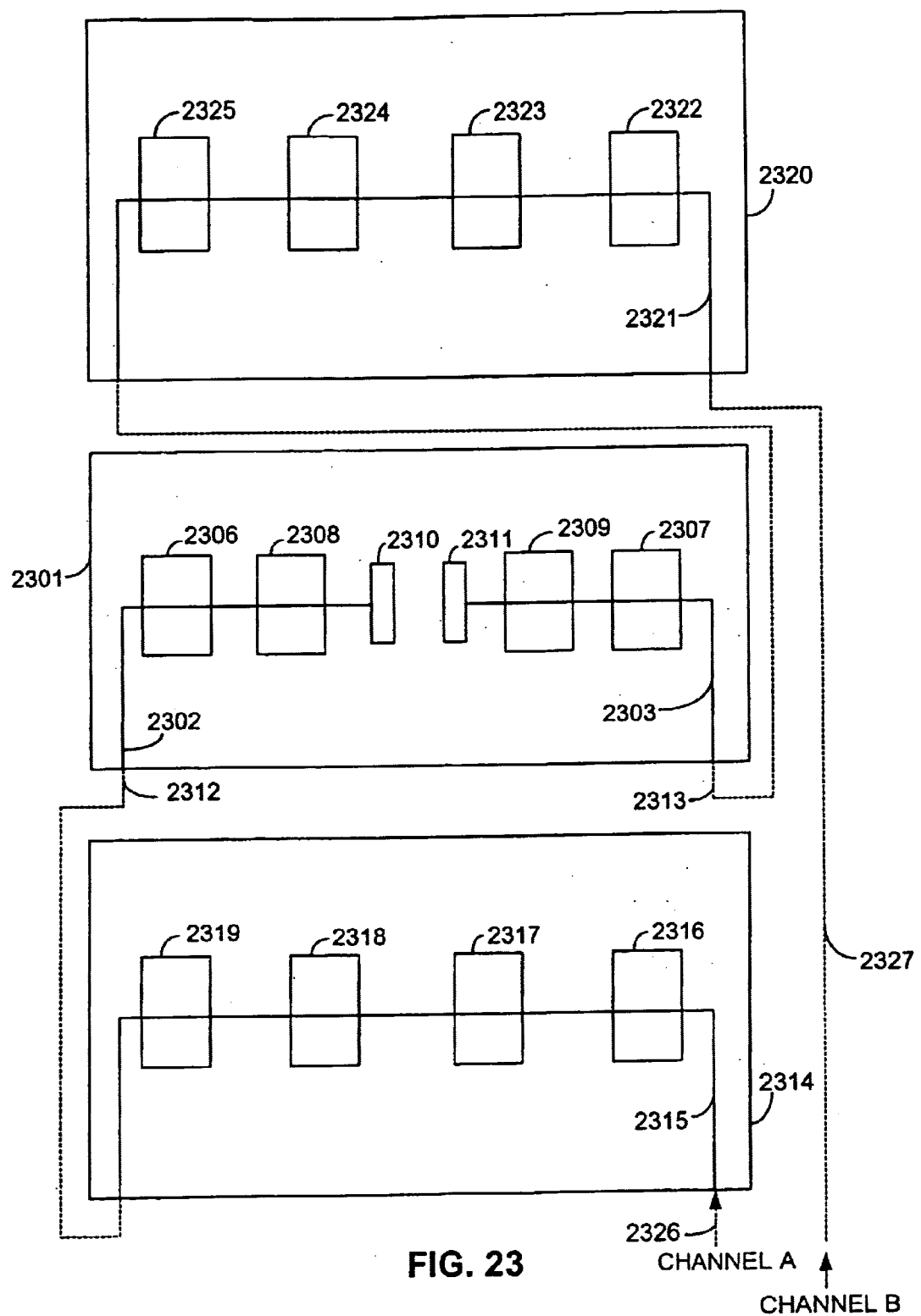
FIG. 23 is a plan view diagram illustrating a bus system formed by the interconnection of multiple modules, including a module in accordance with the embodiment illustrated in FIG. 21.

FIG. 23 is a plan view diagram illustrating a bus system formed by the interconnection of multiple modules, including a module in accordance with the embodiment illustrated in FIG. 21. The bus system includes first module 2314, second module 2320, and third module 2301.

First channel signals 2326 are provided to first channel 2315 of first module 2314. First channel 2315 of first module 2314 couples memory devices 2316, 2317, 2318, and 2319 of first module 2314. First channel 2315 of first module 2314 is coupled to first channel 2302 of third module 2301 via interconnection 2312.

Second channel signals 2327 are provided to second channel 2321 of second module 2320. Second channel 2321 of second module 2320 couples memory devices 2322, 2323, 2324, and 2325 of second module 2320. Second channel 2321 of second module 2320 is coupled to second channel 2303 of third module 2301 via interconnection 2313.

Within third module 2301, first channel 2302 couples memory devices 2306 and 2308 and terminates at terminator 2310. Second channel 2303 couples memory devices 2307 and 2309 and terminates at terminator 2311.

As described above in reference to FIG. 22, the bus system of FIG. 23 is also expandable and may also be reduced to a bus system comprising only third module 2301, without first module 2314 and second module 2320. Likewise, additional modules and/or "filler" modules may be used with the bus system of FIG. 23.

Figure 24:
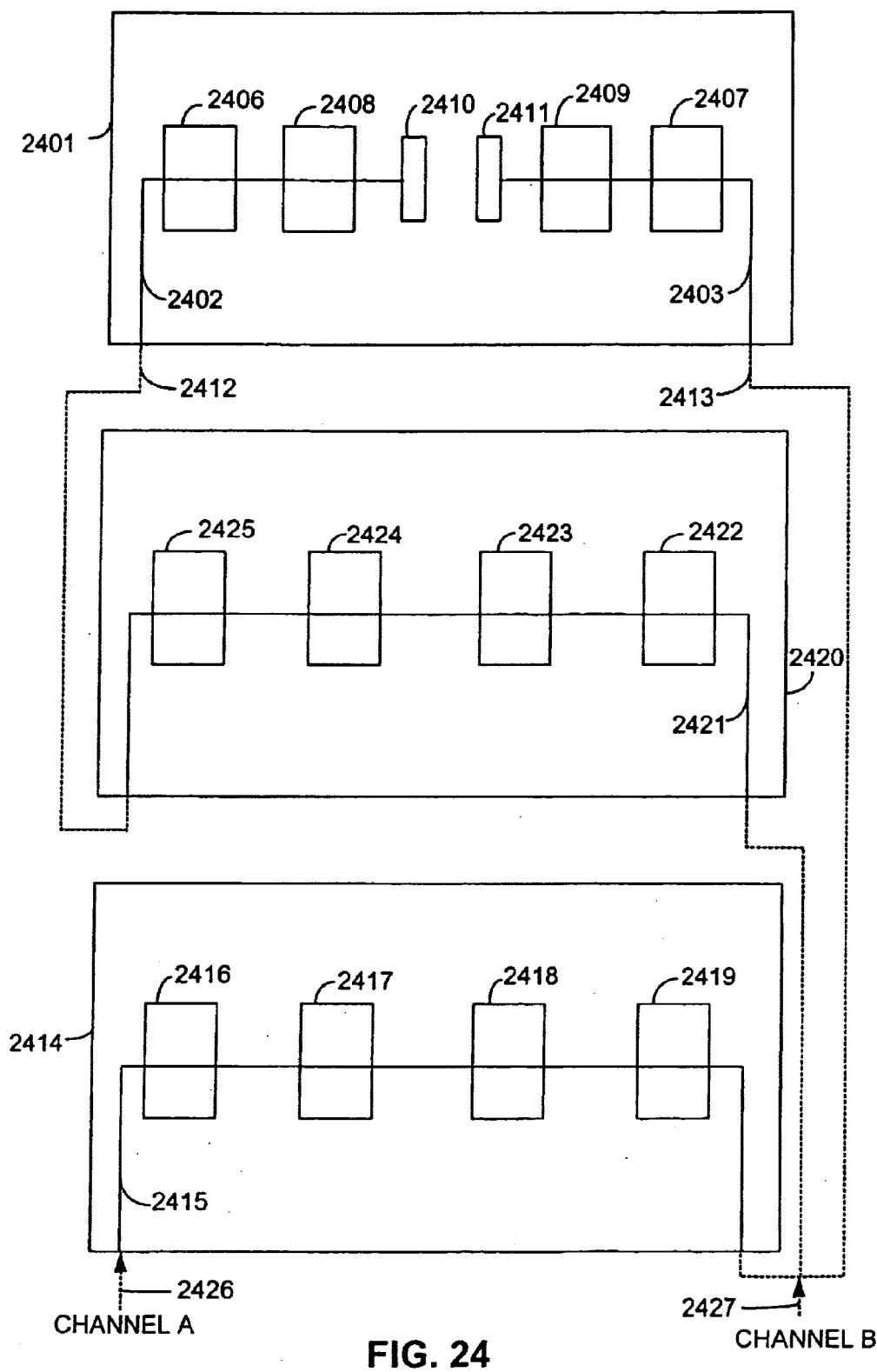
FIG. 24 is a plan view diagram illustrating a bus system formed by the interconnection of multiple modules, including a module in accordance with the embodiment illustrated in FIG. 21.

FIG. 24 is a plan view diagram illustrating a bus system formed by the interconnection of multiple modules, including a module in accordance with the embodiment illustrated in FIG. 21. The bus system includes first module 2414, second module 2420, and third module 2401.

First channel signals 2426 are provided to first channel 2415 of first module 2414. First channel 2415 of first module 2414 couples memory devices 2416, 2417, 2418, and 2419 of first module 2414. First channel 2415 of first module 2414 is coupled to first channel 2403 of third module 2401 via interconnection 2413.

Second channel signals 2427 are provided to second channel 2421 of second module 2420. Second channel 2421 of second module 2420 couples memory devices 2422, 2423, 2424, and 2425 of second module 2420. Second channel 2421 of second module 2420 is coupled to second channel 2402 of third module 2401 via interconnection 2412.

Within third module 2401, first channel 2403 couples memory devices 2407 and 2409 and terminates at terminator 2411. Second channel 2402 couples memory devices 2406 and 2408 and terminates at terminator 2410.

As described above in reference to FIG. 22, the bus system of FIG. 24 is also expandable and may also be reduced to a bus system comprising only third module 2401, without first module 2414 and second module 2420. Likewise, additional modules and/or "filler" modules may be used with the bus system of FIG. 24.

Figure 25:
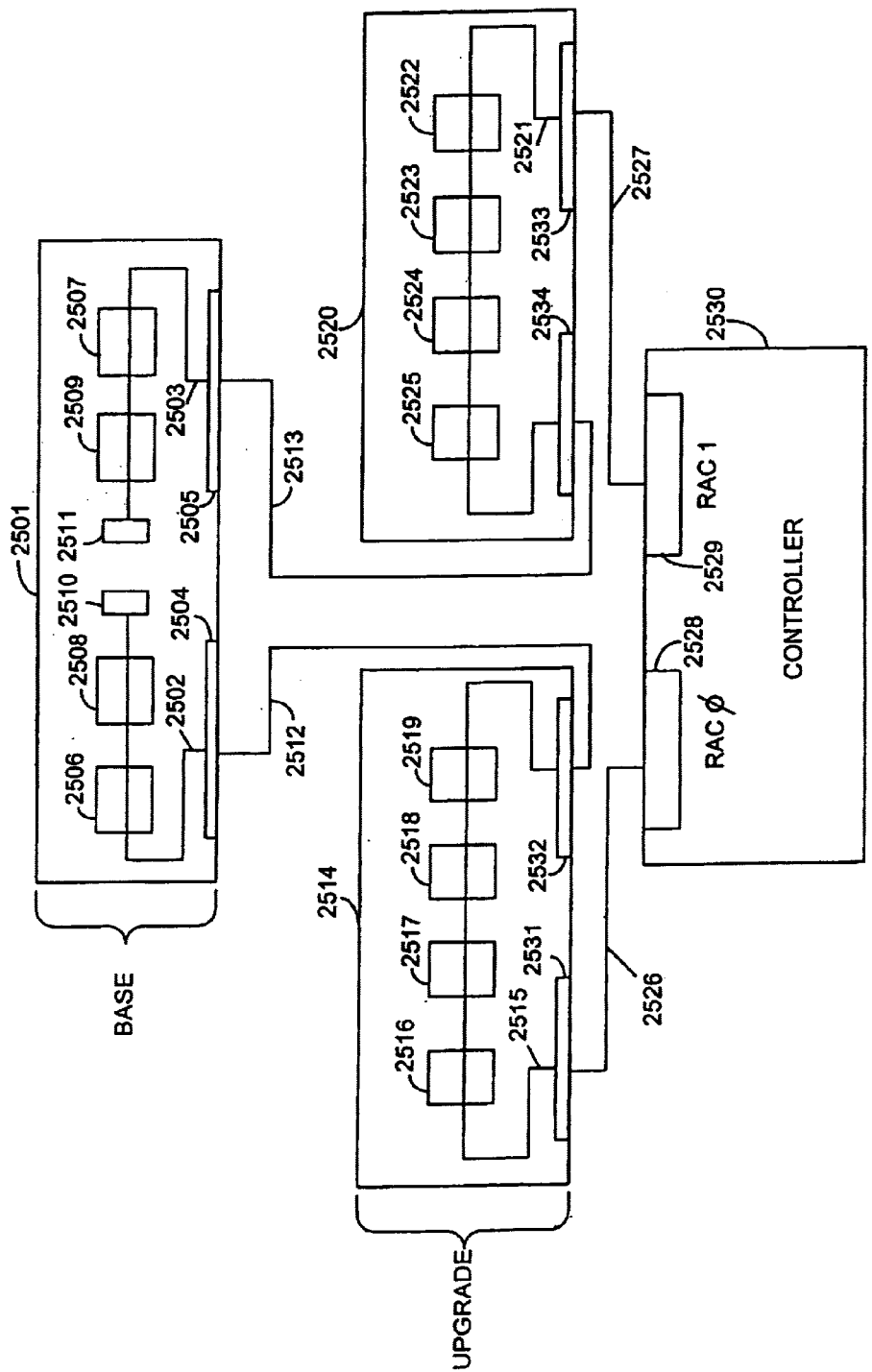
FIG. 25 is a plan view diagram illustrating a bus system formed by the interconnection of multiple modules, including a module in accordance with the embodiment illustrated in FIG. 21.

FIG. 25 is a plan view diagram illustrating a bus system formed by the interconnection of multiple modules, including a module in accordance with the embodiment illustrated in FIG. 21. The bus system includes a controller 2530, a first module 2514, a second module 2520, and a third module 2501. Controller 2530 includes a first channel 2528 and a second channel 2529. First channel 2528 of controller 2530 is coupled to first channel ingress connector 2531 of first module 2514 via interconnection 2526. Second channel 2529 of controller 2530 is coupled to second channel ingress connector 2533 of second module 2520 via interconnection 2527.

First channel ingress connector 2531 of first module 2514 is coupled to first channel 2515 of first module 2515. First channel 2515 couples memory devices 2516, 2517, 2518, and 2519 and continues to first channel egress connector 2532 of first module 2514. First channel egress connector 2532 of first module 2514 is coupled to first channel ingress connector 2504 of third module 2501 via interconnection 2512.

Second channel ingress connector 2527 of second module 2520 is coupled to second channel 2521 of second module 2520. Second channel 2521 of second module 2520 couples memory modules 2522, 2523, 2524, and 2525 and continues to second channel egress connector 2534 of second module 2520. Second channel egress connector 2534 of second module 2520 is coupled to second channel ingress connector 2505 of third module 2501 via interconnection 2513.

Within third module 2501, first channel ingress connector 2504 is coupled to first channel 2502. First channel 2502 couples memory devices 2506 and 2508 and continues to terminator 2510. Second channel ingress connector 2505 of third module 2501 is coupled to second channel 2503. Second channel 2503 couples memory devices 2507 and 2509 and continues to terminator 2511.

As described above in reference to FIG. 22, the bus system of FIG. 25 is also expandable and may also be reduced to a bus system comprising only third module 2501, without first module 2514 and second module 2520. Likewise, additional modules and/or "filler" modules may be used with the bus system of FIG. 25.

Figure 26:
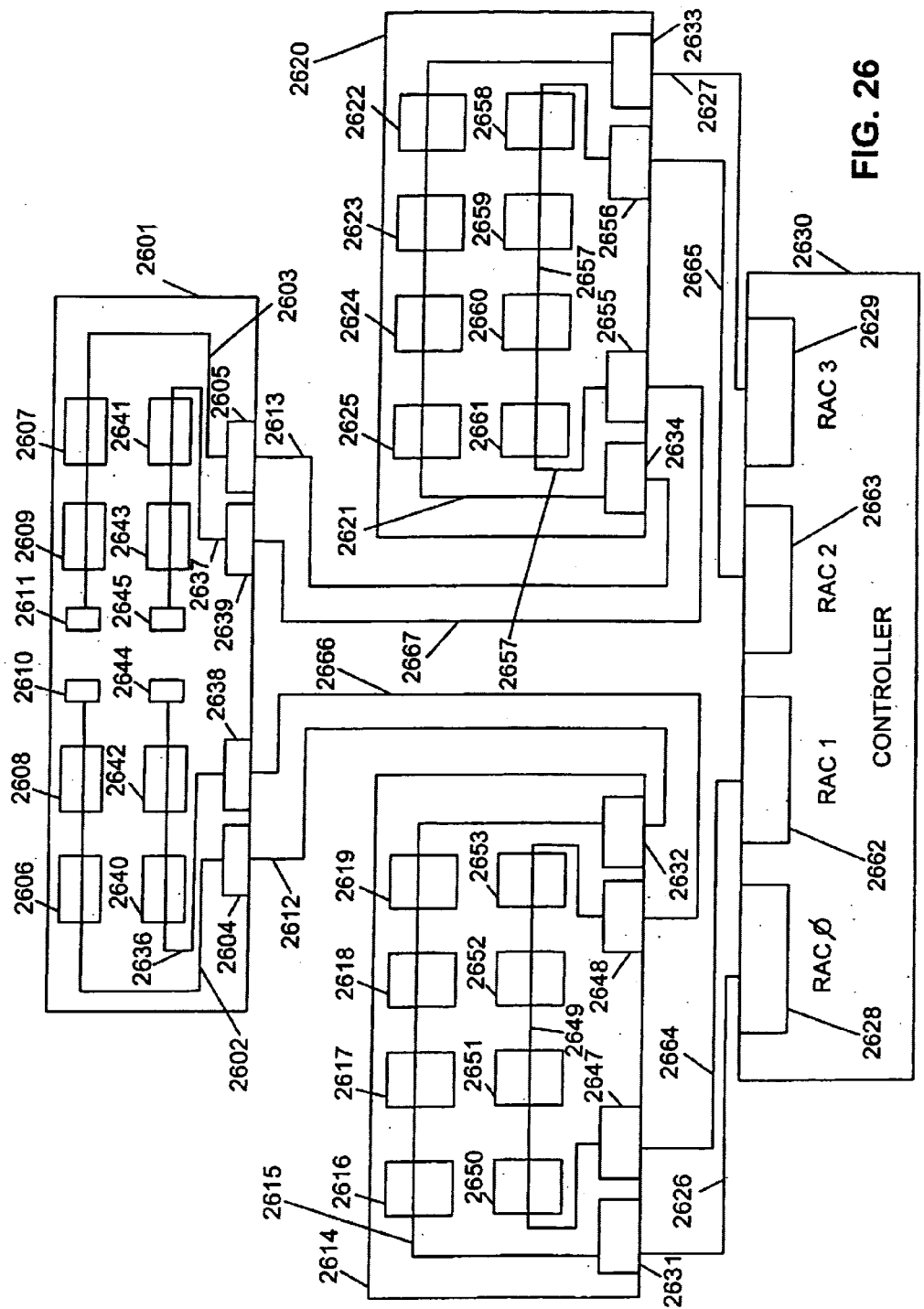
FIG. 26 is a plan view diagram illustrating an example of a bus system formed by the interconnection of multiple modules, including modules having multiple channels.

FIG. 26 is a plan view diagram illustrating an example of a bus system formed by the interconnection of multiple modules, including modules having multiple channels. The bus system includes a controller 2630, a first module 2614, a second module 2620, and a third module 2601. Controller 2630, which may be referred to as a control circuit, provides control of operations within the first module 2614, the second module 2620, and/or the third module 2601. Controller 2630 includes a first channel 2628, a second channel 2662, a third channel 2663, and a fourth channel 2629. First channel 2628 of controller 2630 is coupled to first channel ingress connector 2631 of first module 2614 via interconnection 2626. Second channel 2662 of controller 2630 is coupled to second channel ingress connector 2647 of second module 2620 via interconnection 2664. Third channel 2663 of controller 2630 is coupled to third channel ingress connector 2656 of second module 2620 via interconnection 2665. Fourth channel 2629 of controller 2630 is coupled to fourth channel ingress connector 2633 of second module 2620 via interconnection 2627.

First channel ingress connector 2631 of first module 2614 is coupled to first channel 2615 of first module 2615. First channel 2615 couples memory devices 2616, 2617, 2618, and 2619 and continues to first channel egress connector 2632 of first module 2614. First channel egress connector 2632 of first module 2614 is coupled to first channel ingress connector 2604 of third module 2601 via interconnection 2612.

Second channel ingress connector 2647 of first module 2614 is coupled to second channel 2649 of first module 2614. Second channel 2649 of first module 2614 couples memory devices 2650, 2651, 2652, and 2653 and continues to second channel egress connector 2648 of first module 2614. Second channel egress connector 2648 of first module 2614 is coupled to second channel ingress connector 2638 of third module 2601 via interconnection 2666.

Third channel ingress connector 2656 of second module 2620 is coupled to third channel 2657 of second module 2620. Third channel 2657 couples memory devices 2658, 2659, 2660, and 2661 and continues to third channel egress connector 2655 of second module 2620. Third channel egress connector 2655 of second module 2620 is coupled to third channel ingress connector 2639 of third module 2601 via interconnection 2667.

Fourth channel ingress connector 2633 of second module 2620 is coupled to fourth channel 2621 of second module 2620. Fourth channel 2621 couples memory devices 2622, 2623, 2624, and 2625 and continues to fourth channel egress connector 2634 of second module 2620. Fourth channel egress connector 2634 of second module 2620 is coupled to fourth channel ingress connector 2605 of third module 2601 via interconnection 2613.

Within third module 2601, first channel ingress connector 2604 is coupled to first channel 2602. First channel 2602 couples memory devices 2606 and 2608 and continues to terminator 2610. Second channel ingress connector 2638 of third module 2601 is coupled to second channel 2636. Second channel 2636 couples memory devices 2640 and 2642 and continues to terminator 2644. Third channel ingress connector 2639 is coupled to third channel 2637. Third channel 2637 couples memory devices 2641 and 2643 and continues to terminator 2645. Fourth channel ingress connector 2605 is coupled to fourth channel 2603. Fourth channel 2603 couples memory devices 2607 and 2609 and continues to terminator 2611.

As described above in reference to FIG. 22, the bus system of FIG. 26 is also expandable and may also be reduced to a bus system comprising only third module 2601, without first module 2614 and second module 2620. Likewise, additional modules and/or "filler" modules may be used with the bus system of FIG. 26.

Figure 27:
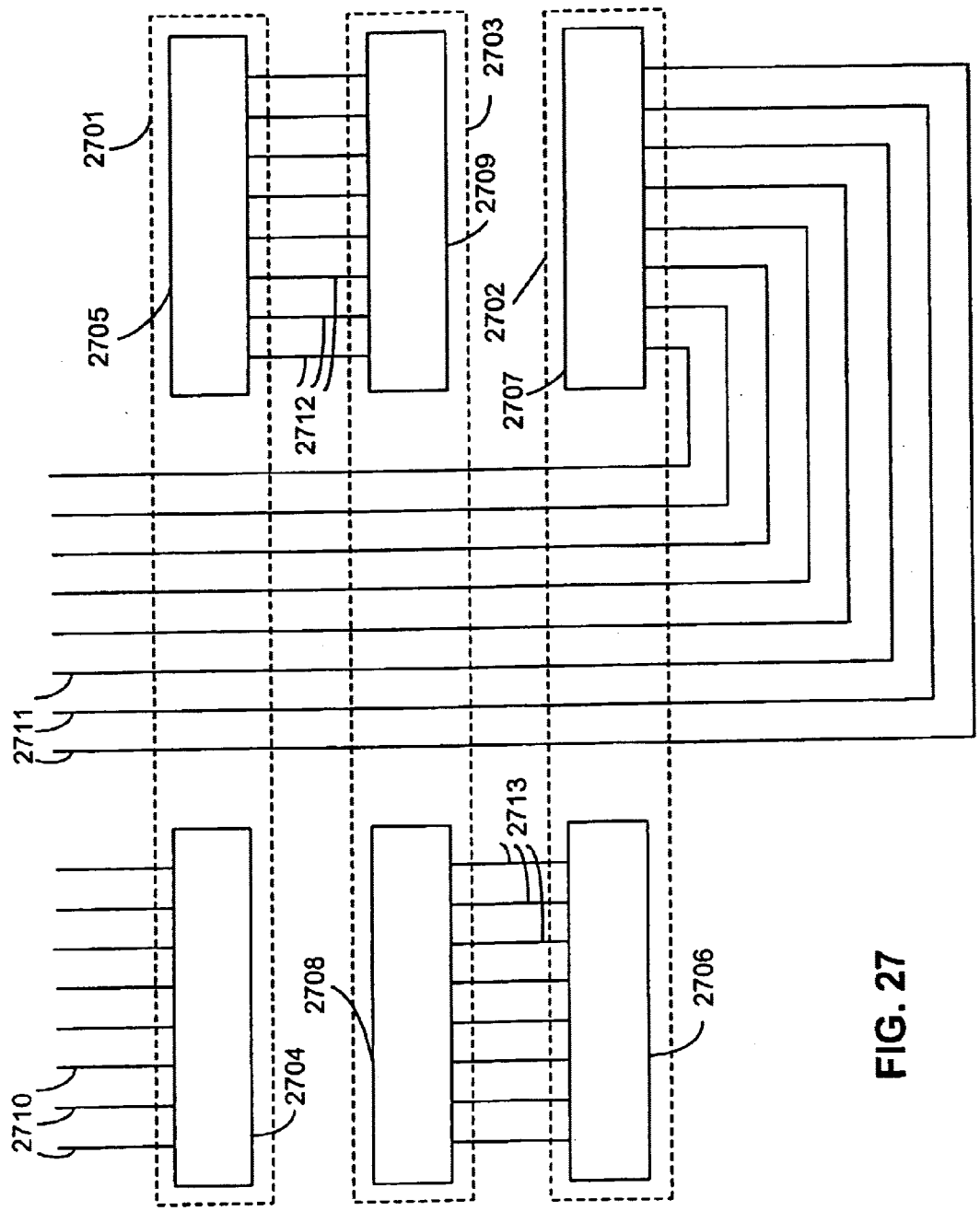
FIG. 27 is a plan view diagram of an example of a circuit board of a bus system according to an embodiment of the invention.

FIG. 27 is a plan view diagram of an example of a circuit board of a bus system according to an embodiment of the invention. The circuit board comprises a first module slot 2701, a second module slot 2702, and a third module slot 2703. First channel signals are provided to a first channel ingress connector 2704 of the first module slot 2701 via first channel bus 2710. Second channel signals are provided to a second channel ingress connector 2707 of the second module slot 2702 via second channel bus 2711. A first channel egress connector 2705 of the first module slot 2701 is coupled to a first channel ingress connector 2709 of the third module slot 2703 via first channel bus segment 2712. A second channel egress connector 2706 of the second module slot 2702 is coupled to a second channel ingress connector 2708 of the third module slot 2703 via second channel bus segment 2713. Since each of the module slots are configured such that a space without connectors exists between the ingress connector and the egress connector, one or more conductors of one or more of the channel buses may be routed along the circuit board between a module's ingress connector and that module's egress connector. Thus, more that one channel may approach the module slots from the same direction. Alternatively, one or more conductors of one or more channel buses may be routed around the end of an ingress or egress connector of a module opposite that module's respective egress or ingress connector.

While separate ingress and egress connectors are identified in reference to FIG. 27, it should be understood that the ingress and egress connectors may be implemented as separate connectors or may be combined into a single connector structure accommodating a plurality of conductors. For example, if a connector having a connector pin array is used, one set of one or more connector pins may be used to implement an ingress connector and a second set of one or more connector pins may be used to implement an egress connector. Optionally, a portion of the connector shell that would otherwise accommodate additional connector pins may be left vacant to provide a region near the vacancies where conductors may be routed, for example on a printed circuit board.

A plurality of the conductors of a channel bus may be configured to be of equal length. Thus, signals introduced at one end of those conductors of the channel bus will arrive at the opposite end of those conductors at the same time. Even if topological constraints cause some conductors to be longer than others, additional length may be introduced into the shorter conductors, for example by using a zig-zag or switchback routing pattern, to compensate and cause all conductors to have the same length.

The circuit board of FIG. 27 may be practiced as a motherboard, with first channel ingress connector 2704, first channel egress connector 2705, second channel egress connector 2706, second channel ingress connector 2707, second channel ingress connector 2708, and first channel ingress connector 2709 practiced as motherboard connectors. Also, a controller or control circuit such as controller 2630 of FIG. 26 may be coupled to first channel bus 2710 and/or second channel bus 2711.

Figure 28:
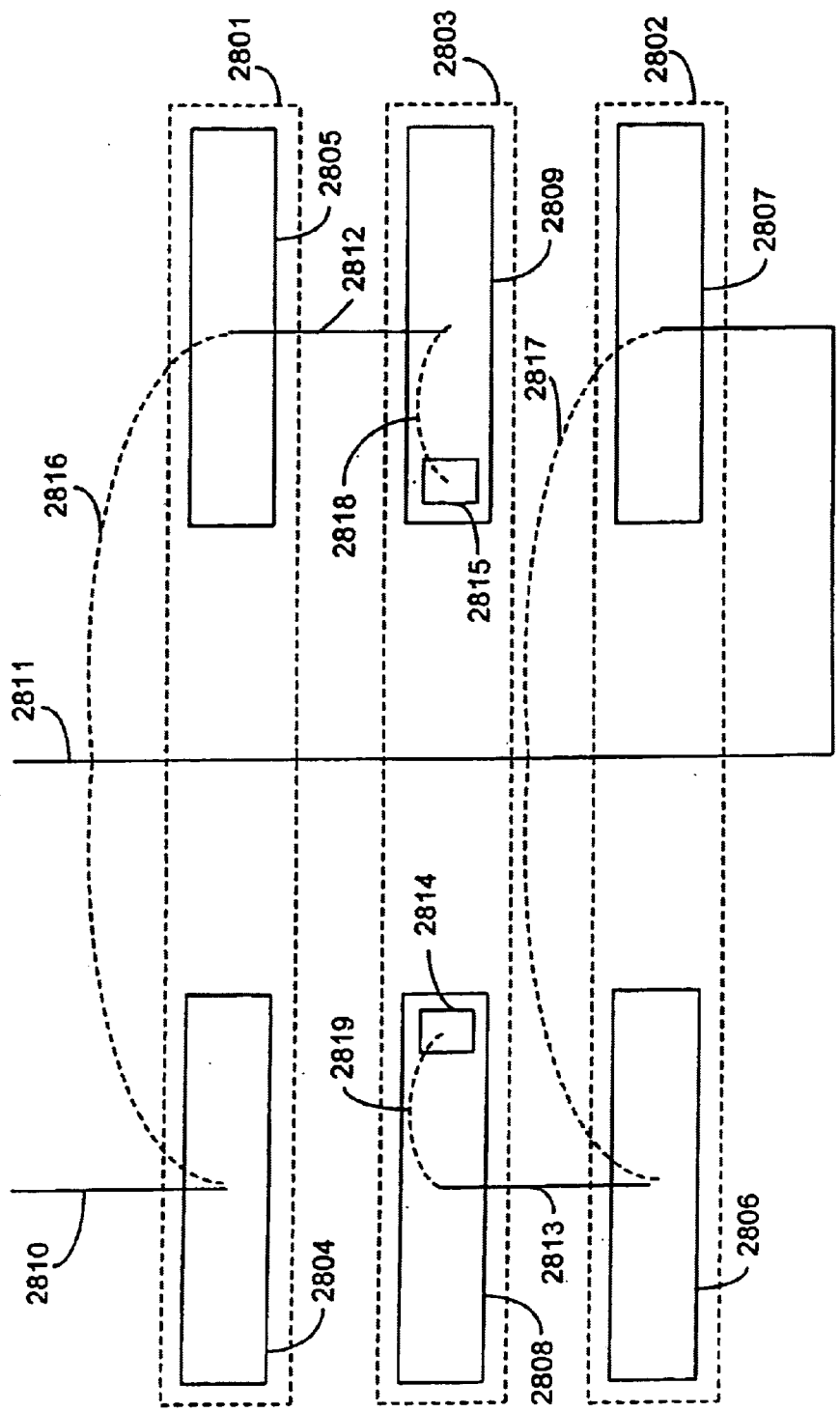
FIG. 28 plan view diagram of an example of a circuit board of a bus system according to an embodiment of the invention.

FIG. 28 plan view diagram of an example of a circuit board of a bus system according to an embodiment of the invention. This example of a circuit board shares the configuration illustrated in FIG. 28 and includes illustration of channel coupling internal to modules and termination of channels within a module. The circuit board comprises a first module slot 2801, a second module slot 2802, and a third module slot 2803. First channel signals are provided to a first channel ingress connector 2804 of the first module slot 2801 via a first conductor 2810 of a first channel bus. Second channel signals are provided to a second channel ingress connector 2807 of the second module slot 2802 via a first conductor 2811 of a second channel bus. The first conductor 2810 of the first channel bus is coupled to a first conductor 2812 of a first channel bus segment at first channel egress connector 2805 via a first conductor 2816 of a channel of a first module coupled to the first channel ingress connector 2804 and to the first channel egress connector 2805. The first channel egress connector 2805 of the first module slot 2801 is coupled to a first channel ingress connector 2809 of the third module slot 2803 via a first conductor 2812 of the first channel bus segment.

The first conductor 2811 of the second channel bus is coupled to a first conductor 2813 of a second channel bus segment at second channel egress connector 2806 via a first conductor 2817 of a channel of a second module coupled to the second channel ingress connector 2802 and the second channel egress connector 2806. The second channel egress connector 2806 of the second module slot 2802 is coupled to a second channel ingress connector 2808 of the third module slot 2803 via the first conductor 2813 of the second channel bus segment.

Within a third module coupled to first channel ingress connector 2809 of the third module slot 2803 and to the second channel ingress connector 2808 of the third module slot 2803, a first conductor 2818 of a first channel couples the first conductor 2812 of the first channel bus segment to a first terminator 2815. A first conductor 2819 of a second channel couples the first conductor 2813 of the second channel bus segment to a second terminator 2814. The first conductor 2818 of the first channel and the first conductor 2819 of the second channel may also be coupled to the same or different memory devices within the third module. While the bus system has been described with respect to a single conductor, it can be readily appreciated that the single conductor may be instantiated as many times as desired to provide as many conductors as desired.

Figure 29:
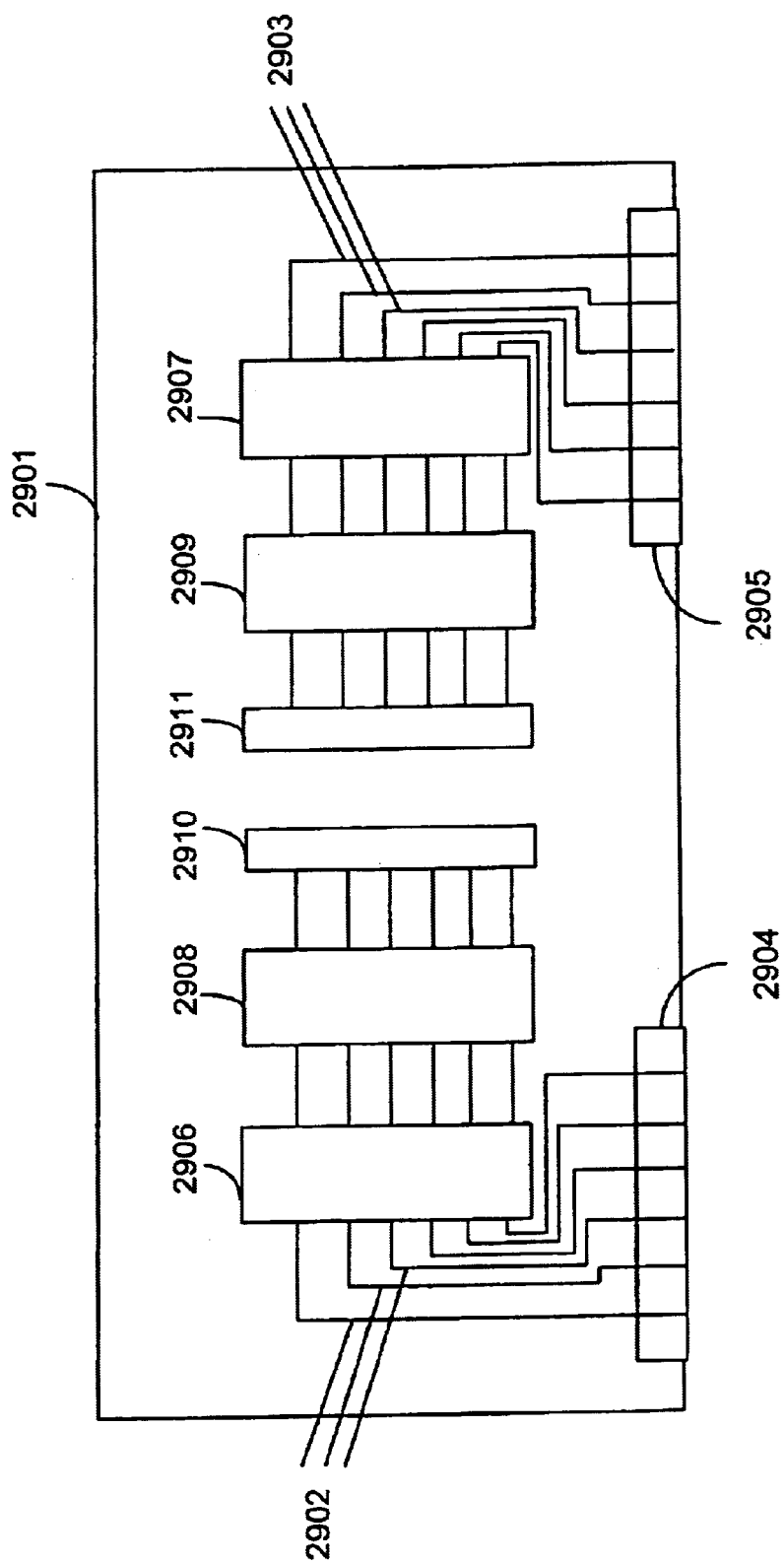
FIG. 29 is a plan view diagram of an embodiment of a two channel module in accordance with the present invention.

FIG. 29 is a plan view diagram of an embodiment of a two channel module in accordance with the present invention. The module 2901 includes a first channel ingress connector 2904, a second channel ingress connector 2905, memory devices 2906, 2907, 2908, and 2909, and terminators 2910 and 2911. A first channel 2902 couples the first channel ingress connector 2904 to memory 2906 and 2908 and to terminator 2910. A second channel 2903 couples the second channel ingress connector 2905 to memory devices 2907 and 2909 and to terminator 2911. The first channel 2902 and the second channel 2903 each comprise a plurality of conductors. The length of each of the conductors which a channel comprises are preferably of equal length. The length between the ingress connector and the terminator is preferably equal among conductors of a channel. The length between the ingress connector and a memory device coupled to the channel is preferably equal among conductors of the channel. Techniques such as those described above may be used to adjust the lengths of the conductors to assure equal length.

Figure 30:
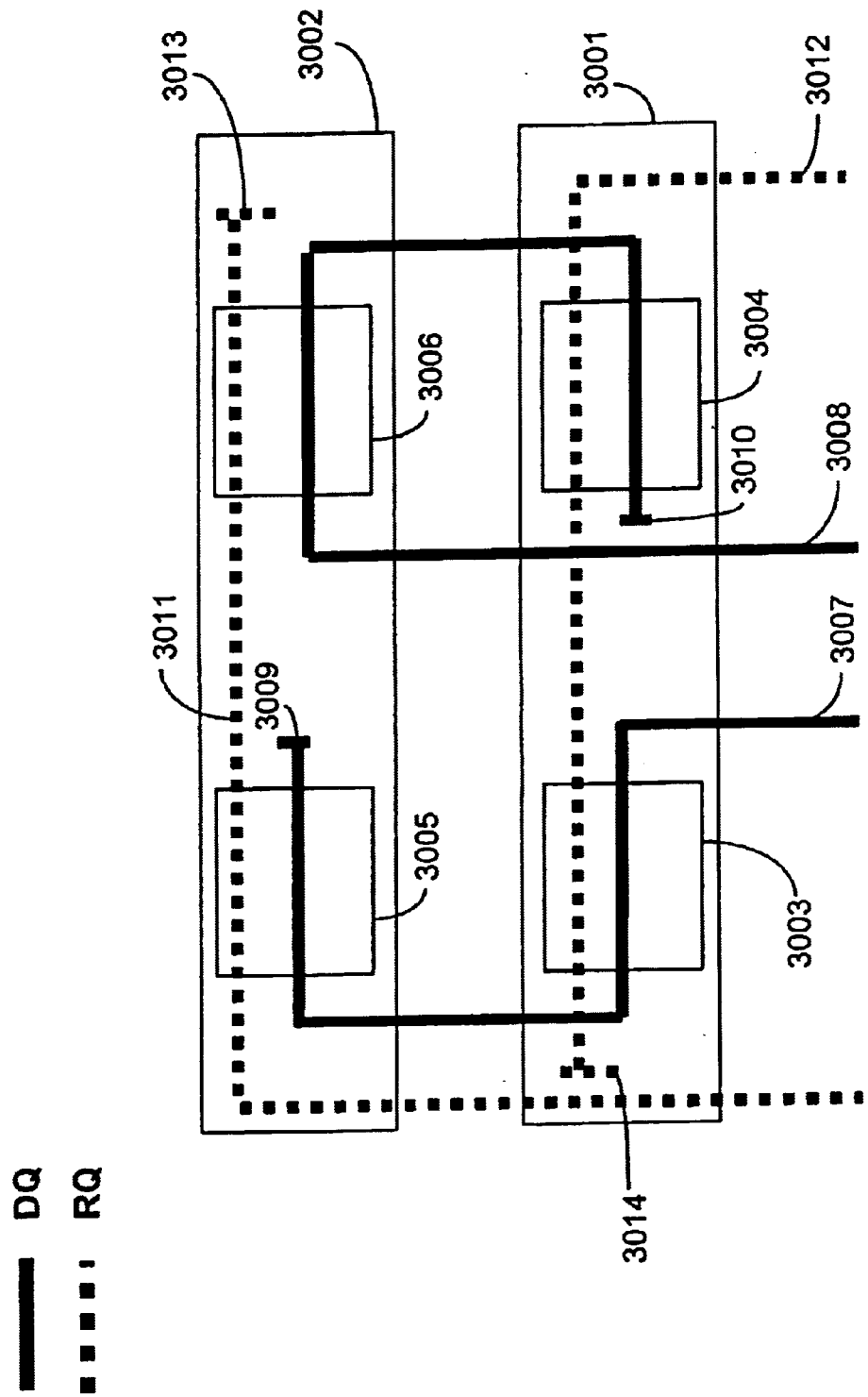
FIG. 30 is a block diagram illustrating an example of a two-channel bus system in accordance with an embodiment of the invention.

FIG. 30 is a block diagram illustrating an example of a two-channel bus system in accordance with an embodiment of the invention. The bus system comprises a first module 3001 and a second module 3002. The first module comprises memory devices 3003 and 3004 and terminators 3010 and 3014. The second module comprises memory devices 3005 and 3006 and terminators 3009 and 3013. A first data channel 3007 is coupled to a first ingress connector on the first module 3001, to a first memory device 3003 on the first module 3001, and to a first egress connector on the first module 3001. From there, the first data channel 3007 is coupled to a first ingress connector on the second module 3002, to a first memory device 3005 on the second module 3002, and to a terminator 3009 on the second module 3002. A second data channel 3008 is coupled to a second ingress connector on the second module 3002, to a second memory device 3006 on the second module 3002, and to a second egress connector on the second module 3002. From there, the second data channel 3008 is coupled to a second ingress connector on the first module 3001, to a second memory device 3004 on the first module 3001, and to a terminator 3010 on the first module 3001.

A first request channel 3012 is coupled to an ingress connector on first module 3001, to memory devices 3004 and 3003 on the first module 3001, and to terminator 3014 on the first module 3001. A second request channel 3011 is coupled to an ingress connector on second module 3002, to memory devices 3005 and 3006 on the second module 3002, and to terminator 3013.

Since the first module 3001 and the second module 3002 have an identical internal configuration (although they are depicted as reversed relative to one another in FIG. 30), a multiple module bus system may be constructed with a minimum number of distinct components. One or more additional modules comprising ingress connectors, memory devices, and egress connectors for either or both channels may be interposed between first module 3001 and second module 3002 to allow expansion of the bus system.

As can be seen from FIG. 30, in this example, a module provides ingress and egress for one channel and ingress and termination for another channel. The module passes one channel through to another module while terminating the other channel. By using two such modules, as shown, one channel can pass through a first module and terminate on a second module while another channel can pass through the second module and terminate on the first module.

The bus system of FIG. 30 is expandable. Additional modules and/or "filler" modules may be added, for example, between first module 3001 and second module 3002. Such additional modules and/or "filler" modules need not provide terminators for the data channels, but may receive a data channel at an ingress connector, couple the data channel to one or more memory devices, and provide the data channel to an egress connector. Alternatively, such modules may provide termination. Additional request channels may be provided to the additional modules, or the existing request channels may be shared with the additional modules, for example, through the use of one or more splitters. As another alternative, either of first module 3001 and second module 3002 may be omitted and replace with a similar module lacking memory devices. Such a module provides continuity and termination, but saves the cost of the memory devices for systems in which such memory devices are not needed.

Figure 31:
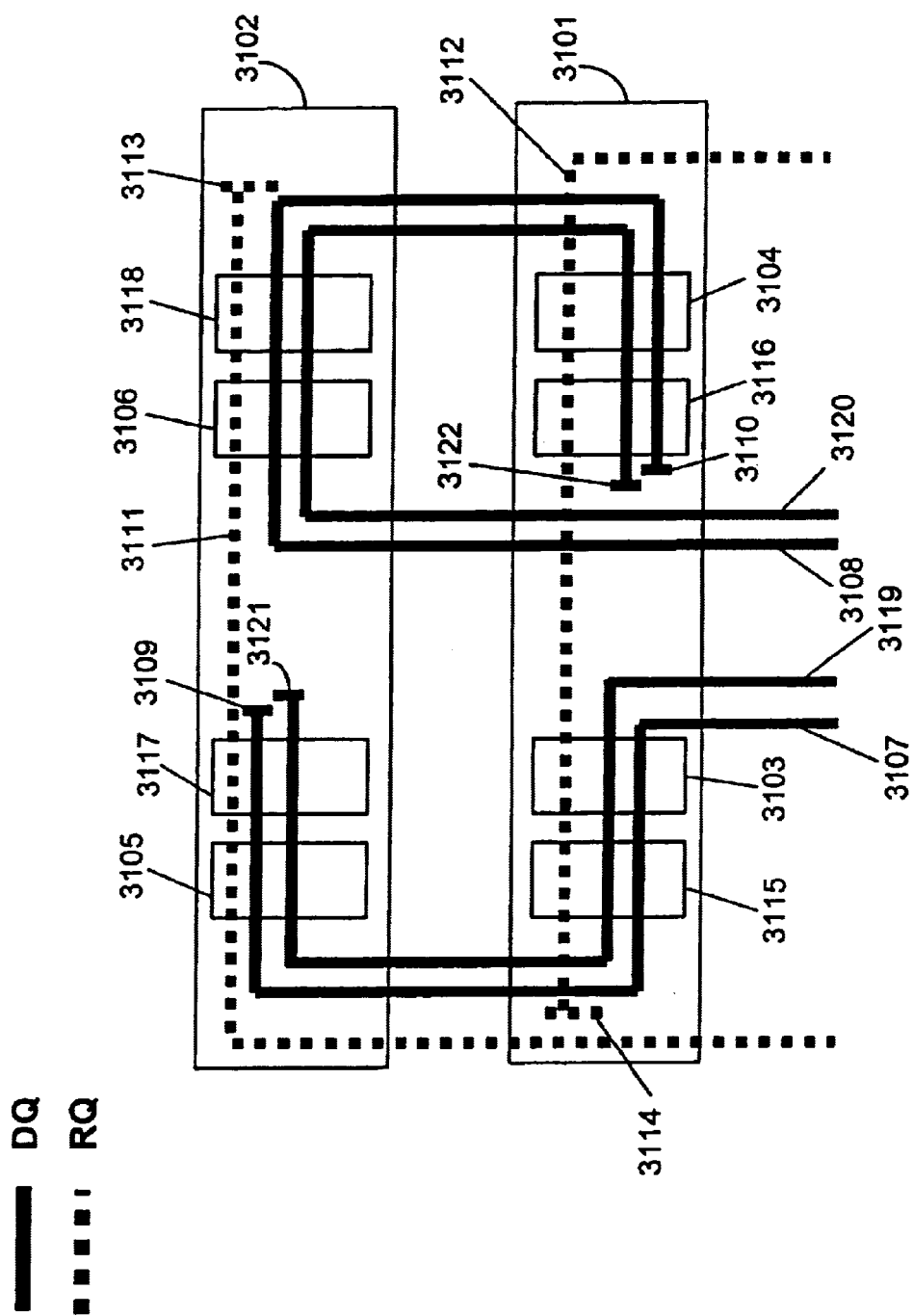
FIG. 31 is a block diagram illustrating an example of a four-channel bus system in accordance with an embodiment of the invention.

FIG. 31 is a block diagram illustrating an example of a four-channel bus system in accordance with an embodiment of the invention. The bus system comprises a first module 3101 and a second module 3102. The first module comprises memory devices 3103, 3115, 3104, and 3116 and terminators 3110, 3122, and 3114. The second module comprises memory devices 3105, 3117, 3106, and 3118 and terminators 3109, 3121, and 3113. A first data channel 3107 is coupled to an ingress connector on the first module 3101, to a memory device 3103 on the first module 3101, to a memory device 3115 on the first module 3101, and to an egress connector on the first module 3101. From there, the first data channel 3107 is coupled to an ingress connector on the second module 3102, to a memory device 3105 on the second module 3102, to a memory device 3117 on the second module 3102, and to a terminator 3109 on the second module 3102.

A second data channel 3119 is coupled to an ingress connector on the first module, to a memory device 3103 on the first module 3101, to a memory device 3115 on the first module 3101, and to an egress connector on the first module 3101. From there, the second data channel is coupled to an ingress connector on the second module 3102, to a memory device 3105 on the second module 3102, to a memory device 3117 on the second module 3102, and to terminator 3121 on the second module 3102.

A third data channel 3108 is coupled to an ingress connector on the second module 3102, to a memory device 3106 on the second module 3102, to a memory device 3118 on the second module 3102, and to an egress connector on the second module 3102. From there, the third data channel 3108 is coupled to an ingress connector on the first module 3101, to a memory device 3104 on the first module 3101, to a memory device 3116 on the first module 3101, and to a terminator 3110 on the first module 3101.

A fourth data channel 3120 is coupled to an ingress connector on the second module 3102, to a memory device 3106 on the second module 3102, to a memory device 3118 on the second module 3102, and to an egress connector on the second module 3102. From there, the fourth data channel 3120 is coupled to an ingress connector on the first module 3101, to a memory device 3104 on the first module 3101, to a memory device 3116 on the first module 3101, and to a terminator 3122 on the first module 3101.

A first request channel 3112 is coupled to an ingress connector on first module 3101, to memory devices 3104, 3116, 3103, and 3115 on the first module 3101, and to terminator 3114 on the first module 3101. A second request channel 3111 is coupled to an ingress connector on second module 3102, to memory devices 3105, 3117, 3106, and 3118 on the second module 3102, and to terminator 3113.

Since the first module 3101 and the second module 3102 have an identical internal configuration (although they are depicted as reversed relative to one another in FIG. 31), a multiple module bus system may be constructed with a minimum number of distinct components. One or more additional modules comprising ingress connectors, memory devices, and egress connectors for either or both channels may be interposed between first module 3101 and second module 3102 to allow expansion of the bus system.

The bus system of FIG. 31 is expandable. Additional modules and/or "filler" modules may be added, for example, between first module 3101 and second module 3102. Such additional modules and/or "filler" modules need not provide terminators for the data channels, but may receive a data channel at an ingress connector, couple the data channel to one or more memory devices, and provide the data channel to an egress connector. Alternatively, such modules may provide termination. Additional request channels may be provided to the additional modules, or the existing request channels may be shared with the additional modules, for example, through the use of one or more splitters.

It should be noted that other variations of FIG. 31 are possible. For example, the numbers of ingress connectors, memory devices, channels, egress connectors, and terminations may be varied.

Figure 32:
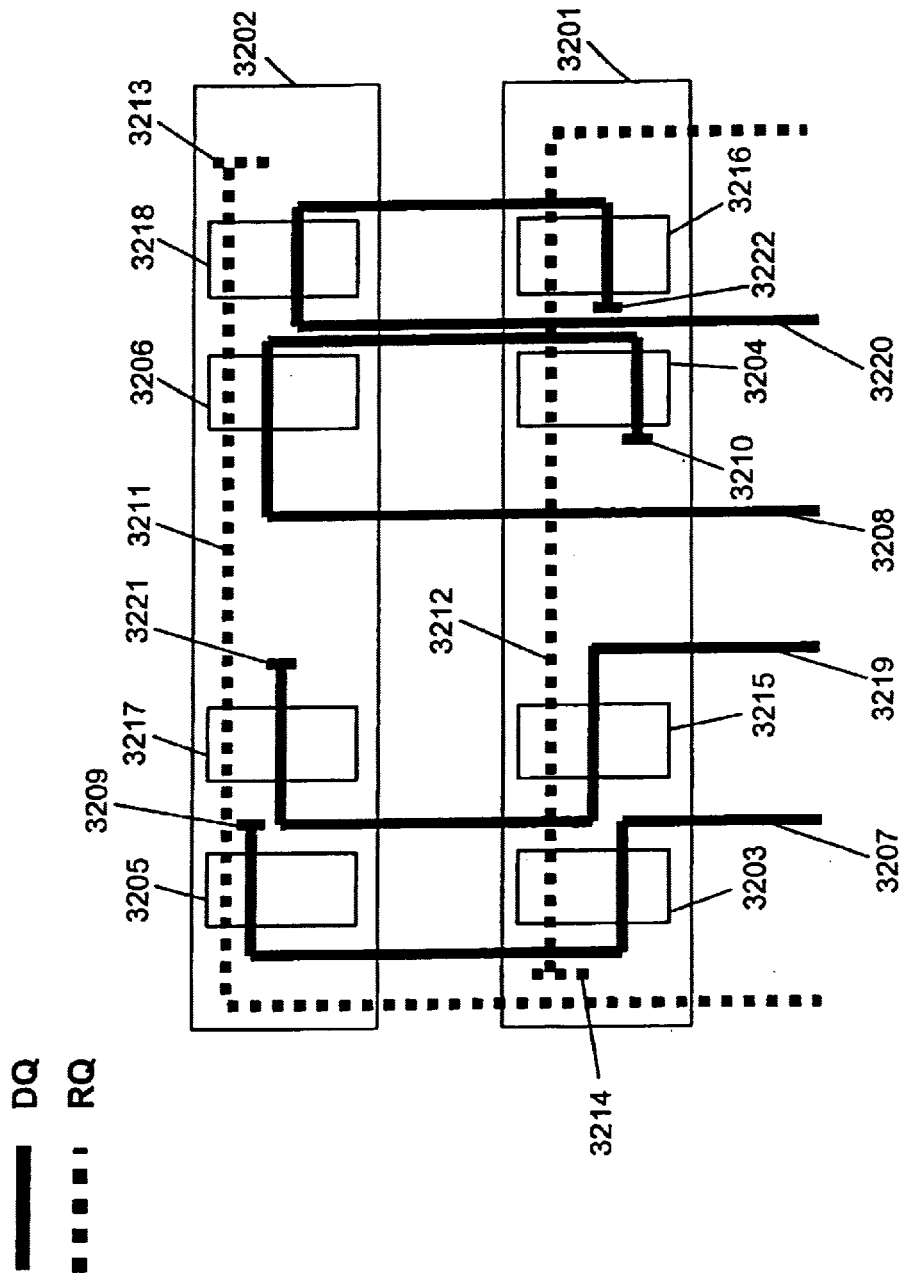
FIG. 32 is a block diagram illustrating an example of a four-channel bus system in accordance with an embodiment of the invention.

FIG. 32 is a block diagram illustrating an example of a four-channel bus system in accordance with an embodiment of the invention. The bus system comprises a first module 3201 and a second module 3202. The first module comprises memory devices 3203, 3215, 3204, and 3216 and terminators 3210, 3222, and 3214. The second module comprises memory devices 3205, 3217, 3206, and 3218 and terminators 3209, 3221, and 3213. A first data channel 3207 is coupled to an ingress connector on the first module 3201, to a memory device 3203 on the first module 3201, and to an egress connector on the first module 3201. From there, the first data channel 3207 is coupled to an ingress connector on the second module 3202, to a memory device 3205 on the second module 3202, and to a terminator 3209 on the second module 3202.

A second data channel 3219 is coupled to an ingress connector on the first module, to a memory device 3215 on the first module 3201, and to an egress connector on the first module 3201. From there, the second data channel is coupled to an ingress connector on the second module 3202, to a memory device 3217 on the second module 3202, and to terminator 3221 on the second module 3202.

A third data channel 3208 is coupled to an ingress connector on the second module 3202, to a memory device 3206 on the second module 3202, and to an egress connector on the second module 3202. From there, the third data channel 3208 is coupled to an ingress connector on the first module 3201, to a memory device 3204 on the first module 3201, and to a terminator 3210 on the first module 3201.

A fourth data channel 3220 is coupled to an ingress connector on the second module if 3202, to a memory device 3218 on the second module 3202, and to an egress connector on the second module 3202. From there, the fourth data channel 3220 is coupled to an ingress connector on the first module 3201, to a memory device 3216 on the first module 3201, and to a terminator 3222 on the first module 3201.

A first request channel 3212 is coupled to an ingress connector on first module 3201, to memory devices 3204, 3216, 3203, and 3215 on the first module 3201, and to terminator 3214 on the first module 3201. A second request channel 3211 is coupled to an ingress connector on second module 3202, to memory devices 3205, 3217, 3206, and 3218 on the second module 3202, and to terminator 3213.

Since the first module 3201 and the second module 3202 have an identical internal configuration (although they are depicted as reversed relative to one another in FIG. 32), a multiple module bus system may be constructed with a minimum number of distinct components. One or more additional modules comprising ingress connectors, memory devices, and egress connectors for either or both channels may be interposed between first module 3201 and second module 3202 to allow expansion of the bus system.

The bus system of FIG. 32 is expandable. Additional modules and/or "filler" modules may be added, for example, between first module 3201 and second module 3202. Such additional modules and/or "filler" modules need not provide terminators for the data channels, but may receive a data channel at an ingress connector, couple the data channel to one or more memory devices, and provide the data channel to an egress connector. Alternatively, such modules may provide termination. Additional request channels may be provided to the additional modules, or the existing request channels may be shared with the additional modules, for example, through the use of one or more splitters.

Figure 33:
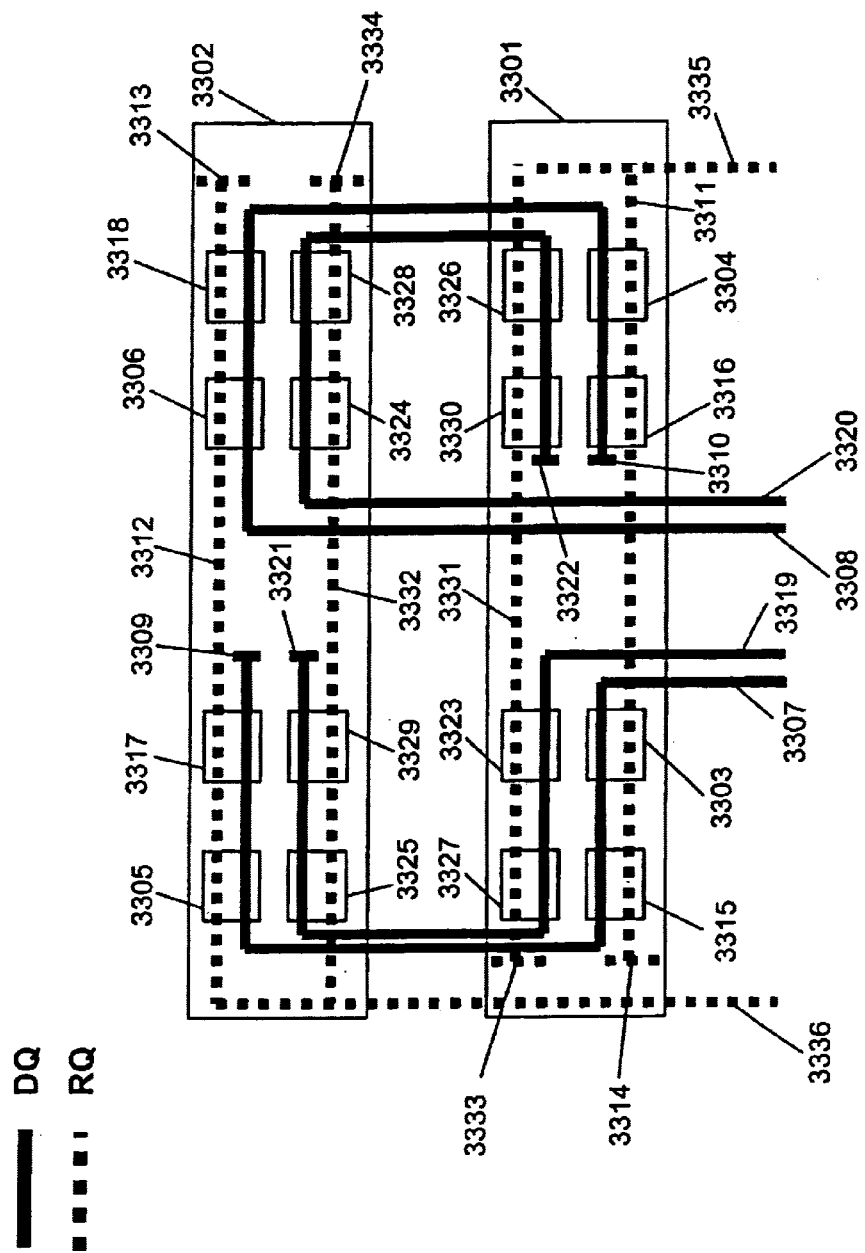
FIG. 33 is a block diagram illustrating an example of a four-channel bus system in accordance with an embodiment of the invention.

FIG. 33 is a block diagram illustrating an example of a four-channel bus system in accordance with an embodiment of the invention. The bus system comprises a first module 3301 and a second module 3302. The first module comprises memory devices 3303, 3315, 3323, 3327, 3304, 3316, 3326, and 3330 and terminators 3310, 3322, 3314, and 3333. The second module comprises memory devices 3305, 3317, 3325, 3329, 3306, 3318, 3324, and 3328 and terminators 3309, 3321, 3313, and 3334. A first data channel 3307 is coupled to an ingress connector on the first module 3301, to a memory device 3303 on the first module 3301, to a memory device 3315 on the first module 3301, and to an egress connector on the first module 3301. From there, the first data channel 3307 is coupled to an ingress connector on the second module 3302, to a memory device 3305 on the second module 3302, to a memory device 3317 on the second module 3302, and to a terminator 3309 on the second module 3302.

A second data channel 3319 is coupled to an ingress connector on the first module, to a memory device 3323 on the first module 3301, to a memory device 3327 on the first module 3301, and to an egress connector on the first module 3301. From there, the second data channel is coupled to an ingress connector on the second module 3302, to a memory device 3325 on the second module 3302, to a memory device 3329 on the second module 3302, and to terminator 3321 on the second module 3302.

A third data channel 3308 is coupled to an ingress connector on the second module 3302, to a memory device 3306 on the second module 3302, to a memory device 3318 on the second module 3302, and to an egress connector on the second module 3302. From there, the third data channel 3308 is coupled to an ingress connector on the first module 3301, to a memory device 3304 on the first module 3301, to a memory device 3316 on the first module 3301, and to a terminator 3310 on the first module 3301.

A fourth data channel 3320 is coupled to an ingress connector on the second module 3302, to a memory device 3324 on the second module 3302, to a memory device 3328 on the second module 3302, and to an egress connector on the second module 3302. From there, the fourth data channel 3320 is coupled to an ingress connector on the first module 3301, to a memory device 3326 on the first module 3301, to a memory device 3330 on the first module 3301, and to a terminator 3322 on the first module 3301.

A first request channel 3335 is coupled to an ingress connector on first module 3301. The first request channel is split into a first branch 3311 and a second branch 3331 using a splitter. The splitter preferably couples the first request channel 3335 to the first branch 3311 and to the second branch 3331 while maintaining continuity of impedance. The first branch 3311 is coupled to memory devices 3304, 3316, 3303, and 3315 on the first module 3301, and to terminator 3314 on the first module 3301. The second branch 3331 is coupled to the memory devices 3326, 3330, 3323, and 3327 on the first module 330, and to terminator 3333 on the first module 3301. A second request channel 3336 is split into a first branch 3312 and a second branch 3332 using a splitter. The splitter preferably couples the second request channel 3336 to the first branch 3312 and to the second branch 3332 while maintaining continuity of impedance. The first branch 3312 is coupled to memory devices 3305, 3317, 3306, and 3318 on the second module 3302, and to terminator 3313. The second branch 3332 is coupled to memory devices 3325, 3329, 3324, and 3328, and to terminator 3334.

The first request channel 3335 and the second request channel 3336 may be implemented in a variety of configurations. For example, instead of splitting a request channel into two branches, a request channel may be coupled to all of the memory devices on a module and terminated with a single terminator. Thus, the splitter and one terminator may be obviated. Also, a plurality of request channels may be coupled to each module, with termination provided for each request channel.

Since the first module 3301 and the second module 3302 have an identical internal configuration (although they are depicted as reversed relative to one another in FIG. 33), a multiple module bus system may be constructed with a minimum number of distinct components. One or more additional modules comprising ingress connectors, memory devices, and egress connectors for either or both channels may be interposed between first module 3301 and second module 3302 to allow expansion of the bus system.

The bus system of FIG. 33 is expandable. Additional modules and/or "filler" modules may be added, for example, between first module 3301 and second module 3302. Such additional modules and/or "filler" modules need not provide terminators for the data channels, but may receive a data channel at an ingress connector, couple the data channel to one or more memory devices, and provide the data channel to an egress connector. Additional request channels may be provided to the additional modules, or the existing request channels may be shared with the additional modules, for example, through the use of one or more splitters.

Figure 34:
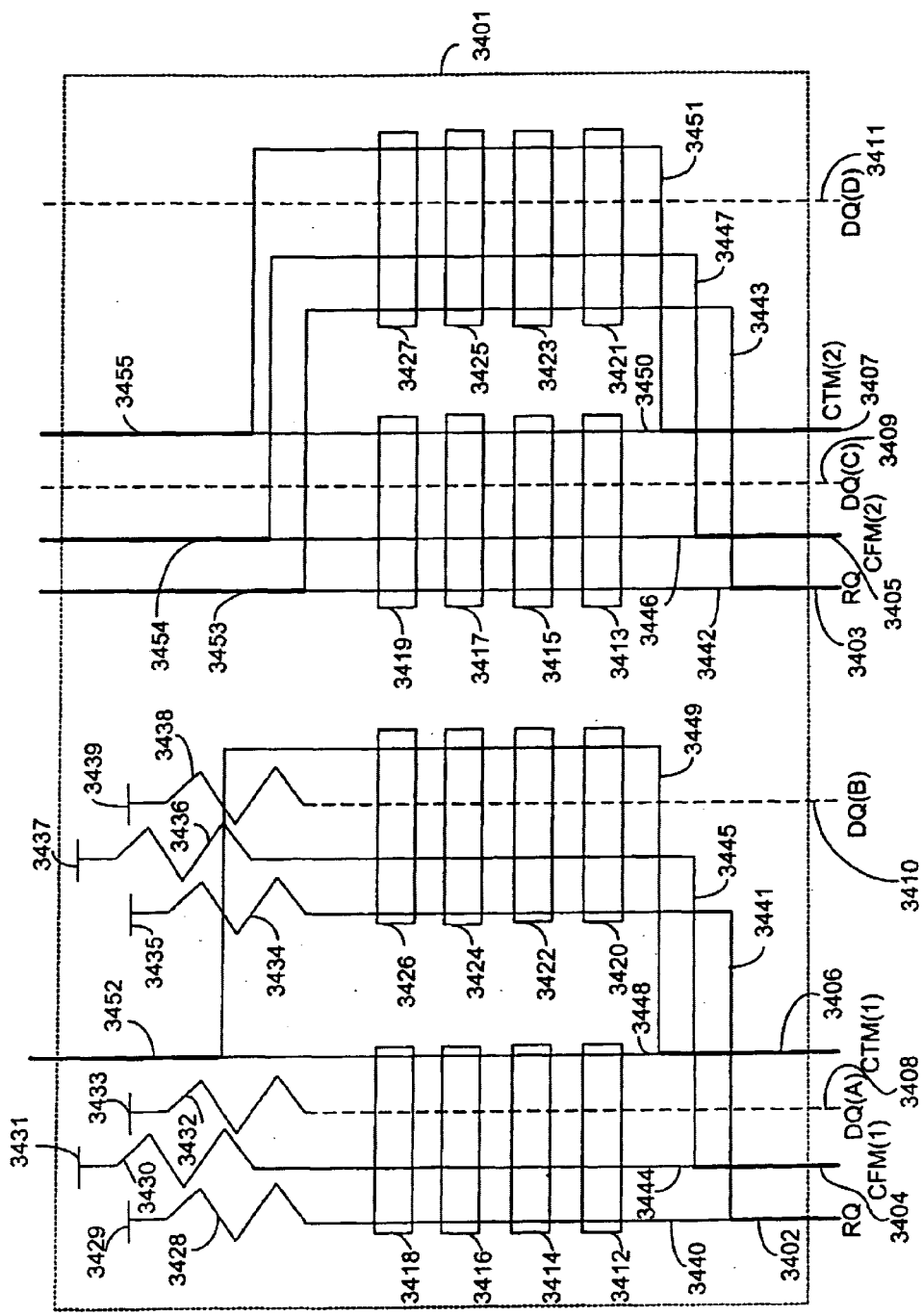
FIG. 34 is a block diagram of an embodiment of a two-channel module in accordance with the present invention.

FIG. 34 is a block diagram of an embodiment of a two-channel module in accordance with the present invention. This embodiment provides buses that split into multiple paths while maintaining controlled impedance. For example, while other impedances may be used, a 28 ohm bus may be split into two 56 ohm paths, which may optionally be merged into another 28 ohm bus. The two-channel module 3401 includes an RQ request bus 3402 that splits into paths 3440 and 3441. Path 3440 is coupled to memory devices 3412, 3414, 3416, and 3418, and terminates in resistor 3428 coupled to ground 3429. Path 3441 is coupled to memory devices 3420, 3422, 3424, and 3426, and terminates in resistor 3434 coupled to ground 3435. CFM(1) clock bus 3404 splits into paths 3444 and 3445. Path 3444 is coupled to memory devices 3412, 3414, 3416, and 3418 and terminates in resistor 3430 coupled to ground 3431. Path 3445 is coupled to memory devices 3420, 3422, 3424, and 3426 and terminates in resistor 3436 coupled to ground >3437. CTM(1) clock bus 3406 splits into paths 3448 and 3449. Path 3448 is coupled to memory devices 3412, 3414, 3416, and 3418. Path 3449 is coupled to memory devices 3420, 3422, 3424, and 3426. Paths 3448 and 3449 are combined into bus 3452, which may exit module 3401 and be coupled to other components, for example, other modules. Data signals are applied to DQ(A) data bus 3408, which enters module 3401 and is coupled to memory devices 3412, 3414, 3416, and 3418 and terminates in resistor 3432 coupled to ground 3433. Data signals are applied to DQ(B) data bus 3410, which is applied to module 3401 and coupled to memory devices 3420, 3422, 3424, and 3426 and terminated by resistor 3438 coupled to ground 3439.

RQ request bus 3403 splits into paths 3442 and 3443. Path 3442 is coupled to memory devices 3413, 3415, 3417, and 3419. Path 3443 is coupled to memory devices 3421, 3423, 3425, and 3427. Paths 3442 and 3443 are merged to provide bus 3453, which may exit module 3401 and, for example, be coupled to other components such as other modules. CFM (2) clock bus 3405 enters module 3401 and splits into paths 3446 and 3447. Path 3446 is coupled to memory devices 3413, 3415, 3417, and 3419. Path 3447 is coupled to memory devices 3421, 3423, 3425, and 3427. Paths 3446 and 3447 are merged to form bus 3454, which may exit module 3401 and be coupled to other components, for example, other modules. CTM(2) clock bus 3407 enters module 3401 and splits into paths 3450 and 3451. Path 3450 is coupled to memory devices 3413, 3415, 3417, and 3419. Path 3451 is coupled to memory devices 3421, 3423, 3425, and 3427. Paths 3450 and 3451 are merged to form bus 3455, which may exit module 3401 and be coupled to other components, for example, other modules. Data signals are applied to DQ(C) data bus 3409, which enters module 3401 and is coupled to memory devices 3413, 3415, 3417, and 3419. DQ(C) data bus 3409 may also exit module 3401 and be coupled to other components, for example, other modules. Data signals are applied to DQ(D) data bus 3411, which enters module 3401 and is coupled to memory devices 3421, 3423, 3425, and 3427. DQ(D) data bus 3411 may exit module 3401 and be coupled to other components, for example, other modules.

While various bus terminations are described as resistors coupled to ground, it is understood that other bus terminations may be used. For example, resistors may be coupled to any termination voltage, such as any DC voltage or any voltage that exhibits the properties of such a DC voltage when used for termination of a bus. As additional examples, other types of passive terminations, active terminations, and/or stub terminations may be used. Terminations may be implemented within an integrated circuit, separately from an integrated circuit, and, in some cases, terminations may be omitted. For example, terminations may be omitted when a bus is configured so as to prevent any reflections from exceeding a specified amplitude or when any reflections that occur will not impair one or more bus performance parameters, such as a data rate or an error rate, to a meaningful degree.

Thus, in accordance with an embodiment of the invention, a module may be formed from a printed circuit board (PCB). The module comprises a first set of integrated circuits (ICs), a second set of ICs, a first input connector, and a first ingress bus. The first set of ICs is mounted on the PCB. The second set of ICs is mounted on the PCB. The first input connector is disposed on the PCB. The first ingress bus is coupled to the first input connector. The first ingress bus is split into a first path and a second path. The first path is coupled to the first set of ICs, and the second path is coupled to the second set of ICs. The first ingress bus has a first characteristic impedance, and the first path and the second path have a combined effective impedance substantially equal to the first characteristic impedance. By being substantially equal, the impedances prevent interference from impedance discontinuities, for example, interference caused by reflections. Such interference is effectively prevented if performance parameters, for example, a data rate or an error rate, are not adversely affected by the interference to a meaningful degree. In preferred embodiments, the impedances are substantially equal if the difference between the first characteristic impedance and the combined effective impedance does not exceed 15%. In more preferred embodiments, the difference does not exceed 10%.

Optionally, the first path is coupled to a first terminator, and the second path is coupled to a second terminator. As another option, the module further comprises a first output connector disposed on the PCB and a first egress bus coupled to the first output connector. The first path and the second path are merged into the first egress bus. The first egress bus has a second characteristic impedance substantially equal to the first characteristic impedance. By being substantially equal, the impedances prevent interference from impedance discontinuities, for example, interference caused by reflections.

Figure 35:
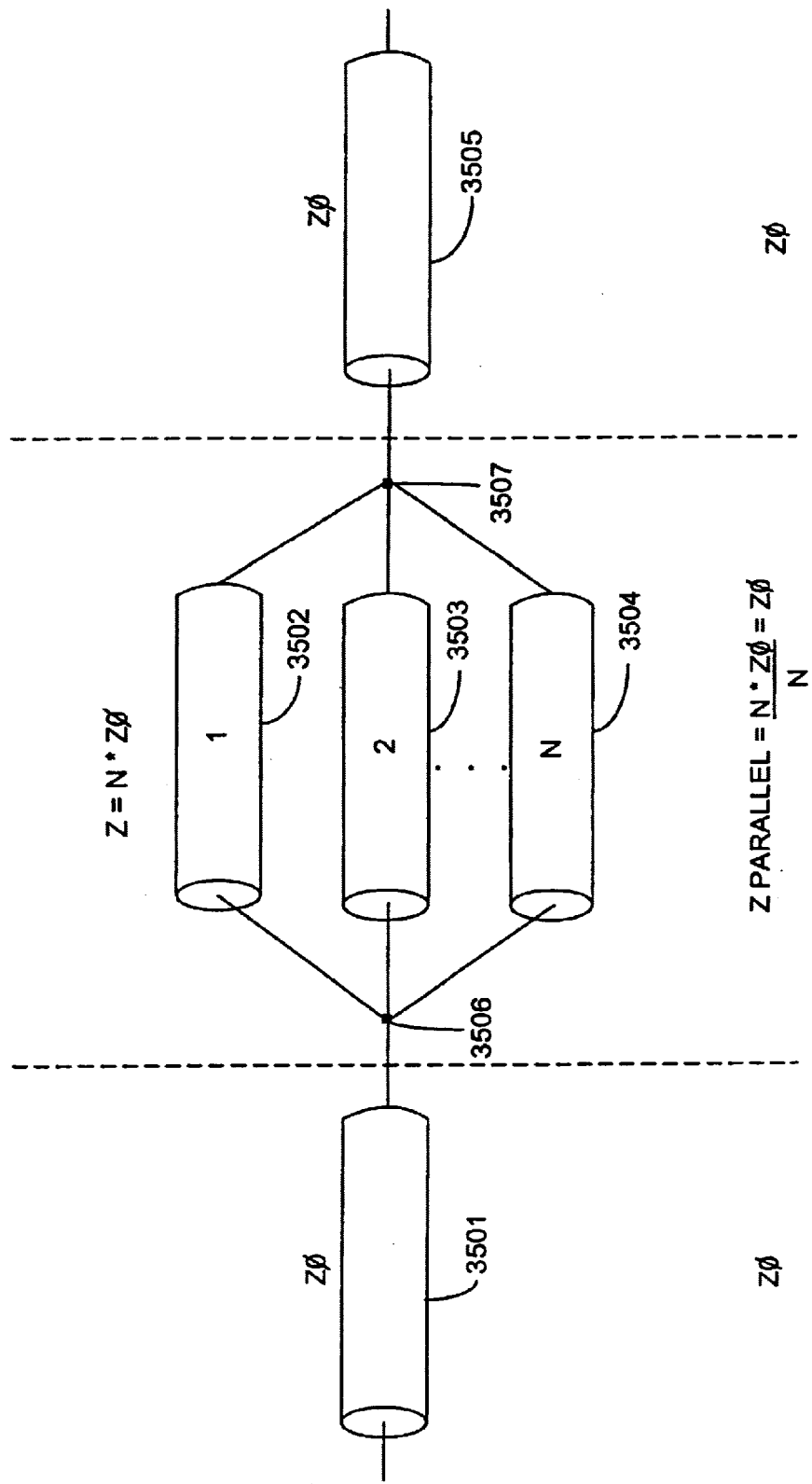
FIG. 35 is a schematic diagram illustrating a technique for splitting a bus into multiple paths while maintaining controlled impedance in accordance with an embodiment of the present invention.

FIG. 35 is a schematic diagram illustrating a technique for splitting a bus into multiple paths while maintaining controlled impedance in accordance with an embodiment of the present invention. An ingress bus is represented by transmission line 3501. The ingress bus splits into a plurality of paths represented by transmission lines 3502, 3503, and 3504. The plurality of paths are merged to form an egress bus represented by transmission line 3505. Signals are applied to a first end of transmission line 3501. A second end of transmission line 3501 is coupled to a first end of each of transmission lines 3502, 3503, and 3504 at node 3506. A second end of each of transmission lines 3502, 3503, and 3504 is coupled to a first end of transmission line 3505 at node 3507. A second end of transmission line 3505 provides an output for signals.

Transmission lines 3501 and 3505 have a characteristic impedance of Z0. Each of transmission lines 3502, 3503, and 3504 have a characteristic impedance N×Z0, where N equals the number of transmission lines 3502, 3503, and 3504 representing the plurality of paths. The parallel combination of the plurality of paths has an effective impedance of the characteristic impedance of the transmission lines representing each of the paths divided by the number of paths. Expressed mathematically, the effective impedance for the parallel combination of paths is N×Z0 divided by N, which equals Z0, the impedance of transmission lines 3501 and 3505. By configuring the paths such that each path has a characteristic impedance equal to the number of paths times the characteristic impedance of the bus to which the paths are coupled, continuity of impedance is provided and interference of impedance mismatches, such as reflection, is avoided.

For example, a signal applied to transmission line 3501 propagates to node 3506. The signal arriving at node 3506 causes parallel signals to propagate along transmission lines 3502, 3503, and 3504. The waves representing the signal propagating along transmission lines 3502, 3503, and 3504 retain substantially the same timing relationship among transmission lines 3502, 3503, and 3504, arriving at node 3507 substantially simultaneously. By arriving at node 3507 substantially simultaneously, these waves are recombined at node 3507, driving the signal onto transmission line 3505 without detrimental levels of reflection or attenuation. Thus, the fidelity of the signal is preserved throughout the splitting, propagation, merging, and subsequent propagation.

In accordance with FIG. 35, a module is provided wherein a bus includes a first channel. The first channel has a first characteristic impedance and is coupled to a plurality of paths. The plurality of paths are coupled to a plurality of ICs. The plurality of paths have a combined effective impedance substantially equal to the first characteristic impedance.

Figure 36:
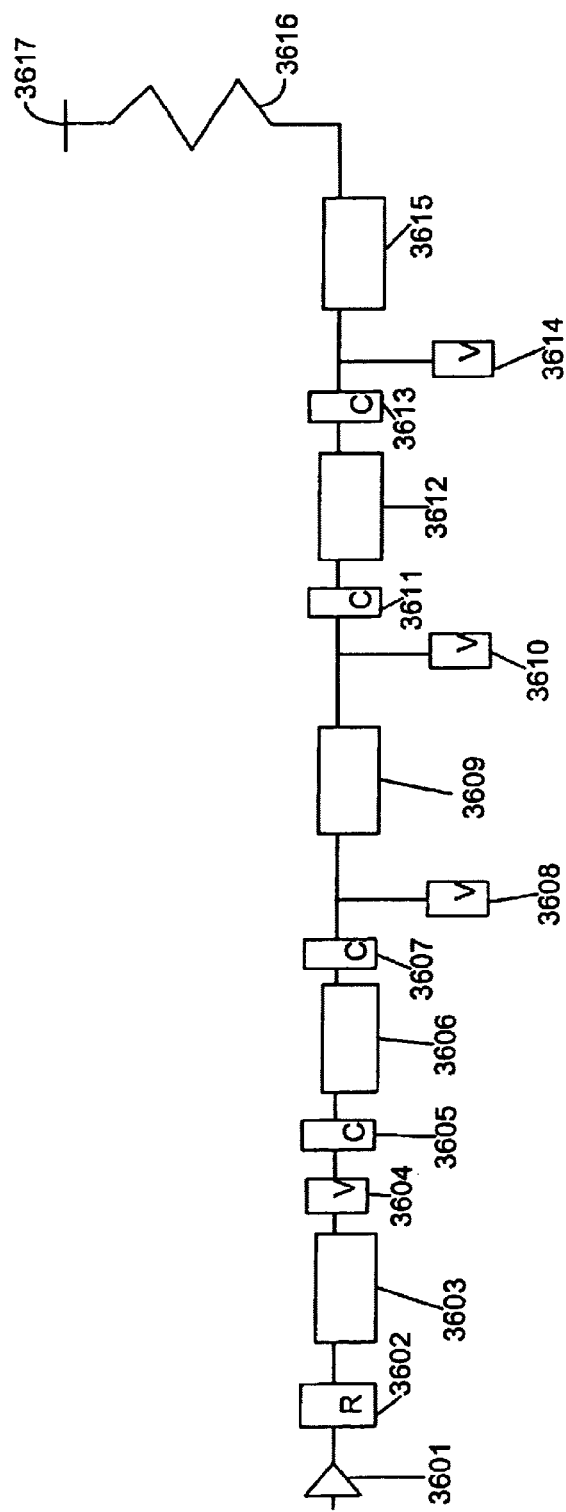
FIG. 36 is a schematic diagram illustrating impedances for a bus which does not split into multiple paths in accordance with an embodiment of the present invention.

FIG. 36 is a schematic diagram illustrating impedances for a bus which does not split into multiple paths in accordance with an embodiment of the present invention. Driver 3601 is coupled to RACPKG device 3602. This RACPKG device may, for example, be a component of a memory controller or an interface for coupling a memory controller to a memory device. RACPKG device 3602 is coupled through a 28 ohm motherboard conductor 3603 to via 3604. Via 3604 is coupled to connector 3605. Connector 3605 is coupled to 28 ohm module conductor 3606. 28 ohm module conductor 3606 is coupled to connector 3607. Connector 3607 is coupled to via 3608 and 28 ohm motherboard conductor 3609. 28 ohm motherboard conductor 3609 is coupled to via 3610 and connector 3611. Connector 3611 is coupled to 28 ohm module conductor 3612. 28 ohm module conductor 3612 is coupled to connector 3613. Connector 3613 is coupled to via 3614 and 28 ohm motherboard conductor 3615. 28 ohm motherboard conductor 3615 is coupled to 28 ohm termination resistor 3616, which is coupled to ground 3617.

Figure 37:
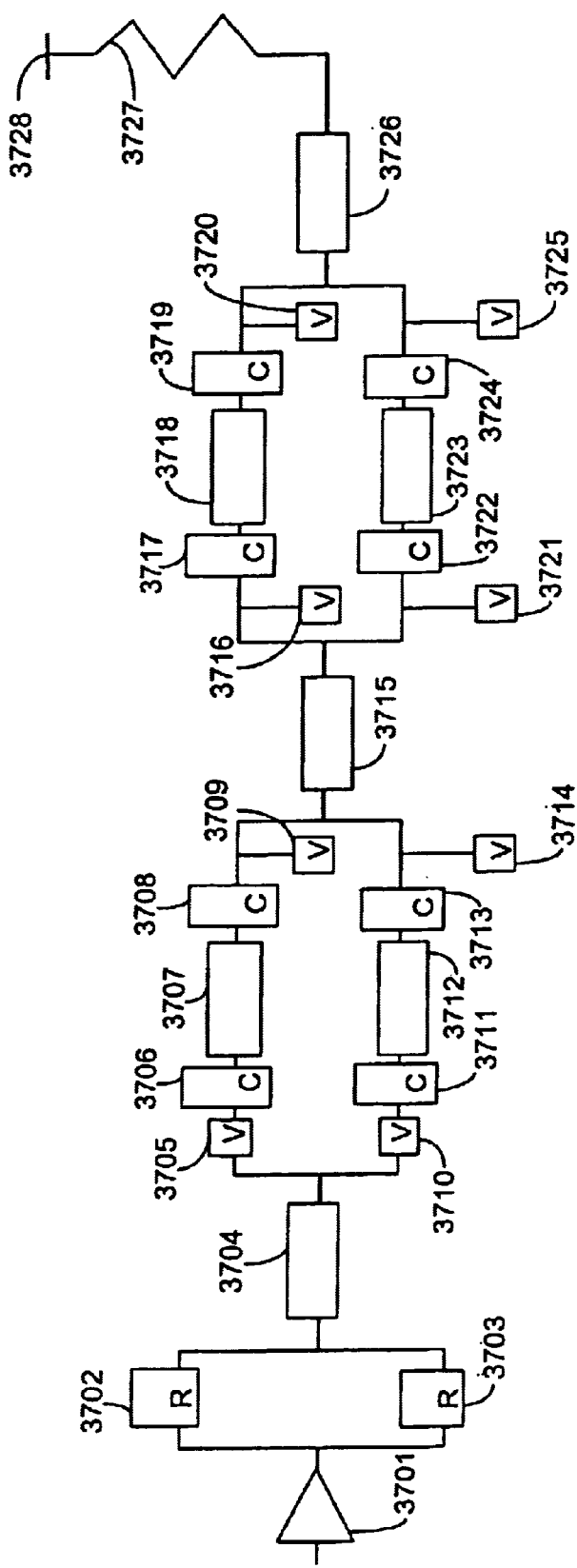
FIG. 37 is a schematic diagram illustrating impedances for a bus which splits into multiple paths in accordance with an embodiment of the present invention.

FIG. 37 is a schematic diagram illustrating impedances for a bus which splits into multiple paths in accordance with an embodiment of the present invention. Driver 3701 provides an output that is split into separate paths, with one path going to RACPKG device 3702 and the other path going to RACPKG device 3703. These RACPKG devices may, for example, be components of a memory controller or interfaces for coupling a memory controller to a memory device. The outputs of RACPKG device 3702 and RACPKG device 3703 are merged and coupled to 14 ohm motherboard conductor 3704. 14 ohm motherboard conductor 3704 splits into multiple paths, with one path coupled to via 3705, and the other path coupled to via 3710.

Via 3705 is coupled to connector 3706. Connector 3706 is coupled to 28 ohm module conductor 3707. 28 ohm module conductor 3707 is coupled to connector 3708. Via 3710 is coupled to connector 3711. Connector 3711 is coupled to 28 ohm module conductor 3712. 28 ohm module conductor 3712 is coupled to connector 3713.

Connector 3708 is coupled to via 3709 and merges to 14 ohm motherboard conductor 3715. Connector 3713 is coupled to via 3714 and merges to 14 ohm motherboard conductor 3715. 14 ohm motherboard conductor 3715 splits into multiple paths, with a first path coupled to via 3716 and connector 3717 and a second path coupled to via 3721 and connector 3722.

Connector 3717 is coupled to 28 ohm module conductor 3718. 28 ohm module conductor 3718 is coupled to connector 3719. Connector 3722 is coupled to 28 ohm module conductor 3723. 28 ohm module conductor 3723 is coupled to connector 3724. Connector 3719 is coupled to via 3720 and merges to 14 ohm motherboard conductor 3726. Connector 3724 is coupled to via 3725 and merges to motherboard conductor 3726. Motherboard conductor 3726 is coupled to 14 ohm termination resistor 3727, which is coupled to ground 3728.

While FIG. 37 illustrates splitting and merging occurring outside of a module, for example on a motherboard, such a configuration does not necessarily serve to minimize the number of conductors needed to be coupled by connectors. Thus, it may be preferable to perform splitting and merging on a module, thereby reducing the number of conductors coupled by connectors. Likewise, use of 14 and 28 ohm conductors does not necessarily maximize conductor density and conductor routing efficiency. Thus, it may be preferable to use other impedances, for example, 28 and 56 ohms.

The values for impedances stated in reference to FIGS. 36 and 37 are exemplary. Embodiments of the invention may be practiced with various impedance values. Likewise, the number of paths that split from or merge to buses may be varied. Moreover, FIGS. 36 and 37 provide examples of points in the system where splitting and merging may occur. An embodiment of the invention may be practiced with splitting and merging occurring at different points. For example, as illustrated in FIG. 34, splitting and merging may occur within a module. In such an embodiment, multiple paths are merged to single conductor, with the single conductor coupled to connectors and a RACPKG device. However, as noted above, splitting and merging may alternatively occur at other points within the system.

Regarding FIGS. 34 to 37, to maintain signal integrity and impedance matching, signals should be applied to the non-split portion of the bus. For example, signals should be driven onto a bus either before a single conductor is split into multiple paths or after the multiple paths have merged into a single conductor. Also, the multiple paths should be matched so as to ensure equal propagation delay along each of the multiple paths split from a single conductor between the point where the multiple paths split and the point where the multiple paths are combined. Matching the multiple paths is most readily done by matching the lengths of the multiple paths, although any technique that maintains equal propagation delay may be used. Also, matching of propagation delay from the point where the multiple paths split to the points where the multiple paths reach devices coupled to the multiple paths may be performed. Moreover, the propagation delays of different buses, for example, address, control, clock, and/or data buses, may be matched to simplify timing considerations of one or more devices coupled to the different buses or multiple paths of one or more of the different buses. With appropriate delay matching and/or impedance matching, noise and/or interference, for example reflection noise, can be minimized.

The modules and bus systems described with reference to FIGS. 21 to 26 and 29 to 37 may be implemented using modules wherein the elements described for each module are disposed on at least one of a first primary surface and a second primary surface of the module. The elements described for each module may be disposed on the first primary surface and replicated to allow replicated elements to be disposed on the second primary surface. Thus, it is possible for the modules and bus systems to provide twice the capacity of the single primary surfaces illustrated in FIGS. 21 to 26 and 29 to 37.

Other embodiments are also provided in accordance with the invention. For example, a module is provided wherein a first channel enters and exits the module, providing continuity from a point of ingress at a first connector contact pin to a point of egress at a second connector contact pin and carrying a first signal, and a second channel enters the module at a third connector contact pin, the second channel carrying a second signal. The second channel is optionally connected to a terminator on the module. Entry and exit of the channels can occur at respective connector contact pins. In preferred embodiments, the first and second signals are "functionally equivalent", wherein the term functionally equivalent in this context refers to the signals performing functions which are equivalent. The function of the first signal and the second signal would be equivalent if, for example, both signals function to carry data information. In preferred embodiments, the function of the first signal is selected from one of the following functions: 1) carry data information, 2) carry control information, 3) carry address information, 4) carry data and control information, 5) carry data and address information, 6) carry control and address information, or 7) carry data, control and address information, and the function of the second signal is the same as the first signal. Stated another way, the signals would be considered to be functionally equivalent if they are both of the same type selected from one of the following types: data signals, control signals, address signals, data plus control signals, data plus address signals, control plus address signals, and data plus control plus address signals. It should be noted that a request bus or request channel may carry control signals, address signals, or control plus address signals.

As another example of an embodiment in accordance with the invention, a module is provided having two similar devices, wherein the term similar in this context refers to the devices being of the same type. For example, two devices would be considered to be similar devices if they are both memory devices. A first channel is connected to the first device, and a second channel is connected to the second device. The first channel and the second channel carry functionally equivalent signals, but have different topologies. Different topologies may result from different routing patterns of the channels within the module. The first channel is connected to a first contact, while the second channel is connected to a second contact and a third contact, wherein a controlled non-zero propagation delay exists between the second contact and the third contact. The first channel is terminated on the module. The second channel may, but need not, be terminated on the module. Variations of this embodiment encompass modules wherein the first, second and/or third contact is replaced by a plurality of contacts. Other variations of this embodiment encompass modules wherein the first channel is coupled to a different number of contacts than the second channel.

As yet another example of an embodiment in accordance with the invention, a system is provided having a first module and a second module. A first channel enters and exits the first module and enters and is terminated on the second module. A second channel enters and exits the second module and enters and is terminated on the first module.

As a further example of an embodiment in accordance with the invention, a module is provided wherein a first request channel carrying a signal associated with data enters the module at a third contact and terminates on the module, while a first channel carrying the data enters the module at a first contact and exits the module at a second contact.

As another example of an embodiment in accordance with the invention, a system is provided having a first module and a second module, wherein a first channel enters the first module on a first contact, exits the first module on a second contact, enters the second module on a third contact, and terminates on the second module. A second channel enters the second module on a fourth contact, exits the second module on a fifth contact, enters the first module on a sixth contact, and terminates on the first module. Optionally, the first channel and the second channel carry functionally equivalent signals.

In preferred embodiments, a module such as those described above is adapted to be connected to a motherboard. There may be more than one module connected to a motherboard. A memory controller may be coupled to one or more modules. Collectively, the modules, motherboard, and/or memory controller may form a system. Optionally, integrated circuits are mounted on modules, preferably memory integrated circuits.

While channel signals described above in reference to the various FIGS. are described as being provided to the modules and continuing until they reach a terminator, it should be understood that the channels carrying these channel signals are not necessarily unidirectional. Rather, channel signals may be communicated bidirectionally over the channels. For example, some channel signals may propagate from a memory controller to a memory device and, ultimately, to a terminator, other channel signals may propagate from a memory device to a memory controller (with the possibility of an incident terminating wave propagating from the memory device to the terminator). Thus, either or both of the data channels and request channels may be implemented as either unidirectional (in either direction) channels or bidirectional channels. Likewise, unidirectional and/or bidirectional communication may occur between various devices coupled to a channel, for example, between a memory controller, a first memory device, a second memory device, a third memory device, etc.

Terms such as enter, exit, ingress, egress, input, and output are used for clarity to denote aspects of a module or bus system that yield a relationship between modules, module slots, and/or other components, for example, a controller. For example, signals from a controller can be understood to enter a module via an ingress connector and exit that module via an egress connector. However, it should be understood that signals may pass in the opposite direction, entering via an egress connector and exiting via an ingress connector. Additionally, under some circumstances, for example, when signals originate on a module, the signals may propagate along a channel in both directions, exiting the module at both an ingress connector and an egress connector. Thus, terms such as enter, exit, ingress, egress, input, and output should be understood to promote clarity, not to impose directional limitations on elements to which such terms refer.

References to a first channel and a second channel do not imply that every module of a bus system necessarily needs to have two channels. Likewise, references to a first, second, third, and fourth channel do not imply that every module of a bus system necessarily needs to have four channels. Rather, modules having the same or different numbers of channels may be used together within the bus system.

The present invention may be used to implement a variety of embodiments, including modules comprising integrated circuits, modules comprising memory devices, modules comprising bus terminations, and modules comprising conductors coupling one connector to another connector. Such modules need not be mutually exclusive; a module may include various combinations of such components. Moreover, such combinations may vary between different channels. Examples of modules include, but are not limited to, a module comprising an integrated circuit, a module comprising a bus termination, and a continuity module providing continuity between connectors of the module.

As illustrated in these examples, the present invention provides modules adapted to be configured with one or more channels. While the foregoing examples have been drawn to multiple channel embodiments, in every case a single channel may be implemented. The modules may be interconnected using various connectors to form bus systems. Such bus systems may be implemented in a variety of configurations and channel definitions. Relative channel lengths may be reduced given a defined set of configuration requirements. Bus interconnections within the system may also be reduced, thereby reducing the potential for impedance mismatches and undesired channel loading.

As with many mechanical systems, the examples given above may be modified in many ways. The use of right angle connectors has been described, as well as the use of conventional connectors including ribbon and other flexible connectors. Other connector types may be used within the present invention. Channel path definition, integrated circuit layout, and internal bus routing on the various modules may also be readily adapted to suit the system designer's purpose.

Hence, the foregoing embodiments are merely examples. The present invention is not limited to these examples, but is defined by the attached claims.

What is claimed is:

1. A module having first and second primary surfaces and having a first end, the module comprising:
   a first set of input finger connectors disposed on at least one of the first and second primary surfaces proximate to the first end;
   a first set of output finger connectors disposed on at least one of the first and second primary surfaces proximate to the first end;
   a second set of input finger connectors disposed on at least one of the first and second primary surfaces proximate to the first end;
   a second set of output finger connectors disposed on at least one of the first and second primary surfaces proximate to the first end; and
   a bus including a first channel extending from the first set of input finger connectors to the first set of output finger connectors and a second channel extending from the second set of input finger connectors to the second set of output finger connectors.

2. The module of claim 1 further comprising
   at least one first integrated circuit (IC) populating at least one of the first and second primary surfaces, the first channel connected to the at least one first IC; and
   at least one second IC populating at least one of the first and second primary surfaces, the second channel connected to the at least one second IC.

3. The module of claim 2, wherein the first IC and the second IC are memory devices.

4. The module of claim 2, wherein the at least one first IC is a plurality of first ICs and the at least one second IC is a plurality of second ICs.

5. The module of claim 4 wherein the first channel and the second channel allow simultaneous independent access to at least some of the first and second ICs.

6. The module of claim 2 further comprising:
   a third set of input finger connectors disposed on at least one of the first and second primary surfaces;
   a third set of output finger connectors disposed on at least one of the first and second primary surfaces;
   a fourth set of input finger connectors disposed on at least one of the first and second primary surfaces; and
   a fourth set of output finger connectors disposed on at least one of the first and second primary surfaces, wherein the bus further includes:
      a third channel extending from the third set of input finger connectors to the third set of output finger connectors; and
      a fourth channel extending from the fourth set of input finger connectors to the fourth set of output finger connectors.

7. The module of claim 6, further comprising:
   at least one third IC populating at least one of the first and second primary surfaces, the third channel connected to the at least one third IC; and
   at least one fourth IC populating at least one of the first and second primary surfaces, the fourth channel connected to the at least one fourth IC.

8. The module of claim 7 wherein the first channel, the second channel, the third channel, and the fourth channel each allow simultaneous independent access to the respective ICs.

9. The module of claim 6 wherein the first set of input finger connectors, the first set of output finger connectors, the second set of input finger connectors, and the second set of output finger connectors are disposed on the first primary surface, and the third set of input finger connectors, the third set of output finger connectors, the fourth set of input finger connectors, and the fourth set of output finger connectors are disposed on the second primary surface.

10. The module of claim 2 wherein
   the at least one first IC is a plurality of first ICs;
   the first channel has a first characteristic impedance and is coupled to a plurality of paths, each of the paths is coupled to one of the first ICs, and
   the plurality of paths has a combined effective impedance substantially equal to the first characteristic impedance.

11. The module of claim 6, wherein the first set of input finger connectors, the first set of output finger connectors, the second set of input finger connectors, and the second set of output finger connectors are disposed on the first primary surface and the third set of input finger connectors, the third set of output finger connectors, the fourth set of input finger connectors, and the fourth set of output finger connectors are disposed on the second primary surface.

12. A module comprising:

a printed circuit board;

a first set of integrated circuits (ICs) mounted on the printed circuit board;

a second set of ICs mounted on the printed circuit board;

a first input connector disposed on the printed circuit board proximate to a first end;

a first output connector disposed on the printed circuit board proximate to the first end;

a second input connector disposed on the printed circuit board proximate to the first end;

a second output connector disposed on the printed circuit board proximate to the first end; and a first ingress bus coupled to the first input connector, the first ingress bus split into a first path and a second path, the first path coupled to the first set of ICs and the second path coupled to the second set of ICs, the first ingress bus having a first characteristic impedance and the first path and the second path having a combined effective impedance substantially equal to the first characteristic impedance.

13. The module of claim 12 wherein the first path is coupled to a first terminator and the second path is coupled to a second terminator.

14. The module of claim 12 wherein the module further comprises:

a first output connector disposed on the printed circuit board; and a first egress bus coupled to the first output connector, the first path and the second path merged into the first egress bus, the first egress bus having a second characteristic impedance substantially equal to the first characteristic impedance.

* * * * *